(12) United States Patent
Baldwin et al.

US009069133B2

(10) Patent No.: US 9,069,133 B2
(45) Date of Patent: Jun. 30, 2015

(54) ANTI-REFLECTIVE COATING FOR PHOTOLITHOGRAPHY AND METHODS OF PREPARATION THEREOF

(75) Inventors: Teresa Baldwin, Maricopa, AZ (US); Joseph Kennedy, San Jose, CA (US); Nancy Iwamoto, Ramona, CA (US); Tadashi Nakano, Tokyo (JP); William Bedwell, Brecksville, OH (US); Jason Stuck, San Jose, CA (US); Arlene Suedemeyer, San Jose, CA (US); Mello Hebert, Hillsboro, OR (US)

(73) Assignee: Honeywell International Inc., Morristown, NJ (US)

(*) Notice: Subject to any disclaimer, the term of this patent is extended or adjusted under 35 U.S.C. 154(b) by 1906 days.

(21) Appl. No.: 10/495,686

(22) PCT Filed: Nov. 12, 2002

(86) PCT No.: PCT/US02/36327
§ 371 (c)(1),
(2), (4) Date: Jan. 25, 2007

(87) PCT Pub. No.: WO03/044078
PCT Pub. Date: May 30, 2003

(65) Prior Publication Data
US 2014/0227538 A1    Aug. 14, 2014

Related U.S. Application Data

(63) Continuation of application No. 10/001,143, filed on Nov. 15, 2001, now Pat. No. 6,824,879, which is a continuation-in-part of application No. 09/330,248, filed on Jun. 10, 1999, now Pat. No. 6,268,457, which is a continuation-in-part of application No. 09/698,883, filed on Oct. 27, 2000, now Pat. No. 6,365,765, which is a continuation-in-part of application No. 09/491,166, filed on Jan. 26, 2000, now Pat. No. 6,506,497.

(51) Int. Cl.
| *C08G 77/26* | (2006.01) |
| *G02B 5/23* | (2006.01) |
| *C03C 17/00* | (2006.01) |
| *C03C 17/30* | (2006.01) |
| *C08G 77/04* | (2006.01) |
| *C08G 77/12* | (2006.01) |
| *C08K 5/00* | (2006.01) |
| *C09D 183/04* | (2006.01) |
| *C09D 183/06* | (2006.01) |
| *C09D 183/08* | (2006.01) |
| *G03F 7/09* | (2006.01) |
| *H01L 21/027* | (2006.01) |

(52) U.S. Cl.
CPC .............. *G02B 5/23* (2013.01); *C03C 17/008* (2013.01); *C03C 17/30* (2013.01); *C08G 77/04* (2013.01); *C08G 77/12* (2013.01); *C08K 5/0008* (2013.01); *C09D 183/04* (2013.01); *C09D 183/06* (2013.01); *C09D 183/08* (2013.01); *G03F 7/091* (2013.01); *H01L 21/0276* (2013.01)

(58) Field of Classification Search
CPC .... C03C 17/30; C08G 77/26; H01L 21/0276; C09D 183/08
USPC ...................... 106/287.11; 428/447
See application file for complete search history.

(56) References Cited

U.S. PATENT DOCUMENTS

| 2,986,549 | A | | 5/1961 | McLoughlin |
| 3,547,766 | A | | 12/1970 | Chu |
| 3,784,378 | A | | 1/1974 | Gramas ............................ 96/27 |
| 3,817,902 | A | * | 6/1974 | Gomyo et al. ................ 524/761 |
| 3,884,702 | A | | 5/1975 | Koshimo et al. |
| 3,925,077 | A | | 12/1975 | Lewis et al. .................... 96/35.1 |
| 3,929,489 | A | | 12/1975 | Arcesi et al. .................... 96/115 |
| 4,018,606 | A | | 4/1977 | Contois et al. ................... 96/1.7 |
| 4,018,607 | A | | 4/1977 | Contois ............................. 96/1 |
| 4,043,812 | A | | 8/1977 | Stolka et al. .................... 96/1.5 |
| 4,048,146 | A | | 9/1977 | Wilson ............................ 260/63 |
| 4,052,367 | A | | 10/1977 | Wilson ............................ 260/63 |
| 4,102,683 | A | | 7/1978 | DiPiazza ....................... 96/38.4 |
| 4,107,133 | A | | 8/1978 | Sawai et al. |
| 4,191,571 | A | | 3/1980 | Nonogaki et al. |

(Continued)

FOREIGN PATENT DOCUMENTS

| DE | 19852852 | 5/2000 |
| EP | 0146411 A2 | 6/1985 |

(Continued)

OTHER PUBLICATIONS

Crivello et al., J. Polym. Sci.: Polym. Chem. 21 (1983), 97-109.
Degussa, "Silanes for Adhesives and Sealants," 18-19, available at www.dynasylan.com.
Lamola, A. et al., "Chemically Amplified Resists," Solid State Technology, 53-60 (Aug. 1991).
Y.-C. Lin et al., "Some Aspects of Anti-Reflective Coating for Optical Lithography," Advances in Resist Technology and Processing, Proc., SPIE vol. 469, 30-37 (1984).
McKean et al., "Characterization of a Novolac-Based Three-Component Deep-UV Resist," Chem. Mater. (1990) 2, 619-624.
Nalamasu et al., "Development of a Chemically Amplified Positive (CAMP) Resist Material for Single Layer Deep-UV Lithography," Advances in Resist Technology and Processing VII, SPIE 1262, 32-41 (1990).
Silverstein et al., "Spectrometric Identification of Organic Compounds," 4th Ed. John Wiley & Sons 1991, 309-311.
Willson, C.G., "Organic Resist Materials—Theory and Chemistry," Introduction to Microlithography, American Chemical Society, 87-159 (1983).

(Continued)

*Primary Examiner* — Margaret Moore
(74) *Attorney, Agent, or Firm* — Faegre Baker Daniels LLP

(57) ABSTRACT

Anti-reflective coating materials for ultraviolet photolithography include at least one absorbing compound and at least one material modification agent, such as at least one porogen, at least one high-boiling solvent, at least one capping agent, at least one leveling agent, at least one catalyst, at least one replacement solvent, at least one pH tuning agent, and/or a combination thereof that are incorporated into inorganic-based materials or inorganic compositions and/or compounds. Suitable absorbing compounds are those that absorb around wavelengths such as 365 nm, 248 nm, 193 nm and 157 nm that may be used in photolithography.

20 Claims, 35 Drawing Sheets

(56) References Cited

U.S. PATENT DOCUMENTS

| | | | |
|---|---|---|---|
| 4,299,938 A | 11/1981 | Green et al. | |
| 4,302,503 A | 11/1981 | Mattimoe | |
| 4,348,471 A | 9/1982 | Shelnut et al. | 430/165 |
| 4,349,609 A | 9/1982 | Takeda et al. | |
| 4,362,809 A | 12/1982 | Chen et al. | 430/312 |
| 4,363,859 A | 12/1982 | Sasaki et al. | 430/59 |
| 4,369,284 A | 1/1983 | Chen | 524/476 |
| 4,388,449 A | 6/1983 | Bonnet et al. | |
| 4,413,052 A | 11/1983 | Green et al. | 430/327 |
| 4,430,153 A | 2/1984 | Gleason et al. | |
| 4,442,197 A | 4/1984 | Crivello et al. | 430/280 |
| 4,456,679 A | 6/1984 | Leyrer et al. | 430/326 |
| 4,557,996 A | 12/1985 | Aoyama et al. | 430/324 |
| 4,587,138 A | 5/1986 | Yau et al. | |
| 4,590,117 A * | 5/1986 | Taniguchi et al. | 428/212 |
| 4,594,309 A | 6/1986 | Guillet | 430/270 |
| 4,609,614 A | 9/1986 | Pampalone et al. | 430/323 |
| 4,618,213 A | 10/1986 | Chen | 350/96.34 |
| 4,624,912 A | 11/1986 | Zweifel et al. | 430/258 |
| 4,674,176 A | 6/1987 | Tuckerman | 29/591 |
| 4,678,835 A | 7/1987 | Chang et al. | 525/100 |
| 4,681,795 A | 7/1987 | Tuckerman | 428/209 |
| 4,693,959 A | 9/1987 | Ashcraft | 430/323 |
| 4,705,729 A | 11/1987 | Sheats | 430/5 |
| 4,705,739 A | 11/1987 | Fisch | 430/276 |
| 4,708,925 A | 11/1987 | Newman | 430/270 |
| 4,731,264 A | 3/1988 | Lin et al. | 427/387 |
| 4,732,858 A | 3/1988 | Brewer et al. | 438/228 |
| 4,752,649 A | 6/1988 | Neckers | 560/302 |
| 4,762,767 A | 8/1988 | Haas et al. | 430/167 |
| 4,763,966 A | 8/1988 | Suzuki et al. | 350/1.1 |
| 4,767,571 A | 8/1988 | Suzuki et al. | 252/587 |
| 4,774,141 A | 9/1988 | Matsui et al. | 428/414 |
| 4,782,009 A | 11/1988 | Bolon et al. | 430/326 |
| 4,783,347 A | 11/1988 | Doin et al. | 427/379 |
| 4,814,578 A | 3/1989 | Tuckerman | 219/121.65 |
| 4,822,718 A | 4/1989 | Latham et al. | 430/271 |
| 4,831,188 A | 5/1989 | Neckers | 560/302 |
| 4,839,274 A | 6/1989 | Logan | 430/281 |
| 4,855,199 A | 8/1989 | Bolon et al. | 430/18 |
| 4,863,827 A | 9/1989 | Jain et al. | 430/145 |
| 4,876,165 A | 10/1989 | Brewer et al. | 430/7 |
| 4,910,122 A | 3/1990 | Arnold et al. | |
| 4,913,846 A | 4/1990 | Suzuki et al. | 252/587 |
| 4,921,317 A | 5/1990 | Suzuki et al. | 350/1.1 |
| 4,923,638 A | 5/1990 | Ohno et al. | 252/587 |
| 4,925,772 A | 5/1990 | Quella et al. | 430/281 |
| 4,927,732 A | 5/1990 | Merrem et al. | 430/191 |
| 4,935,320 A | 6/1990 | Rohde et al. | |
| 4,935,583 A | 6/1990 | Kyle | |
| 4,940,651 A | 7/1990 | Brown et al. | 430/325 |
| 4,942,083 A | 7/1990 | Smith, Jr. | 428/252 |
| 4,950,583 A | 8/1990 | Brewer et al. | |
| 4,954,414 A | 9/1990 | Adair et al. | 430/138 |
| 4,970,134 A | 11/1990 | Bronstert et al. | 430/271 |
| 4,973,510 A | 11/1990 | Tanaka | 428/212 |
| 5,004,660 A | 4/1991 | Van Andel et al. | 430/17 |
| 5,009,669 A | 4/1991 | Jollenbeck et al. | 8/573 |
| 5,009,809 A | 4/1991 | Kosin et al. | 252/350 |
| 5,009,810 A | 4/1991 | Wason et al. | 252/350 |
| 5,013,608 A | 5/1991 | Guest et al. | 428/436 |
| 5,024,923 A | 6/1991 | Suzuki et al. | 430/372 |
| 5,026,624 A | 6/1991 | Day et al. | 430/280 |
| 5,037,580 A | 8/1991 | Garcia et al. | 252/350 |
| 5,043,789 A * | 8/1991 | Linde et al. | 257/632 |
| 5,045,570 A | 9/1991 | Mooney et al. | 521/88 |
| 5,049,414 A | 9/1991 | Kato | 427/164 |
| 5,055,372 A | 10/1991 | Shanklin et al. | 430/138 |
| 5,055,376 A | 10/1991 | Saeva | 430/270 |
| 5,059,500 A | 10/1991 | Needham et al. | 430/7 |
| 5,077,085 A | 12/1991 | Schnur et al. | 427/98 |
| 5,079,600 A | 1/1992 | Schnur et al. | 357/4 |
| 5,082,758 A | 1/1992 | Hoffend et al. | |
| 5,100,503 A | 3/1992 | Allman et al. | 156/643 |
| 5,102,695 A | 4/1992 | Guest et al. | 427/164 |
| 5,104,692 A | 4/1992 | Belmares | 427/164 |
| 5,106,534 A | 4/1992 | Wason et al. | 252/350 |
| 5,112,728 A | 5/1992 | Tanji et al. | 430/507 |
| 5,116,715 A | 5/1992 | Roland et al. | 430/190 |
| 5,126,289 A | 6/1992 | Ziger | |
| 5,137,655 A | 8/1992 | Kosin et al. | 252/350 |
| 5,140,396 A | 8/1992 | Needham et al. | 357/30 |
| 5,152,834 A | 10/1992 | Allman | 106/287.13 |
| 5,153,254 A | 10/1992 | Chen | 524/505 |
| 5,166,093 A | 11/1992 | Grief | 437/173 |
| 5,173,368 A | 12/1992 | Belmares | 428/426 |
| 5,190,804 A * | 3/1993 | Seto et al. | 428/192 |
| 5,194,364 A | 3/1993 | Abe et al. | 430/325 |
| 5,198,518 A * | 3/1993 | Yamamoto et al. | 528/12 |
| 5,199,979 A | 4/1993 | Lin et al. | 106/287.14 |
| 5,204,432 A | 4/1993 | Saito et al. | |
| 5,212,046 A | 5/1993 | Lamola et al. | 430/270 |
| 5,212,218 A | 5/1993 | Rinehart | 523/455 |
| 5,219,788 A | 6/1993 | Abernathey et al. | 437/187 |
| 5,239,723 A | 8/1993 | Chen | 15/104.002 |
| 5,250,224 A | 10/1993 | Wason et al. | 252/350 |
| 5,252,340 A | 10/1993 | Honeycutt | 424/489 |
| 5,252,618 A | 10/1993 | Garcia et al. | 521/57 |
| 5,256,510 A | 10/1993 | Bugner et al. | 430/83 |
| 5,262,468 A | 11/1993 | Chen | 524/476 |
| 5,272,026 A | 12/1993 | Roland et al. | 430/18 |
| 5,272,042 A | 12/1993 | Allen et al. | 430/270 |
| 5,278,010 A | 1/1994 | Day et al. | 430/18 |
| 5,300,402 A | 4/1994 | Card, Jr. et al. | 430/280 |
| 5,302,198 A | 4/1994 | Allman | 106/287.16 |
| 5,302,455 A | 4/1994 | Wason et al. | 428/403 |
| 5,306,736 A | 4/1994 | Mooney et al. | 521/91 |
| 5,317,044 A | 5/1994 | Mooney et al. | 521/78 |
| 5,319,049 A | 6/1994 | Yoshioka et al. | |
| 5,324,222 A | 6/1994 | Chen | 446/34 |
| 5,324,591 A | 6/1994 | Georger, Jr. et al. | 428/552 |
| 5,334,646 A | 8/1994 | Chen | 524/474 |
| 5,336,708 A | 8/1994 | Chen | 524/474 |
| 5,360,692 A | 11/1994 | Kawabe et al. | 430/191 |
| 5,380,621 A | 1/1995 | Dichiara et al. | 430/272 |
| 5,382,615 A | 1/1995 | Godrey | 524/271 |
| 5,384,357 A | 1/1995 | Levinson et al. | 524/770 |
| 5,389,496 A | 2/1995 | Calvert et al. | 430/315 |
| 5,391,463 A | 2/1995 | Ligler et al. | 430/272 |
| 5,395,734 A | 3/1995 | Vogel et al. | 430/270 |
| 5,401,614 A | 3/1995 | Dichiara et al. | 430/323 |
| 5,403,680 A | 4/1995 | Otagawa et al. | |
| 5,415,927 A * | 5/1995 | Hirayama et al. | 428/307.3 |
| 5,417,977 A | 5/1995 | Honeycutt | 424/443 |
| 5,418,136 A | 5/1995 | Miller et al. | 435/5 |
| 5,432,007 A | 7/1995 | Naito | 428/447 |
| 5,439,766 A | 8/1995 | Day et al. | 430/18 |
| 5,439,872 A | 8/1995 | Ito et al. | 503/227 |
| 5,449,639 A | 9/1995 | Wei et al. | 437/187 |
| 5,449,712 A | 9/1995 | Gierke et al. | 524/266 |
| 5,455,145 A | 10/1995 | Tarumoto | 430/325 |
| 5,457,081 A | 10/1995 | Takiguchi et al. | 503/227 |
| 5,458,982 A | 10/1995 | Godfrey | 428/514 |
| 5,460,911 A | 10/1995 | Yu et al. | |
| 5,467,626 A | 11/1995 | Sanders | 72/60 |
| 5,468,591 A | 11/1995 | Pearce et al. | 430/201 |
| 5,472,488 A | 12/1995 | Allman | 106/287.16 |
| 5,475,890 A | 12/1995 | Chen | 15/104.002 |
| 5,482,817 A | 1/1996 | Dichiara et al. | 430/271.1 |
| 5,498,345 A | 3/1996 | Jollenbeck et al. | 252/589 |
| 5,498,468 A | 3/1996 | Blaney | 428/198 |
| 5,498,748 A | 3/1996 | Urano et al. | 560/67 |
| 5,500,315 A | 3/1996 | Calvert et al. | 430/16 |
| 5,508,334 A | 4/1996 | Chen | 524/474 |
| 5,510,628 A | 4/1996 | Georger, Jr. et al. | 257/32 |
| 5,512,418 A | 4/1996 | Ma | 430/271.1 |
| 5,518,818 A | 5/1996 | Kidai et al. | 428/412 |
| 5,527,872 A | 6/1996 | Allman | 528/12 |
| 5,552,260 A | 9/1996 | Vogel et al. | 430/270.1 |
| 5,554,485 A | 9/1996 | Dichiara et al. | 430/271.1 |
| 5,576,144 A | 11/1996 | Pearce et al. | 430/270.15 |
| 5,576,247 A | 11/1996 | Yano et al. | 437/225 |
| 5,576,359 A | 11/1996 | Urano et al. | 523/400 |
| 5,578,318 A | 11/1996 | Honeycutt | 424/443 |

(56) References Cited

U.S. PATENT DOCUMENTS

| | | | | |
|---|---|---|---|---|
| 5,580,819 A | 12/1996 | Li et al. | | 427/167 |
| 5,597,408 A | 1/1997 | Choi | | 106/481 |
| 5,624,294 A | 4/1997 | Chen | | 446/253 |
| 5,633,286 A | 5/1997 | Chen | | 524/474 |
| 5,638,724 A | 6/1997 | Sanders | | 76/107.1 |
| 5,648,201 A | 7/1997 | Dulcey et al. | | 430/324 |
| 5,655,947 A | 8/1997 | Chen | | 446/46 |
| 5,661,196 A | 8/1997 | Mayer et al. | | 523/122 |
| 5,661,992 A | 9/1997 | Sanders | | 72/60 |
| 5,665,845 A | 9/1997 | Allman | | 528/8 |
| 5,670,295 A | 9/1997 | Namba et al. | | 430/270.21 |
| 5,672,243 A | 9/1997 | Hsia et al. | | 156/659.11 |
| 5,674,624 A | 10/1997 | Miyazaki et al. | | 428/422 |
| 5,674,648 A | 10/1997 | Brewer et al. | | |
| 5,677,112 A | 10/1997 | Urano et al. | | 430/325 |
| 5,679,128 A | 10/1997 | Latting et al. | | 71/49 |
| 5,695,551 A | 12/1997 | Buckingham et al. | | 106/2 |
| 5,695,910 A | 12/1997 | Urano et al. | | 430/270.1 |
| 5,707,883 A | 1/1998 | Tabara | | 437/40 |
| 5,719,249 A | 2/1998 | Fujita et al. | | 528/27 |
| 5,741,623 A | 4/1998 | Namba et al. | | 430/270.19 |
| 5,744,243 A | 4/1998 | Li et al. | | 428/447 |
| 5,747,223 A | 5/1998 | Allen et al. | | 430/325 |
| 5,747,553 A | 5/1998 | Guzauskas | | 523/115 |
| 5,750,292 A | 5/1998 | Sato et al. | | 430/15 |
| 5,755,867 A | 5/1998 | Chikuni et al. | | 106/287.16 |
| 5,756,257 A | 5/1998 | Landgrebe et al. | | 430/273.1 |
| 5,759,625 A | 6/1998 | Laubacher et al. | | |
| 5,760,117 A | 6/1998 | Chen | | 524/270 |
| 5,773,170 A | 6/1998 | Patel et al. | | 430/5 |
| 5,780,206 A | 7/1998 | Urano et al. | | 430/325 |
| 5,786,125 A | 7/1998 | Tsuchiya et al. | | 430/272.1 |
| 5,800,926 A | 9/1998 | Nogami et al. | | 428/447 |
| 5,843,617 A | 12/1998 | Patel et al. | | 430/201 |
| 5,851,730 A | 12/1998 | Thackeray et al. | | 430/271.1 |
| 5,851,738 A | 12/1998 | Thackeray et al. | | 430/327 |
| 5,855,960 A | 1/1999 | Ohnishi et al. | | 427/337 |
| 5,868,597 A | 2/1999 | Chen | | 446/46 |
| 5,873,931 A | 2/1999 | Scholz et al. | | 106/13 |
| 5,883,011 A | 3/1999 | Lin et al. | | 438/747 |
| 5,884,639 A | 3/1999 | Chen | | 132/321 |
| 5,910,021 A | 6/1999 | Tabara | | 438/636 |
| 5,929,159 A | 7/1999 | Schutt et al. | | 524/544 |
| 5,935,758 A | 8/1999 | Patel et al. | | 430/200 |
| 5,938,499 A | 8/1999 | Chen | | 446/46 |
| 5,939,236 A | 8/1999 | Pavelchek et al. | | 430/273.1 |
| 5,939,510 A | 8/1999 | Sato et al. | | 528/128 |
| 5,945,172 A | 8/1999 | Yamaya et al. | | 427/503 |
| 5,945,249 A | 8/1999 | Patel et al. | | 430/200 |
| 5,948,600 A | 9/1999 | Roschger et al. | | 430/348 |
| 5,949,518 A | 9/1999 | Belmares et al. | | 351/166 |
| 5,955,140 A * | 9/1999 | Smith et al. | | 438/778 |
| 5,962,572 A | 10/1999 | Chen | | 524/474 |
| 5,964,917 A | 10/1999 | Latting | | 71/49 |
| 5,965,305 A | 10/1999 | Ligler et al. | | 430/17 |
| 5,972,616 A | 10/1999 | O'Brien et al. | | 435/6 |
| 5,976,666 A | 11/1999 | Narang et al. | | 428/138 |
| 5,981,675 A | 11/1999 | Valint, Jr. et al. | | 526/279 |
| 5,985,444 A | 11/1999 | Olson et al. | | 428/357 |
| 5,986,344 A | 11/1999 | Subramanion et al. | | 257/760 |
| 5,994,431 A | 11/1999 | Olson et al. | | 524/91 |
| 5,997,621 A | 12/1999 | Scholz et al. | | 106/13 |
| 5,998,300 A | 12/1999 | Tabara | | 438/700 |
| 6,000,339 A | 12/1999 | Matsuzawa | | |
| 6,008,350 A | 12/1999 | Roschger et al. | | 544/300 |
| 6,025,077 A | 2/2000 | Yamaki et al. | | 428/447 |
| 6,033,283 A | 3/2000 | Chen | | 446/253 |
| 6,040,053 A | 3/2000 | Scholz et al. | | |
| 6,040,251 A | 3/2000 | Caldwell | | 442/123 |
| 6,043,547 A | 3/2000 | Hsia et al. | | 257/437 |
| 6,050,871 A | 4/2000 | Chen | | 446/46 |
| 6,051,310 A | 4/2000 | Cano et al. | | 428/336 |
| 6,087,068 A | 7/2000 | Sato et al. | | 430/271.1 |
| 6,096,460 A * | 8/2000 | French et al. | | 430/5 |
| 6,103,456 A | 8/2000 | Tobben et al. | | 430/317 |
| 6,103,779 A | 8/2000 | Guzauskas | | 523/115 |
| 6,107,167 A | 8/2000 | Bhakta | | 438/483 |
| 6,117,176 A | 9/2000 | Chen | | 623/36 |
| 6,137,175 A | 10/2000 | Tabara | | 257/750 |
| 6,144,083 A | 11/2000 | Yin | | 257/437 |
| 6,148,830 A | 11/2000 | Chen | | 132/321 |
| 6,149,934 A | 11/2000 | Krzysik et al. | | 424/443 |
| 6,150,250 A | 11/2000 | Tabara et al. | | 438/592 |
| 6,150,440 A | 11/2000 | Olson et al. | | 524/91 |
| 6,152,906 A | 11/2000 | Faulks et al. | | 604/385.01 |
| 6,161,555 A | 12/2000 | Chen | | 132/321 |
| 6,165,697 A | 12/2000 | Thackeray et al. | | 430/325 |
| 6,171,766 B1 | 1/2001 | Patel et al. | | 430/339 |
| 6,174,977 B1 | 1/2001 | Ariyoshi et al. | | 526/194 |
| 6,180,025 B1 | 1/2001 | Schoenfeld et al. | | 252/299.01 |
| 6,180,317 B1 | 1/2001 | Allen et al. | | 430/280.1 |
| 6,187,505 B1 | 2/2001 | Lin et al. | | 430/270.1 |
| 6,187,689 B1 | 2/2001 | Tabara | | 438/738 |
| 6,190,830 B1 | 2/2001 | Leon et al. | | 430/270.1 |
| 6,190,839 B1 | 2/2001 | Pavelchek et al. | | 430/325 |
| 6,190,955 B1 | 2/2001 | Ilg et al. | | 438/238 |
| 6,191,030 B1 | 2/2001 | Subramanian et al. | | 438/636 |
| 6,194,121 B1 | 2/2001 | Namba et al. | | 430/270.19 |
| 6,194,534 B1 | 2/2001 | Baumann et al. | | 528/25 |
| 6,210,856 B1 | 4/2001 | Lin et al. | | |
| 6,210,862 B1 | 4/2001 | Day et al. | | 430/280.1 |
| 6,217,890 B1 | 4/2001 | Paul et al. | | 424/402 |
| 6,225,033 B1 | 5/2001 | Onishi et al. | | 430/322 |
| 6,225,671 B1 | 5/2001 | Yin | | 257/437 |
| 6,232,424 B1 | 5/2001 | Zhong et al. | | 528/12 |
| 6,235,456 B1 | 5/2001 | Ibok | | 430/512 |
| 6,238,379 B1 | 5/2001 | Keuhn, Jr. et al. | | 604/367 |
| 6,238,838 B1 | 5/2001 | Gaschler et al. | | 430/278.1 |
| 6,261,676 B1 | 7/2001 | Olson et al. | | 428/221 |
| 6,261,743 B1 | 7/2001 | Pavelchek et al. | | 430/325 |
| 6,268,294 B1 | 7/2001 | Jang et al. | | 438/706 |
| 6,268,457 B1 | 7/2001 | Kennedy et al. | | 528/39 |
| 6,271,273 B1 | 8/2001 | You et al. | | 521/61 |
| 6,277,750 B1 | 8/2001 | Pawlowski et al. | | 438/689 |
| 6,284,428 B1 | 9/2001 | Hirosaki et al. | | 430/270.1 |
| 6,287,286 B1 | 9/2001 | Akin et al. | | 604/385.01 |
| 6,291,143 B1 | 9/2001 | Patel et al. | | 430/339 |
| 6,291,586 B2 | 9/2001 | Lasch et al. | | 525/123 |
| 6,296,862 B1 | 10/2001 | Paul et al. | | 424/402 |
| 6,303,229 B2 * | 10/2001 | Takahama et al. | | 428/447 |
| 6,313,233 B1 * | 11/2001 | Kurosawa et al. | | 525/431 |
| 6,315,946 B1 | 11/2001 | Focht | | 420/112 |
| 6,316,013 B1 | 11/2001 | Paul et al. | | 424/402 |
| 6,316,160 B1 | 11/2001 | Shao et al. | | 430/271.1 |
| 6,316,165 B1 | 11/2001 | Pavelchek et al. | | 430/311 |
| 6,323,268 B1 | 11/2001 | Fisher et al. | | 524/266 |
| 6,324,703 B1 | 12/2001 | Chen | | 2/458 |
| 6,326,231 B1 | 12/2001 | Subramanian et al. | | 438/72 |
| 6,329,117 B1 | 12/2001 | Padmanaban et al. | | 430/270.1 |
| 6,329,118 B1 | 12/2001 | Hussein et al. | | 430/270.1 |
| 6,333,374 B1 | 12/2001 | Chen | | 524/270 |
| 6,335,235 B1 | 1/2002 | Bhakta et al. | | 438/221 |
| 6,342,249 B1 | 1/2002 | Wong et al. | | 424/473 |
| 6,344,305 B1 | 2/2002 | Lin et al. | | 430/270.1 |
| 6,348,240 B1 | 2/2002 | Calvert et al. | | 427/539 |
| 6,350,818 B1 | 2/2002 | Hong et al. | | 525/328.8 |
| 6,352,931 B1 | 3/2002 | Seta et al. | | 438/700 |
| 6,358,294 B1 | 3/2002 | Latting | | 71/49 |
| 6,365,529 B1 | 4/2002 | Hussein et al. | | 438/780 |
| 6,365,765 B1 | 4/2002 | Baldwin et al. | | 556/440 |
| 6,368,400 B1 | 4/2002 | Baldwin et al. | | 106/481 |
| 6,368,681 B1 | 4/2002 | Ogawa | | 428/1.23 |
| 6,374,738 B1 | 4/2002 | Lewis et al. | | 101/467 |
| 6,387,519 B1 | 5/2002 | Anderson et al. | | 428/447 |
| 6,391,524 B2 | 5/2002 | Yates et al. | | 430/286.1 |
| 6,403,464 B1 | 6/2002 | Chang | | 438/623 |
| 6,409,883 B1 | 6/2002 | Makolin et al. | | 162/52 |
| 6,410,209 B1 | 6/2002 | Adams et al. | | 430/311 |
| 6,420,088 B1 | 7/2002 | Angelopoulos et al. | | 430/272.1 |
| 6,420,475 B1 | 7/2002 | Chen | | 524/505 |
| 6,426,125 B1 | 7/2002 | Yang et al. | | 427/488 |
| 6,432,191 B2 | 8/2002 | Schutt | | 106/287.13 |
| 6,433,037 B1 | 8/2002 | Guzauskas | | 522/71 |
| 6,441,452 B2 | 8/2002 | Yin | | 257/437 |

(56) References Cited

U.S. PATENT DOCUMENTS

| | | | |
|---|---|---|---|
| 6,444,584 B1 | 9/2002 | Hsiao | 438/706 |
| 6,448,185 B1 | 9/2002 | Andideh et al. | 438/706 |
| 6,448,464 B1 | 9/2002 | Akin et al. | 604/367 |
| 6,451,503 B1 | 9/2002 | Thackeray et al. | 430/271.1 |
| 6,455,207 B1 | 9/2002 | Katoh et al. | 430/7 |
| 6,455,416 B1 | 9/2002 | Subramanian et al. | 438/636 |
| 6,461,970 B1 | 10/2002 | Yin | 438/710 |
| 6,465,358 B1 | 10/2002 | Nashner et al. | 438/700 |
| 6,465,889 B1 | 10/2002 | Subramanian et al. | 257/760 |
| 6,472,012 B2 | 10/2002 | Nakada et al. | 427/58 |
| 6,472,128 B2 | 10/2002 | Thackeray et al. | 430/322 |
| 6,475,892 B1 | 11/2002 | Bhakta | 438/585 |
| 6,488,394 B1 | 12/2002 | Mabe et al. | 362/510 |
| 6,491,840 B1 | 12/2002 | Frankenbach et al. | 252/8.91 |
| 6,492,441 B2 | 12/2002 | Hong et al. | 524/89 |
| 6,497,893 B1 | 12/2002 | Everhart et al. | 424/402 |
| 6,503,233 B1 | 1/2003 | Chen et al. | 604/385.01 |
| 6,503,413 B2 | 1/2003 | Uchiyama et al. | 252/8.91 |
| 6,503,525 B1 | 1/2003 | Paul et al. | 424/402 |
| 6,503,526 B1 | 1/2003 | Krzysik et al. | 424/402 |
| 6,503,586 B1 | 1/2003 | Wu et al. | 428/35.7 |
| 6,503,692 B2 | 1/2003 | Angelopoulos et al. | 430/310 |
| 6,506,497 B1 | 1/2003 | Kennedy et al. | 428/447 |
| 6,514,677 B1 | 2/2003 | Ramsden et al. | 430/350 |
| 6,528,235 B2 | 3/2003 | Thackeray et al. | 430/271.1 |
| 6,544,717 B2 | 4/2003 | Hirosaki et al. | 430/271.1 |
| 6,552,109 B1 | 4/2003 | Chen | 524/270 |
| 6,558,363 B2 | 5/2003 | Keuhn, Jr. et al. | 604/385.01 |
| 6,558,880 B1 | 5/2003 | Goswami et al. | 430/350 |
| 6,562,192 B1 | 5/2003 | Hamilton et al. | 162/56 |
| 6,565,813 B1 | 5/2003 | Garyantes | 422/102 |
| 6,566,479 B1 | 5/2003 | Bublewitz et al. | 528/15 |
| 6,573,175 B1 | 6/2003 | Yin et al. | 438/637 |
| 6,576,382 B2 | 6/2003 | Day et al. | 430/18 |
| 6,576,408 B2 | 6/2003 | Meador et al. | 430/325 |
| 6,576,651 B2 | 6/2003 | Bandyopadhyay et al. | 514/365 |
| 6,582,861 B2 | 6/2003 | Buxbaum et al. | 430/5 |
| 6,592,999 B1 | 7/2003 | Anderson et al. | 428/447 |
| 6,593,388 B2 | 7/2003 | Crivello | 522/25 |
| 6,596,314 B2 | 7/2003 | Wong et al. | 424/473 |
| 6,602,652 B2 | 8/2003 | Adams et al. | 430/311 |
| 6,605,359 B2 | 8/2003 | Robinson et al. | 428/447 |
| 6,605,360 B2 | 8/2003 | Kizaki et al. | 428/447 |
| 6,605,362 B2 | 8/2003 | Baldwin et al. | 428/447 |
| 6,605,542 B2 | 8/2003 | Seta et al. | 438/700 |
| 6,610,457 B2 | 8/2003 | Kim et al. | 430/271.1 |
| 6,612,828 B2 | 9/2003 | Powers et al. | 425/145 |
| 6,617,257 B2 | 9/2003 | Ni et al. | 438/725 |
| 6,623,791 B2 | 9/2003 | Sadvary et al. | 427/140 |
| 6,627,275 B1 | 9/2003 | Chen | 428/35.2 |
| 6,632,535 B1 | 10/2003 | Buazza et al. | 428/447 |
| 6,635,281 B2 | 10/2003 | Wong et al. | 424/473 |
| 6,635,341 B1 | 10/2003 | Barancyk et al. | 428/323 |
| 6,645,685 B2 | 11/2003 | Takata et al. | 430/31 |
| 6,649,083 B1 * | 11/2003 | Pinnavaia et al. | 252/179 |
| 6,649,212 B2 | 11/2003 | Payne et al. | 427/160 |
| 6,649,741 B1 | 11/2003 | O'Brien et al. | 530/387.1 |
| 6,652,766 B1 | 11/2003 | Frankenbach et al. | 252/8.91 |
| 6,653,049 B2 | 11/2003 | Pavelchek et al. | 430/272.1 |
| 6,655,946 B2 | 12/2003 | Foreman et al. | 425/145 |
| 6,667,424 B1 | 12/2003 | Hamilton et al. | 604/375 |
| 6,670,284 B2 | 12/2003 | Yin | 438/759 |
| 6,673,982 B1 | 1/2004 | Chen et al. | 604/378 |
| 6,676,398 B2 | 1/2004 | Foreman et al. | 425/135 |
| 6,676,740 B2 | 1/2004 | Matsumura et al. | 106/287.1 |
| 6,689,932 B2 | 2/2004 | Kruchoski et al. | 604/360 |
| 6,699,647 B2 | 3/2004 | Lynch et al. | 430/350 |
| 6,702,564 B2 | 3/2004 | Foreman et al. | 425/162 |
| 6,703,169 B2 | 3/2004 | Fuller et al. | 430/5 |
| 6,703,462 B2 | 3/2004 | Lee | 526/242 |
| 6,709,257 B2 | 3/2004 | Foreman et al. | 425/145 |
| 6,712,331 B2 | 3/2004 | Foreman et al. | 249/103 |
| 6,713,643 B2 * | 3/2004 | Pinnavaia et al. | 556/450 |
| 6,716,566 B2 | 4/2004 | Aoshima | 430/273.1 |
| 6,717,181 B2 | 4/2004 | Murakami et al. | 257/72 |
| 6,720,125 B2 | 4/2004 | Nakamura et al. | 430/157 |
| 6,726,463 B2 | 4/2004 | Foreman | 425/162 |
| 6,730,454 B2 | 5/2004 | Pfeiffer et al. | 430/270.1 |
| 6,730,461 B2 | 5/2004 | Hunt et al. | 430/350 |
| 6,737,121 B2 | 5/2004 | Yang et al. | 427/452 |
| 6,749,860 B2 | 6/2004 | Tyrrell et al. | 424/404 |
| 6,752,613 B2 | 6/2004 | Foreman | 425/145 |
| 6,756,103 B2 | 6/2004 | Thompson et al. | 428/64.1 |
| 6,756,124 B2 | 6/2004 | Kanamori et al. | 428/447 |
| 6,756,520 B1 | 6/2004 | Krzysik et al. | 604/360 |
| 6,758,663 B2 | 7/2004 | Foreman et al. | 425/155 |
| 6,767,689 B2 | 7/2004 | Pavelchek et al. | 430/271.1 |
| 6,770,327 B2 * | 8/2004 | Edelmann et al. | 427/387 |
| 6,773,861 B2 | 8/2004 | Takashima et al. | 430/270.1 |
| 6,773,864 B1 | 8/2004 | Thackeray et al. | 430/271.1 |
| 6,776,094 B1 | 8/2004 | Whitesides et al. | 101/327 |
| 6,777,092 B1 | 8/2004 | Hayashi et al. | 428/429 |
| 6,783,468 B2 | 8/2004 | Sullivan et al. | 473/374 |
| 6,787,281 B2 | 9/2004 | Tao et al. | 430/163 |
| 6,790,024 B2 | 9/2004 | Foreman | 425/162 |
| 6,794,440 B2 | 9/2004 | Chen | 524/505 |
| 6,797,343 B2 | 9/2004 | Lee | 428/1.1 |
| 6,803,034 B2 | 10/2004 | DuVal et al. | 424/76.2 |
| 6,803,168 B1 | 10/2004 | Padmanaban et al. | 430/270.1 |
| 6,808,381 B2 | 10/2004 | Foreman et al. | 425/135 |
| 6,819,049 B1 | 11/2004 | Bohmer et al. | 313/635 |
| 6,824,879 B2 | 11/2004 | Baldwin et al. | 428/447 |
| 6,824,952 B1 | 11/2004 | Minsek et al. | 430/270.1 |
| 6,825,303 B2 | 11/2004 | Lee | 526/242 |
| 6,832,064 B2 | 12/2004 | Simpson et al. | 399/249 |
| 6,840,752 B2 | 1/2005 | Foreman et al. | 425/174.4 |
| 6,844,131 B2 | 1/2005 | Oberlander et al. | 430/270.1 |
| 6,846,568 B2 | 1/2005 | Yamaya et al. | |
| 6,846,614 B2 | 1/2005 | Timpe et al. | 430/281.1 |
| 6,849,373 B2 | 2/2005 | Pavelchek et al. | 430/270.1 |
| 6,849,923 B2 | 2/2005 | Seta et al. | 257/635 |
| 6,852,421 B2 | 2/2005 | Wayton et al. | 428/480 |
| 6,852,766 B1 | 2/2005 | De Voe | 522/25 |
| 6,855,466 B2 | 2/2005 | Pavelchek et al. | 430/14 |
| 6,864,040 B2 | 3/2005 | Muller et al. | 430/287.1 |
| 6,867,253 B1 | 3/2005 | Chen | 524/505 |
| 6,869,747 B2 | 3/2005 | Sabnis et al. | 430/270.1 |
| 6,875,005 B2 | 4/2005 | Foreman | 425/145 |
| 6,884,568 B2 | 4/2005 | Timpe et al. | 430/284.1 |
| 6,887,644 B1 | 5/2005 | Nozaki et al. | 430/270.1 |
| 6,887,648 B2 | 5/2005 | Pavelchek et al. | 430/271.1 |
| 6,888,174 B2 | 5/2005 | Hohn et al. | 257/100 |
| 6,890,448 B2 | 5/2005 | Pavelchek | 216/16 |
| 6,890,865 B2 | 5/2005 | Yin et al. | 438/751 |
| 6,891,237 B1 | 5/2005 | Bao et al. | |
| 6,893,245 B2 | 5/2005 | Foreman et al. | 425/135 |
| 6,893,797 B2 | 5/2005 | Munnelly et al. | 430/284.1 |
| 6,896,821 B2 | 5/2005 | Louellet | 216/2 |
| 6,899,988 B2 | 5/2005 | Kidnie et al. | 430/200 |
| 6,900,000 B2 | 5/2005 | Sabnis et al. | 430/322 |
| 6,902,861 B2 | 6/2005 | Tao et al. | 430/270.1 |
| 6,909,220 B2 | 6/2005 | Chen | 310/309 |
| 6,911,514 B2 | 6/2005 | Bublewitz et al. | 526/279 |
| 6,914,114 B2 | 7/2005 | Baldwin et al. | 528/43 |
| 7,014,982 B2 | 3/2006 | Thackeray et al. | |
| 7,108,954 B2 * | 9/2006 | Nishimura et al. | 430/270.1 |
| 7,307,343 B2 * | 12/2007 | Kirner et al. | 257/758 |
| 2001/0032568 A1 * | 10/2001 | Schutt | 106/287.11 |
| 2002/0022196 A1 * | 2/2002 | Pavelchek et al. | 430/311 |
| 2002/0031729 A1 | 3/2002 | Trefonas, III et al. | 430/322 |
| 2002/0034630 A1 | 3/2002 | Cano et al. | 428/331 |
| 2002/0061453 A1 | 5/2002 | Sato et al. | |
| 2002/0102417 A1 | 8/2002 | Schutt et al. | 428/447 |
| 2002/0127330 A1 | 9/2002 | Jin et al. | 427/162 |
| 2003/0003176 A1 | 1/2003 | Foreman et al. | 425/135 |
| 2003/0111748 A1 | 6/2003 | Foreman | 264/1.38 |
| 2003/0125430 A1 | 7/2003 | Adedeji et al. | 524/115 |
| 2003/0157391 A1 | 8/2003 | Coleman et al. | 429/34 |
| 2003/0171729 A1 | 9/2003 | Kaun et al. | 604/382 |
| 2003/0192638 A1 | 10/2003 | Yang et al. | 156/230 |
| 2003/0198578 A1 | 10/2003 | Lee et al. | 422/138 |
| 2003/0214042 A1 | 11/2003 | Miyazawa | |
| 2003/0224611 A1 | 12/2003 | Seta et al. | 438/706 |
| 2003/0227021 A1 | 12/2003 | Yamazaki et al. | 257/83 |

(56) References Cited

U.S. PATENT DOCUMENTS

| | | | |
|---|---|---|---|
| 2003/0235785 A1 | 12/2003 | Barclay et al. | |
| 2004/0020689 A1 | 2/2004 | Kagami et al. | 174/261 |
| 2004/0067437 A1 | 4/2004 | Wayton et al. | 430/271.1 |
| 2004/0072420 A1 | 4/2004 | Enomoto et al. | 438/636 |
| 2004/0072436 A1 | 4/2004 | RamachandraRao et al. | 438/692 |
| 2004/0091811 A1 | 5/2004 | Munnelly et al. | 430/270.1 |
| 2004/0096666 A1 | 5/2004 | Knox et al. | 428/412 |
| 2004/0131979 A1 | 7/2004 | Li et al. | 430/311 |
| 2004/0161698 A1 | 8/2004 | Kanagasabapathy et al. | |
| 2004/0229158 A1 | 11/2004 | Meador et al. | 430/270.1 |
| 2004/0247900 A1 | 12/2004 | Ogihara et al. | 428/447 |
| 2004/0253461 A1 | 12/2004 | Ogihara et al. | 428/447 |
| 2004/0253532 A1 | 12/2004 | Wu et al. | 430/270.1 |
| 2004/0253535 A1 | 12/2004 | Cameron et al. | 430/270.1 |
| 2005/0019842 A1 | 1/2005 | Prober et al. | 435/7.9 |
| 2005/0026092 A1 | 2/2005 | Nagase | 430/434 |
| 2005/0042538 A1 | 2/2005 | Babich et al. | 430/270.1 |
| 2005/0074689 A1 | 4/2005 | Angelopoulos et al. | 430/270.1 |
| 2005/0074981 A1 | 4/2005 | Meagley et al. | 438/745 |
| 2005/0077639 A1 | 4/2005 | Foreman et al. | 264/1.38 |
| 2005/0171277 A1 | 8/2005 | Li et al. | |
| 2005/0225238 A1 | 10/2005 | Yamazaki | |
| 2006/0110682 A1 | 5/2006 | Thackeray et al. | |
| 2006/0155594 A1 | 7/2006 | Almeida et al. | |

FOREIGN PATENT DOCUMENTS

| | | | |
|---|---|---|---|
| EP | 0152377 | A2 | 8/1985 |
| EP | 0217137 | B1 | 8/1986 |
| EP | 0225676 | B1 | 6/1987 |
| EP | 0184248 | B1 | 8/1989 |
| EP | 0401499 | B1 | 4/1990 |
| EP | 0388503 | A1 | 9/1990 |
| EP | 0458651 | B1 | 11/1991 |
| EP | 0494744 | A1 | 7/1992 |
| EP | 0159428 | B1 | 11/1992 |
| EP | 0422570 | B1 | 12/1995 |
| EP | 1 127 929 | * | 8/2001 |
| GB | 1385241 | | 2/1975 |
| GB | 1601288 | | 10/1981 |
| JP | 55-063335 | | 5/1980 |
| JP | 59109565 | A | 6/1984 |
| JP | 6158788 | A | 3/1986 |
| JP | 61-274497 | | 12/1986 |
| JP | 63-137437 | | 6/1988 |
| JP | 64-028032 | | 1/1989 |
| JP | 1207310 | | 8/1989 |
| JP | 1245248 | | 9/1989 |
| JP | 02-145511 | | 6/1990 |
| JP | 03-050459 | | 3/1991 |
| JP | 3064753 | | 3/1991 |
| JP | 3152544 | | 6/1991 |
| JP | 3200257 | | 9/1991 |
| JP | 3209476 | | 9/1991 |
| JP | 6056560 | A | 3/1994 |
| JP | 6095385 | A | 4/1994 |
| JP | 9183853 | A | 7/1997 |
| JP | 10502461 | T | 3/1998 |
| JP | 10161315 | A | 6/1998 |
| JP | 2001092122 | A | 6/2001 |
| JP | 2003-050459 | | 2/2003 |
| JP | 2006-241407 | A | 9/2006 |
| WO | 90/03598 | | 4/1990 |
| WO | 9600758 | | 1/1996 |
| WO | 0077575 | A | 12/2000 |
| WO | 02/16477 | A2 | 2/2002 |
| WO | 03/044600 | A1 | 5/2003 |
| WO | 03/070809 | A2 | 8/2003 |
| WO | 03/089992 | A1 | 10/2003 |

OTHER PUBLICATIONS

Hawley's Condensed Chemical Dictionary, 11th ed., 85-86.

"HD Micro Puts Out Positive Polyamide," Electronic News, Jun. 19, 2000.

Jaskot et al., Toxicological Sciences, 22(1): 103-112 (1994).

Yusuke Izumi et al., "Hydrosilyation of Carbonyl Compounds Catalyzed by Solid Acids and Bases," Tetrahedron Letters, vol. 32, No. 36, pp. 4744 (1991).

Lin et al. "Linewidth Control Using Anti-Reflective Coating for Optical Lithography", pp. 399-402.

Tanaka et al. "A New Photolighography Technique with Antireflective Coating on Resist: ARCOR", pp. 3900-3904.

Berg et al. "Antireflection coatings on metal layers for photolithographic purposes", p. 1212.

Brewer et al. "The Reduction of the Standing-Wave Effect in Positive Photoresists", pp. 184-186.

Resiser "Photoreactive Polymers—Multilayer Techniques and Plasma Processing", pp. 359-367.

Sheates "Photobleaching Chemistry of Polymers Containing Anthracese", pp. 332-348.

Sigma-Aldrich, Product Specification, Aiphazurine A—Die Content 40%, one page downloaded from Sigma-aldrich.com on Feb. 22, 2014, one page.

Pigment Green 7, 15832-14-5, Chemical Book obtained from Google search the page is http://www.chemicalbook.com/ChemicalProductProperty_EN_CB399460.htm and was downloaded on Feb. 20, 2014, 3 pages.

Xu et al, "Absorption and Exciton Emission by an Aggregated Cyanine Dye Occluded within Mesoporous SBA-15", J. Phys. Chem. B, vol. 106, 2002, pp. 1991-1994, published on line Jan. 29, 2002.

U.S. Appl. No. 90/008,360, Shipley Company, L.L.C.

* cited by examiner 2-hydroxy-4-(3-triethoxysilylpropoxy)-
diphenylketone
10

2-hydroxy-4-(3-trimethoxysilylpropoxy)-
diphenylketone
11

2-hydroxy-4-(3-tributoxysilylpropoxy)-
diphenylketone
12

2-hydroxy-4-(3-tripropoxysilylpropoxy)-
diphenylketone
13 rosolic acid
14 triethoxysilylpropyl-1,8-naphthalimide
15 trimethoxysilylpropyl-1,8-naphthalimide
16 tripropoxysilylpropyl-1,8-naphthalimide
17

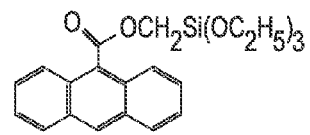
9-anthracene carboxy-methyl triethoxysilane (TESAC)
18

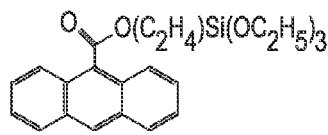
9-anthracene carboxy-ethyl triethoxysilane
19

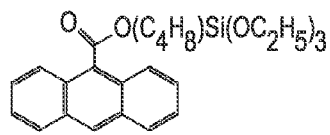
9-anthracene carboxy-butyl triethoxysilane
20

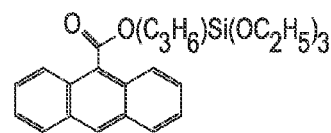
9-anthracene carboxy-propyl triethoxysilane
21

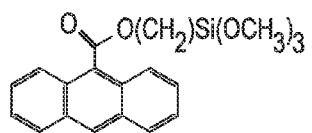
9-anthracene carboxy-methyl trimethoxysilane
22

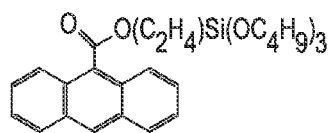
9-anthracene carboxy-ethyl tributoxysilane
23

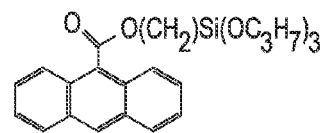
9-anthracene carboxy-methyl tripropoxysilane
24

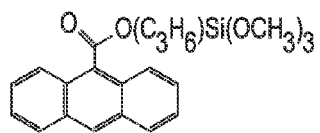
9-anthracene carboxy-propyl trimethoxysilane
25

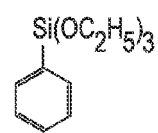
phenyltriethoxysilane
26

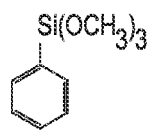
phenyltrimethoxysilane
27

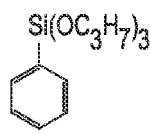
phenyltripropoxysilane
28

*FIG. 1C*

10-phenanthrene
carboxy-methyl triethoxysilane
29

10-phenanthrene
carboxy-ethyl triethoxysilane
30

10-phenanthrene carboxy-methyl
trimethoxysilane
31

10-phenanthrene
carboxy-propyl triethoxysilane
32

4-phenylazophenol
33

4-ethoxyphenylazobenzene-4-carboxy
methyl triethoxysilane
34

4-methoxyphenylazobenzene-4-carboxy
ethyl triethoxysilane
35

4-ethoxyphenylazobenzene-4-carboxy
propyl triethoxysilane
36

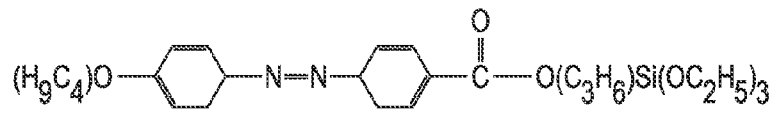
4-butoxyphenylazobenzene-4-carboxy
propyl triethoxysilane
37

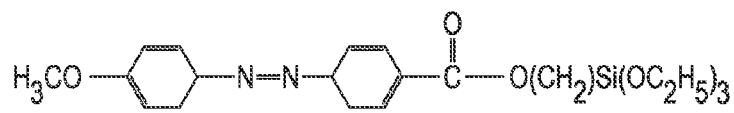
4-methoxyphenylazobenzene-4-carboxy
methyl triethoxysilane
38

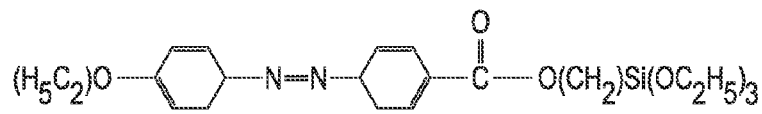
4-ethoxyphenylazobenzene-4-carboxy
methyl triethoxysilane
39

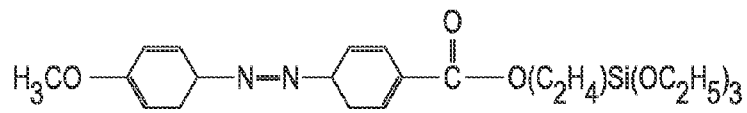
4-methoxyphenylazobenzene-4-carboxy
ethyl triethoxysilane
40

*FIG. 1E*

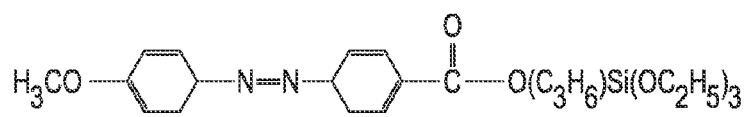
4-methoxyphenylazobenzene-4-carboxy
propyl triethoxysilane
41

*FIG. 1F*

ANTI-REFLECTIVE COATING FOR PHOTOLITHOGRAPHY AND METHODS OF PREPARATION THEREOF

CROSS-REFERENCE TO RELATED APPLICATIONS

This application is a national stage application of PCT/US02/36327, filed Nov. 12, 2002, which is a continuation application of U.S. patent application Ser. No. 10/001,143, filed Nov. 15, 2001, which issued as U.S. Pat. No. 6,824,879 on Nov. 30, 2004, which is a continuation-in-part application of U.S. patent application Ser. No. 09/698,883, filed Oct. 27, 2000, which issued as U.S. Pat. No. 6,365,765 on Apr. 2, 2002, which is a continuation-in-part application of U.S. patent application Ser. No. 09/491,166, filed Jan. 26, 2000, which issued as U.S. Pat. No. 6,506,497 on Jan. 15, 2003, which is a continuation-in-part application of U.S. patent application Ser. No. 09/330,248, filed Jun. 10, 1999, which issued as U.S. Pat. No. 6,268,457 on Jul. 31, 2001.

FIELD OF THE INVENTION

The present invention relates generally to anti-reflective coating materials and more specifically to anti-reflective layers for use in photolithography and methods of producing the materials.

BACKGROUND OF THE INVENTION

To meet the requirements for faster performance, the characteristic dimensions of features of integrated circuit devices have continued to be decreased. Manufacturing of devices with smaller feature sizes introduces new challenges in many of the processes conventionally used in semiconductor fabrication. One of the most important of these fabrication processes is photolithography.

It has long been recognized that linewidth variations in patterns produced by photolithography can result from optical interference from light reflecting off an underlying layer on a semiconductor wafer. Variations in photoresist thickness due to the topography of the underlying layer also induce linewidth variations. Anti-reflective coatings (ARC) applied under a photoresist layer have been used to prevent interference from reflection of the irradiating beam. In addition, anti-reflective coatings partially planarize the wafer topography, helping to improve linewidth variation over steps because the photoresist thickness is more uniform.

Organic polymer films, particularly those that absorb at the i-line (365 nm) and g-line (436 nm) wavelengths conventionally used to expose photoresists, and at the recently used 157 nm, 193 nm, 248 nmm wavelengths, have been employed or are being tested as anti-reflective coatings. However, the fact that the organic ARC's share many chemical properties with the organic photoresists can limit usable process sequences. Furthermore, ARC's, including both organic and inorganic ARC's, may intennix with photoresist layers. Organic and inorganic ARC's can mix with photoresist layers if they are not sufficiently baked or cured.

One solution to avoid intermixing is to introduce thermosetting binders as additional components of organic ARC's, as described for example in U.S. Pat. No. 5,693,691 to Flaim et al. Dyes may also be incorporated in organic ARC's, as well as, optionally, additional additives such as wetting agents, adhesions promoters, preservatives, and plasticizers, as described in U.S. Pat. No. 4,910,122 to Arnold et al. Another attempt to avoid intermixing is found in U.S. Pat. No. 6,268,108 issued to Iguchi et al. However, the compositions for forming antireflective coatings found in Iguchi must be irradiated with actinic rays in order to produce an acid, which in turn activates a crosslinking reaction. Even though these previous patents may address some of the issues with intermixing, the problem of the lack of 86- to 90-degree uniformity on the resist edges because of the coupled ARC layer has not been addressed in the prior art.

Photoresists and anti-reflective coatings can also influence one another to the extent that the chemical properties of the anti-reflective coating and/or the resist material can lead the resist to "fall over" once a pattern has been developed into the resist. In other words, the patterned resist sidewall can't maintain an approximate 90-degree angle with respect to the anti-reflective coating after photoresist developing. Instead the resist will take on a 120-degree or an 80-degree angle with respect to the anti-reflective coating. These imperfections are also an indication that photoresist materials and anti-reflective coatings are not necessarily chemically, physically or mechanically compatible.

Photoresists and anti-reflective coatings can also have substandard or unacceptable, etch selectivity or stripping selectivity. Poor etch selectivity and/or stripping selectivity can lead to low etch rates for the film. Poor etch selectivity can also lead to poor transfer of critical dimensions from the printing step(s) through the etch step(s). Attempts have been made at improving the etch rate by providing highly absorbing substances with substitution groups that can condense the silane compound to specific silane compounds, as seen in JP Patent Application No.: 2001-92122 published on Apr. 6, 2001. However, the etch selectivity obtained with these reactive compounds are not sufficient for most photoresists and anti-reflective coatings and require additional chemical reaction steps that may not be necessary.

In addition, photoresists and anti-reflective coatings often have difficulty with fill bias and voiding in via structures to the point where any planarization of the surface is severely compromised. Oftentimes, the two goals of increasing etch selectivity and minimizing fill bias and voiding directly conflict with one another, which is why it's important to review and understand the goals of each group of applications. Also, to sufficiently fill and planarize via arrays requires that a relatively thick anti-reflective coating exist. If the ARC coating is organic, such a thick coating will further compromise the accurate transfer of the as patterned critical dimension through the film stack.

A class of materials that can be used as an anti-reflective layer is spin-on-glass (SOG) compositions containing a dye. Yau et al., U.S. Pat. No. 4,587,138, disclose a dye such as basic yellow #11 mixed with a spin-on-glass in an amount approximately 1% by weight. Allman et al. U.S. Pat. No. 5,100,503 disclose a cross-linked polyorganosiloxane containing an inorganic dye such as $TiO_2$, $Cr_2O_7$, $MoO_4$, $MnO_4$, or $ScO_4$, and an adhesion promoter. Allman additionally teaches that the spin-on-glass compositions also serve as a planarizing layer. However, the spin-on-glass, dye combinations that have been disclosed to date are not optimal for exposure to the deep ultraviolet, particularly 248 and 193 nm, light sources that are coming into use to produce devices with small feature sizes. Furthermore, not all dyes can be readily incorporated into an arbitrary spin-on-glass composition. Also, even though these ARC's are chemically different than the previously mentioned organic ARC's, the coupled resist layers can still suffer from "falling over" after being developed, as based on the chemical, physical, and mechanical incompatibility of the ARC layer and the resist layer—which is a common problem when trying to couple resist materials and anti-reflective coatings.

In developing anti-reflective coatings that can a) absorb strongly and uniformly in the ultraviolet spectral region; b) keep the resist material from "falling over" and expanding outside or contracting inside of the intended resist line and c) be impervious to photoresist developers and methods of production of spin-on glass anti-reflective coatings, Baldwin et al developed several anti-reflective coatings that are superior to conventional anti-reflective coatings, including those materials and coatings found in U.S. Pat. No. 6,268,457 issued on Jul. 31, 2001; U.S. Pat. No. 6,365,765 issued on Apr. 2, 2002; U.S. Pat. No. 6,368,400 issued on Apr. 9, 2002; and U.S. Pat. Nos. 7,012,125, 6,824,879, 6,605,362 and 6,506,497; PCT Applications Serial Nos: PCT/US00/15772 filed on Jun. 8, 2000; WO 02/06402 filed on Jul. 12, 2001; PCT/US01/45306 filed on Nov. 15, 2001; Pending PCT Application filed on Oct. 31, 2002 (Serial No. not yet assigned); European Patent Applications Serial No. 00941275.0 filed on Jun. 6, 2000; and Ser. No. 01/958,953.0 filed on Jul. 17, 2001, which are all commonly assigned and incorporated herein by reference in their entirety. Honeywell Electronic Materials™ also produces ACCUSPIN® 720 that is a spin-on polymer which comprises a low dielectric constant methylphenylsilsesquioxane compound. The organic content of this product is approximately 47% and is formulated in a high flashpoint solvent, such as n-propoxypropanol. Its "n" and "k" properties at 193 nm wavelength are approximately 1.9 and 0.6 respectively. However, with all of these materials, it would be beneficial to be able to modify the materials, coatings and films described therein to improve etch selectivity and/or stripping selectivity and to minimize fill bias.

Therefore, an absorbing anti-reflective coating and lithography material that a) absorbs strongly and uniformly in the ultraviolet spectral region, b) can keep the resist material from "falling over" and expanding outside or contracting inside of the intended resist line, c) would be impervious to photoresist developers and methods of production of the SOG anti-reflective coating described; d) can satisfy any goals of increasing etch selectivity and/or stripping selectivity and e) can satisfy any goals of minimizing fill bias and voiding in via structures would be desirable to advance the production of layered materials, electronic components and semiconductor components.

SUMMARY OF THE INVENTION

An anti-reflective coating material for ultraviolet photolithography comprises at least one inorganic-based compound; at least one absorbing compound and at least one material modification agent. The at least one material modification agent may include any compound or composition that can modify the coating material to improve the photolithographic, compatibility or physical quality of the resulting film, such as by improving the etch selectivity and/or stripping selectivity or by minimizing the fill bias. The at least one material modification agent may comprise at least one porogen, at least one high-boiling solvent, at least one catalyst, at least one leveling agent, at least one pH tuning agent, at least one replacement solvent, at least one capping agent, at least one adhesion promoter, such as a resin-based material and/or a combination thereof that are incorporated into the inorganic-based material or compound. Resin-based adhesion promoters may comprise phenolic-containing resins, novolac resins, such as CRJ-406 or HRJ-11040 (both from Schenectady International, Inc.), an organic acrylate resin and/or a styrene resin. Other adhesion promoters may comprise polydimethylsiloxane materials, ethoxy or hydroxy-containing silane monomers, vinyl-containing silane monomers, acrylated silane monomers, or silyl hydrides.

The inorganic materials and inorganic-based compounds may comprise any compound, material or composition that comprises an inorganic moiety, such as those that are silicon-based, gallium-based, arsenic-based, boron-based or a combination of those inorganic elements and materials. Some contemplated inorganic materials may comprise spin-on glass materials, such as methylsiloxane, methylsilsesquioxane, phenylsiloxane, phenylsilsesquioxane, dimethylsiloxane, diphenylsiloxane, methylphenylsiloxane, methylphenylsilsesquioxane, silicate polymers and mixtures thereof. As used herein, the group known as "spin-on-glass materials" also comprises siloxane polymers, hydrogensiloxane polymers of the general formula $(H_{0-1.0}SiO_{1.5-2.0})_x$ and hydrogensilsesquioxane polymers, which have the formula $(HSiO_{1.5})_x$, where x is greater than about four. Also included are copolymers of hydrogensilsesquioxane and alkoxyhydridosiloxane or hydroxyhydridosiloxane. Spin-on-glass materials additionally include organosiloxane polymers, acrylic siloxane polymers, silsesquioxane-based polymers, derivatives of silici acid, organohydridosiloxane polymers of the general formula $(H_{0-1.0}SiO_{1.5-2.0})_n(R_{0-1.0}SiO_{1.5-2.0})_m$, and organohydridosilsesquioxane polymers of the general formula $(HSiO_{1.5})_n(RSiO_{1.5})_m$, where m is greater than zero and the sum of n and m is greater than about four and R is alkyl or aryl.

Absorbing compounds suitable for incorporation into the inorganic materials and inorganic-based compounds are strongly absorbing at wavelengths less than 375 nm or less than about 260 nm. In particular, suitable absorbing compounds are around wavelengths such as 248 nm, 193 nm, 157 nm or other ultraviolet wavelengths, such as 365 nm, that may be used in photolithography. The chromophores of suitable compounds typically have at least one benzene ring, and in those instances where there are two or more benzene rings, those rings may or may not be fused. Incorporatable absorbing compounds have an accessible reactive group attached to the chromophore, wherein the reactive groups can include hydroxyl groups, amine groups, carboxylic acid groups, and substituted silyl groups with silicon bonded to one, two, or three alkoxy group, acetoxy group, hydroxy or halogen atom substituents. The reactive groups may be directly bonded to the chromophore or the reactive groups may be attached to the chromophore through a hydrocarbon bridge, a carbonyl-containing group or an ester, ketone and/or oxygen linkage. The chromophores may also comprise silicon-based compounds or polymers similar to those polymers used to formulate the inorganic materials.

As mentioned, at least one material modification agent, such as at least one porogen, at least one high-boiling solvent, at least one catalyst, at least one pH tuning agent, at least one capping agent, at least one replacement solvent, at least one leveling agent, at least one adhesion promoter, such as a resin-based material and/or a combination thereof that are incorporated into the inorganic-based material or compound. Resin-based adhesion promoters may comprise phenolic-containing resins, novolac resins, such as CRJ-406 or HRJ-11040 (both from Schenectady International, Inc.), an organic acrylate resin and/or a styrene resin. Other adhesion promoters may comprise polydimethylsiloxane materials, ethoxy or hydroxy-containing silane monomers, vinyl-containing silane monomers, acrylated silane monomers, or silyl hydrides. The material modification agent, whether it is the porogen, the high-boiling solvent the catalyst, the leveling agent, the pH tuning agent, the one replacement solvent, the capping agent, the one adhesion promoter and/or a combination thereof is added in order to modify or adjust the anti-reflective coating material in order to meet the design goals of the component or layered material being manufactured. More specifically, the material modification agent will a) increase the etch selectivity and/or strip rate of the coating material; b) minimize the fill bias and/or voiding in the via structures; and/or c) reduce resist "fall over" once a pattern has been developed in the resist.

Absorbing and anti-reflective materials are conventionally synthesized from silane and silicon-based reactants such as triethoxysilane, tetraethoxysilane, methyltriethoxysilane, dimethyldiethoxysilane, tetramethoxysilane, methyltrimethoxysilane, trimethoxysilane, dimethyldimethoxysilane, methylphenyldimethoxysilane, methylphenyldiethoxysilane, phenyltriethoxysilane, phenyltrimethoxysilane, diphenyldiethoxysilane, diphenyldimethoxysilane, tetracetoxysilane, methyltriacetoxysilane, dimethyldiacetoxysilane, phenyltriacetoxysilane, and diphenyldiacetoxysilane. However, gallium, arsenic, germanium, boron and similar atoms and materials may also be used in conjunction with silicon atoms or as the sole atomic material to produce an absorbing and anti-reflective material. Halosilanes, particularly chlorosilanes are also used as silane reactants.

A method of making an absorbing anti-reflective composition includes combining at least one inorganic-based composition, at least one incorporatable absorbing compound, and at least one material modification agent that may comprise at least one porogen, at least one high-boiling solvent, at least one leveling agent, at least one catalyst, at least one pH tuning agent, at least one capping agent, at least one adhesion promoter and/or at least one replacement solvent, an acid/water mixture, such as a nitric acid/water mixture, and at least one solvent to form a reaction mixture and then either left to react at about room temperature in an exothermic fashion, warming to a temperature greater than 40° C. or refluxing the reaction mixture to form the absorbing composition. The anti-reflective composition formed is then diluted with at least one solvent to provide coating solutions that produce films of various thicknesses. The coating solutions may be applied by any suitable method or device, such as spin-on coating, dripping, rolling or dip coating. The material modification agent, such as the at least one porogen, at least one high-boiling solvent, at least one leveling agent, at least one capping agent, at least one catalyst, at least one pH tuning agent, at least one replacement solvent and/or a combination thereof may also and alternatively be added during the refluxing step or after the refluxing step.

In another method of making an absorbing anti-reflective composition, at least one inorganic-based composition or inorganic material, at least one incorporatable absorbing compound, at least one material modification agent, such as at least one porogen, at least one high-boiling solvent, at least one catalyst, at least one pH tuning agent, at least one leveling agent, at least one capping agent, at least one replacement solvent, at least one adhesion promoter and/or a combination thereof, and at least one additional solvent can be combined to form a reaction mixture. The reaction mixture is then either left to react at about room temperature in an exothermic fashion, warmed to a temperature about or greater than 40° C. or refluxed to form the absorbing anti-reflective composition. The anti-reflective composition formed is diluted with at least one solvent to provide coating solutions that can be applied to a surface by any suitable process to produce films of various thicknesses. The pH tuning agent in this method may either be a variation of the conventional acid/water mixture, in that a different acid may be added, less acid may be added, or more water may be added. Regardless of the pH tuning agent chosen, however, the basic principal still remains—which is that not only the pH is influenced by the pH tuning agent, but the chemical, mechanical and physical properties of the ARC are also influenced resulting in a more compatible resist/ARC couple.

In yet another aspect of the subject matter disclosed, an absorbing anti-reflective composition is produced comprising at least one silicon-based compound, at least one incorporatable absorbing compound that absorbs light at wavelengths less than about 375 nm, and at least one material modification agent, such as at least one porogen, at least one high-boiling solvent, at least one capping agent, at least one catalyst, at least one leveling agent, at least one pH tuning agent, at least one adhesion promoter and/or at least one replacement solvent. Further provided are absorbing spin-on compositions, wherein at least one of the silicon-based compounds or the incorporatable absorbing compound comprises at least one alkyl group, alkoxy group, acetoxy group, ketone group or azo group.

According to yet another aspect of the invention, compositions comprising the absorbing compounds of the chemical class comprising 9-anthracene carboxy-alkyl trialkoxysilane are provided. A method of synthesizing any one of the 9-anthracene carboxy-alkyl trialkoxysilanes includes combining 9-anthracene carboxylic acid, chloroalkyltrialkoxysilane, triethylamine, and a solvent to form a reaction mixture; refluxing the reaction mixture; cooling the refluxed reaction mixture to form a precipitate and a remaining solution; and filtering the remaining solution to produce liquid 9-anthracene carboxy-alkyl trialkoxysilane. Absorbing compounds may also be inorganic-based compounds.

Alternatively, yet another method of making an absorbing anti-reflective composition, requires at least one inorganic-based monomer to be added after the polymerization reaction has started in a "staged silane addition" manner. Any remaining silane monomers, the incorporatable absorbing compound that absorbs light at wavelengths less than about 375 nm, and the material modification agent that includes the at least one porogen, at least one high-boiling solvent, at least one catalyst, at least one pH tuning agent, at least one leveling agent, at least one adhesion promoter, at least one replacement solvent, at least one capping agent and/or a combination thereof is then added to the reaction mixture after polymerization.

BRIEF DESCRIPTION OF THE FIGURES

FIGS. 1a-1f show the chemical formulas of absorbing compounds incorporated into inorganic-based compositions and materials.

Table 1 shows a preliminary aging study using acetone-free and acetone/IPA-free mixtures. POR=control.

Table 2 shows reflux time, temperature, gas chromatography information, thickness, optical properties, ratios of water, ethanol, butanol and PGMEA, density, pH and total percent solids for 6 "runs" of contemplated materials.

Table 3 shows the heat ramp data for the 6 runs represented in Table 2.

Table 4 (parts 1 and 2) shows the summary of the via fill versus the thickness and pitch for several contemplated materials at different pH measurements versus other contemplated materials with high boiling point solvents at different pH measurements.

Table 5 shows the Parent QC results from water control experiments.

Table 6 shows the Child QC results from water control experiments.

Figure 31:
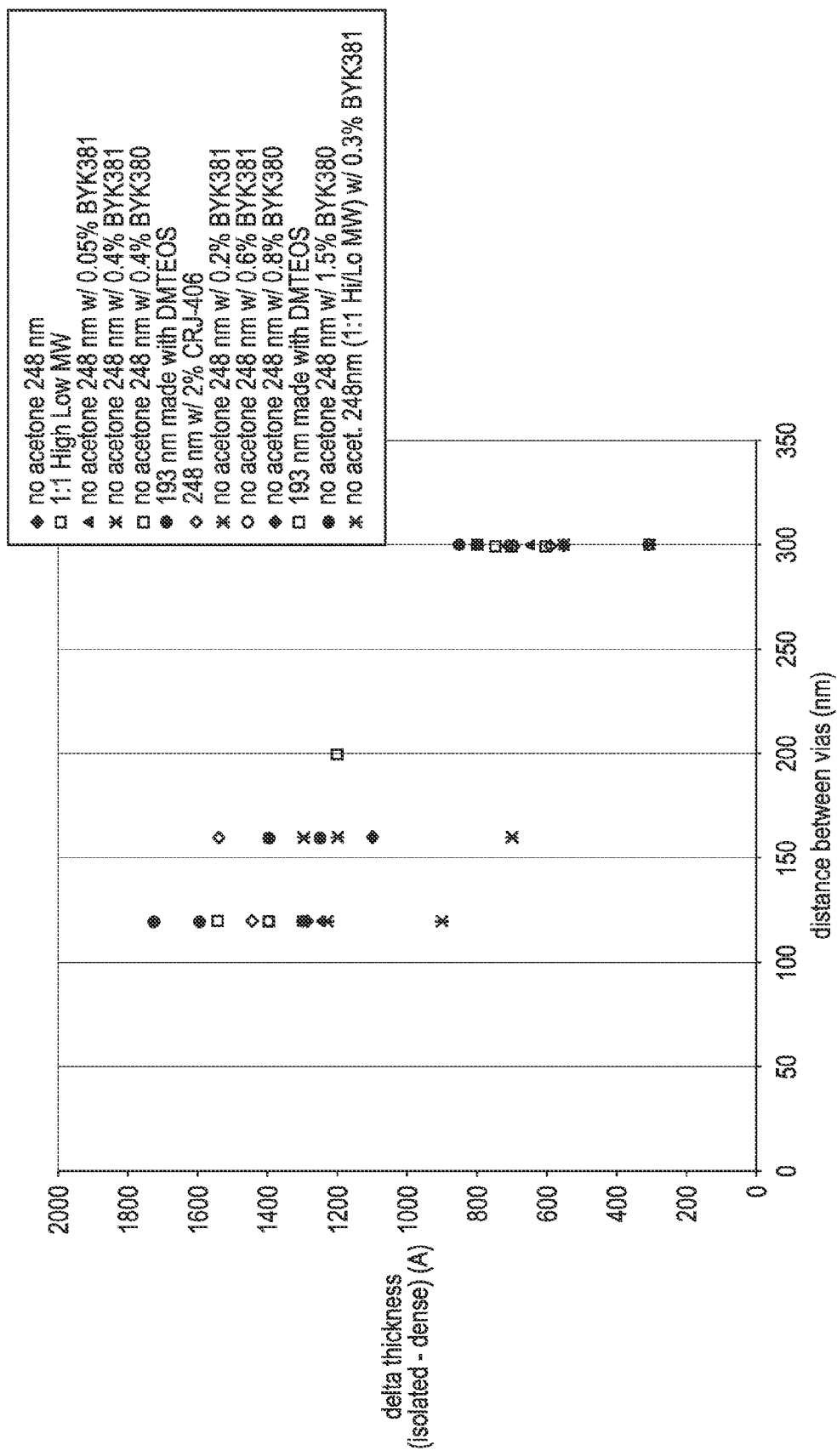
FIG. 31 graphically illustrates Delta Thickness (Angstroms) v. Distance Between Vias (nm) for several contemplated embodiments.

Table 7 shows the data collected for Example 4, which is graphically represented in FIG. 31.

Table 8 shows etch solution experiments conducted using contemplated compounds of the present subject matter.

DETAILED DESCRIPTION

An anti-reflective coating material for ultraviolet photolithography comprises at least one inorganic-based compound or inorganic material; at least one absorbing compound and at least one material modification agent. The at least one material modification agent may include any compound or composition that can modify the coating material to improve the photolithographic, compatibility and/or physical quality of the resulting film, such as by improving the etch selectivity and/or stripping selectivity or by minimizing the fill bias. The at least one material modification agent may comprise at least one porogen, at least one leveling agent, at least one high-boiling solvent, at least one catalyst, at least one pH tuning agent, at least one capping agent, at least one replacement solvent, at least one adhesion promoter, such as a resin-based material and/or a combination thereof that are incorporated into the inorganic-based material or compound. Resin-based adhesion promoters may comprise organic resis such as phenolic-containing resins, novolac resins, such as CRJ-406 or HRJ-11040 (both from Schenectady International, Inc.), and acrylate resin and/or a styrene resins. Other adhesion promoters may comprise polydimethylsiloxane materials, ethoxy or hydroxy-containing silane monomers, vinyl-containing silane monomers, acrylated silane monomers, or silyl hydrides.

The absorbing compositions are further diluted in appropriate solvents to form coating solutions and applied to various layers of materials in fabricating layered materials, electronic devices, and semiconductor devices. The coating solutions may be applied by any suitable method or process, including spinning onto a surface, dripping onto a surface, rolling onto a surface and/or a combination of any of these methods or processes. The absorbing anti-reflective coatings are designed to be readily integrated into existing layered material, electronic component or semiconductor fabrication processes. Some properties that facilitate integration include a) developer resistance, b) thermal stability during standard photoresist processing, and c) selective removal with respect to underlying layers.

Inorganic-Based Materials and Inorganic Compounds

Inorganic-based compounds and/or materials and/or contemplated spin-on inorganic-based compounds and/or materials, such as silicon-based, gallium-based, germanium-based, arsenic-based, boron-based compounds or combinations thereof are contemplated herein. Examples of silicon-based compounds comprise siloxane compounds, such as methylsiloxane, methylsilsesquioxane, phenylsiloxane, phenylsilsesquioxane, methylphenylsiloxane, methylphenylsilsesquioxane, silazane polymers, dimethylsiloxane, diphenylsiloxane, methylphenylsiloxane, silicate polymers, silsilic acid derivatives, and mixtures thereof. A contemplated silazane polymer is perhydrosilazane, which has a "transparent" polymer backbone where chromophores can be attached.

As used herein, inorganic-based materials, inorganic compounds and spin-on-glass materials also include siloxane polymers and blockpolymers, hydrogensiloxane polymers of the general formula $(H_{0-1.0}SiO_{1.5-2.0})_x$, hydrogensilsesquioxane polymers, which have the formula $(HSiO_{1.5})_x$, where x is greater than about four and derivatives of silsilic acid. Also included are copolymers of hydrogensilsesquioxane and an alkoxyhydridosiloxane or hydroxyhydridosiloxane. Materials contemplated herein additionally include organosiloxane polymers, acrylic siloxane polymers, silsesquioxane-based polymers, derivatives of silici acid, organohydridosiloxane polymers of the general formula $(H_{0-1.0}SiO_{1.5-2.0})_n(R_{0-1.0}SiO_{1.5-2.0})_m$, and organohydridosilsesquioxane polymers of the general formula $(HSiO_{1.5})_n(RSiO_{1.5})_m$, where m is greater than zero and the sum of n and m is greater than about four and R is alkyl or aryl. Some useful organohydridosiloxane polymers have the sum of n and m from about four to about 5000 where R is a $C_1$-$C_{20}$ alkyl group or a $C_6$-$C_{12}$ aryl group. The organohydridosiloxane and organohydridosilsesquioxane polymers are alternatively denoted spin-on-polymers. Some specific examples include alkylhydridosiloxanes, such as methylhydridosiloxanes, ethylhydridosiloxanes, propylhydridosiloxanes, t-butylhydridosiloxanes, phenylhydridosiloxanes; and alkylhydridosilsesquioxanes, such as methylhydridosilsesquioxanes, ethylhydridosilsesquioxanes, propylhydridosilsesquioxanes, t-butylhydridosilsequioxanes, phenylhydridosilsesquioxanes, and combinations thereof.

As used herein, the phrases "spin-on material", "spin-on organic material", "spin-on composition" and "spin-on inorganic composition" may be used interchangeable and refer to those solutions and compositions that can be spun-on to a substrate or surface. It is further contemplated that the phrase "spin-on-glass materials" refers to a subset of "spin-on inorganic materials", in that spin-on glass materials refer to those spin-on materials that comprise silicon-based compounds and/or polymers in whole or in part.

In some contemplated embodiments, specific organohydridosiloxane resins utilized herein have the following general formulas:

   Formula (1)

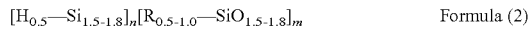   Formula (2)

   Formula (3)

   Formula (4)

wherein:
the sum of n and m, or the sum or x, y and z is from about 8 to about 5000, and m or y is selected such that carbon containing constituents are present in either an amount of less than about 40 percent (Low Organic Content=LOSP) or in an amount greater than about 40 percent (High Organic Content=HOSP); R is selected from substituted and unsubstituted, normal and branched alkyls (methyl, ethyl, butyl, propyl, pentyl), alkenyl groups (vinyl, allyl, isopropenyl), cycloalkyls, cycloalkenyl groups, aryls (phenyl groups, benzyl groups, naphthalenyl groups, anthracenyl groups and phenanthrenyl groups), and mixtures thereof; and wherein the specific mole percent of carbon containing substituents is a function of the ratio of the amounts of starting materials. In some LOSP embodiments, particularly favorable results are obtained with the mole percent of carbon containing substituents being in the range of between about 15 mole percent to about 25 mole percent. In some HOSP embodiments, favorable results are obtained with the mole percent of carbon containing substituents are in the range of between about 55 mole percent to about 75 mole percent.

Several contemplated polymers comprise a polymer backbone encompassing alternate silicon and oxygen atoms. In contrast with previously known organosiloxane resins, some of the polymers and inorganic-based compositions and materials utilized herein have essentially no hydroxyl or alkoxy groups bonded to backbone silicon atoms. Rather, each silicon atom, in addition to the aforementioned backbone oxygen atoms, is bonded only to hydrogen atoms and/or R groups as defined in Formulae 1, 2, 3 and 4. By attaching only hydrogen and/or R groups directly to backbone silicon atoms in the polymer, unwanted chain lengthening and cross-linking is avoided. And given, among other things, that unwanted chain lengthening and cross-linking is avoided in the resins of the present invention, the shelf life of these resin solutions is enhanced as compared to previously known organosiloxane resins. Furthermore, since silicon-carbon bonds are less reactive than silicon hydrogen bonds, the shelf life of the organohydridosiloxane resin solutions described herein is enhanced as compared to previously known hydridosiloxane resins.

Some of the contemplated compounds previously mentioned are taught by commonly assigned U.S. Pat. No. 6,143,855 and pending U.S. Ser. No. 10/078,919 filed Feb. 19, 2002 now U.S. Pat. No. 7,011,889; Honeywell International Inc.'s commercially available HOSP® product; nanoporous silica such as taught by commonly assigned U.S. Pat. No. 6,372,666; Honeywell International Inc.'s commercially available NANOGLASS®E product; organosilsesquioxanes taught by commonly assigned WO 01/29052; and fluorosilsesquioxanes taught by commonly assigned U.S. Pat. No. 6,440,550, incorporated herein in their entirety. Other contemplated compounds are described in the following issued patents and pending applications, which are herein incorporated by reference in their entirety: (PCT/US00/15772 filed Jun. 8, 2000; U.S. application Ser. No. 09/330,248 filed Jun. 10, 1999 now U.S. Pat. No. 6,268,457; U.S. application Ser. No. 09/491,166 filed Jun. 10, 1999; U.S. Pat. No. 6,365,765 issued on Apr. 2, 2002; U.S. Pat. No. 6,268,457 issued on Jul. 31, 2001; U.S. application Ser. No. 10/001,143 filed Nov. 10, 2001 now U.S. Pat. No. 6,824,879; U.S. application Ser. No. 09/491,166 filed Jan. 26, 2000 now U.S. Pat. No. 6,506,497; PCT/US00/00523 filed Jan. 7, 1999; U.S. Pat. No. 6,177,199 issued Jan. 23, 2001; U.S. Pat. No. 6,358,559 issued Mar. 19, 2002; U.S. Pat. No. 6,218,020 issued Apr. 17, 2001; U.S. Pat. No. 6,361,820 issued Mar. 26, 2002; U.S. Pat. No. 6,218,497 issued Apr. 17, 2001; U.S. Pat. No. 6,359,099 issued Mar. 19, 2002; U.S. Pat. No. 6,143,855 issued Nov. 7, 2000; U.S. application Ser. No. 09/611,528 filed Mar. 20, 1998 now U.S. Pat. No. 6,512,071; and U.S. Application Ser. No. 60/043,261). Silica compounds contemplated herein are those compounds found in: U.S. Pat.

Nos. 6,022,812; 6,037,275; 6,042,994; 6,048,804; 6,090,448; 6,126,733; 6,140,254; 6,204,202; 6,208,041; 6,318,124 and 6,319,855.

As used herein, the term "crosslinking" refers to a process in which at least two molecules, or two portions of a long molecule, are joined together by a chemical interaction. Such interactions may occur in many different ways including formation of a covalent bond, formation of hydrogen bonds, hydrophobic, hydrophilic, ionic or electrostatic interaction. Furthermore, molecular interaction may also be characterized by an at least temporary physical connection between a molecule and itself or between two or more molecules.

In some contemplated embodiments, the polymer backbone conformation is a cage configuration. Accordingly, there are only very low levels or reactive terminal moieties in the polymer resin given the cage conformation. A cage conformation of the polymer backbone also ensures that no unwanted chain lengthening polymerization will occur in solution, resulting in an extended shelf life. Each silicon atom of the polymer is bonded to at least three oxygen atoms. Moieties bonded to the polymer backbone include hydrogen and the organic groups described herein. As used herein, the term "backbone" refers to a contiguous chain of atoms or moieties forming a polymeric strand that are covalently bound such that removal of any of the atoms or moiety would result in interruption of the chain.

As used herein, the term "monomer" refers to any chemical compound that is capable of forming a covalent bond with itself or a chemically different compound in a repetitive manner. The repetitive bond formation between monomers may lead to a linear, branched, super-branched, or three-dimensional product. Furthermore, monomers may themselves comprise repetitive building blocks, and when polymerized the polymers formed from such monomers are then termed "blockpolymers". Monomers may belong to various chemical classes of molecules including organic, organometallic or inorganic molecules. The molecular weight of monomers may vary greatly between about 40 Dalton and 20000 Dalton. However, especially when monomers comprise repetitive building blocks, monomers may have even higher molecular weights. Monomers may also include additional groups, such as groups used for crosslinking.

In some contemplated embodiments, the molecular weight of the inorganic-based compound may be increased in order to change the solubility of the material. In turn, changing the solubility of the material helps to prevent voiding and increases the planarization ability of the material.

Absorbing Compound

Many naphthalene-, phenanthrene- and anthracene-based compounds have significant absorption at 248 nm and below. Benzene-based, equivalently termed here phenyl-based, compounds have significant absorption at wavelengths shorter than 200 nm. While these naphthalene-, anthracene-, phenanthrene- and phenyl-based compounds are frequently referred to as dyes, the term absorbing compound is used here because the absorptions of these compounds are not limited to wavelengths in the visible region of the spectrum. However, not all such absorbing compounds can be incorporated into inorganic-based materials for use as anti-reflective coating materials. Preferred absorbing compounds suitable for use have a definable absorption peak centered around wavelengths such as 248 nm, 193 nm, 157 nm or other ultraviolet wavelengths, such as 365 nm, that may be used in photolithography. It is contemplated that a preferred "definable absorption peak" is one that is at least 0.5 nm in width, wherein width is calculated by those methods commonly known in the art of photolithography. In more preferred embodiments, the definable absorption peak is at least 1 nm in width. In even more preferred embodiments, the definable absorption peak is at least 5 nm in width. In most preferred embodiments, the definable absorption peak is at least 10 nm in width.

The chromophores of suitable absorbing compounds typically have at least one benzene ring, and where there are two or more benzene rings, the rings may or may not be fused. Incorporatable absorbing compounds have an accessible reactive group attached to the chromophore, wherein the reactive groups include hydroxyl groups, amine groups, carboxylic acid groups, and substituted silyl groups with silicon bonded to one, two, or three "leaving groups," such as alkoxy groups, acetoxy groups or halogen atoms. Ethoxy or methoxy groups or chlorine atoms are frequently used as leaving groups. Preferable reactive groups comprise siliconalkoxy, silicondialkoxy and silicontrialkoxy groups, such as siliconethoxy, silicondiethoxy, silicontriethoxy, siliconmethoxy, silicondimethoxy, and silicontrimethoxy groups and halosilyl groups, such as chlorosilyl, dichlorosilyl, and trichlorosilyl groups, and acetoxy groups like methyltriacetoxysilane, tetraacetoxysilane.

The reactive groups may be directly bonded to the chromophore, as, for example, in phenyltriethoxysilane, or the reactive groups may be attached to the chromophore through an ester, a ketone and/or oxygen linkage or a hydrocarbon bridge, as, for example, in 9-anthracene carboxy-alkyl trialkoxysilane. The inclusion of silicontrialkoxy groups on chromophores has been found to be advantageous, especially for promoting stability of the absorbing SOG films. Other useful absorbing compounds are those compounds that contain an azo group, —N=N—, and an accessible reactive group, particularly those containing an azo group linking benzene rings, especially when absorption around 365 nm is desired for the particular application. Azo groups may be included as part of a straight-chain molecule, a cyclic molecule or a hybrid straight-chain/cyclic molecule.

The absorbing compounds may be incorporated interstitially in the inorganic-based material matrix. The absorbing compounds may also be chemically bonded to the inorganic-based material or polymer. In some contemplated embodiments, the incorporatable absorbing compounds form bonds with the inorganic-based material backbone or polymer backbone via the accessible reactive groups.

Absorbing compositions and materials may also comprise a silicon-based compound and an incorporatable absorbing compound that absorbs light at wavelengths less than about 375 nm. Further, it is contemplated that in other embodiments at least one of the silicon-based compound or the incorporatable absorbing compound comprises at least one alkyl group, alkoxy group, ketone group, acetoxy group, or azo group.

Examples of absorbing compounds suitable for use include those absorbing compounds that have a definable absorption peak around wavelengths less than about 375 nm, such as 365 nm, 248 nm, 193 nm and 157 nm, which include compounds such as anthraflavic acid (1), 9-anthracene carboxylic acid (2), 9-anthracene methanol (3), 9-anthracene ethanol (4), 9-anthracene propanol (5), 9-anthracene butanol (6), alizarin (7), quinizarin (8), primuline (9), 2-hydroxy-4-(3-triethoxysilylpropoxy)-diphenylketone (10), 2-hydroxy-4-(3-trimethoxysilylpropoxy)-diphenylketone (11), 2-hydroxy-4-(3-tributoxysilylpropoxy)-diphenylketone (12), 2-hydroxy-4-(3-tripropoxysilylpropoxy)-diphenylketone (13), rosolic acid (14), triethoxysilylpropyl-1,8-naphthalimide (15), trimethoxysilylpropyl-1,8-naphthalimide (16), tripropoxysilylpropyl-1,8-naphthalimide (17), 9-anthracene carboxy-methyl triethoxysilane (18), 9-anthracene carboxy-ethyl triethoxysilane (19), 9-anthracene carboxy-butyl triethoxysilane (20), 9-anthracene carboxy-propyl triethoxysilane (21), 9-anthracene carboxy-methyl trimethoxysilane (22), 9-anthracene carboxy-ethyl tributoxysilane (23), 9-anthracene carboxy-methyl tripropoxysilane (24), 9-anthracene carboxy-propyl trimethoxysilane (25), phenyltriethoxysilane (26), phenyltrimethoxysilane (27), phenyltripropoxysilane (28), 10-phenanthrene carboxy-methyl triethoxysilane (29), 10-phenanthrene carboxy-ethyl triethoxysilane (30), 10-phenanthrene carboxy-methyl trimethoxysilane (31), 10-phenanthrene carboxy-propyl triethoxysilane (32), 4-phenylazophenol, (33), 4-ethoxyphenylazobenzene-4-carboxy-methyl triethoxysilane (34), 4-methoxyphenylazobenzene-4-carboxy-ethyl triethoxysilane (35), 4-ethoxyphenylazobenzene-4-carboxy-propyl triethoxysilane (36), 4-butoxyphenylazobenzene-4-carboxy-propyl triethoxysilane (37), 4-methoxyphenylazobenzene-4-carboxy-methyl triethoxysilane (38), 4-ethoxyphenylazobenzene-4-carboxy-methyl triethoxysilane (39), 4-methoxyphenylazobenzene-4-carboxy-ethyl triethoxysilane (40), 4-triethoxysilane (41), and combinations, thereof. Chemical formulas of absorbing compounds 1-41 are illustrated in FIGS. 1a-1f. Advantageous results have been obtained, for example, with 9-anthracene carboxy-methyl triethoxysilane (18) with combinations of 9-anthracene methanol (3), 2-hydroxy-4-(3-triethoxysilylpropoxy)-diphenylketone (10), and rosolic acid (14), and with phenyltriethoxysilane (26). It should be appreciated, however, that this list of specific compounds is not an exhaustive list, and that contemplated and preferred compounds can be selected from the chemical compound classes that comprise these specific compounds. It should also be appreciated that suitable absorbing compounds may be organic-based or inorganic-based compounds. However, in some contemplated embodiments, the absorbing compound may be organic-based, as long as the ARC doesn't share the same chemical properties with the photoresist, which can limit the useable process sequences. However, the class of photoresist materials can be broad because the addition of a material modification agent, such as a pH tuning agent, makes it possible to match any photolithographic resist material with an antireflective coating and make them compatible with one another. Examples of some contemplated photolithographic resist materials comprise acrylate-based resist materials, epoxy-based chemically amplified resists, fluoropolymer resists (which are especially useful when contemplating a 157 nm absorption wavelength), poly(norbornene-maleic anhydride) alternating co-polymers, polystyrene systems and diazonaphthoquinone/novolac resists.

Absorbing compounds 1-25 and 29-41 are available commercially, for example, from Aldrich Chemical Company (Milwaukee, Wis.). 9-anthracene carboxy-alkyl trialkoxysilanes are synthesized using esterification methods, as described below in the Examples Section. Absorbing compound 26-28 is available commercially from Gelest, Inc. (Tullytown, Pa.). Examples of phenyl-based absorbing compounds in addition to absorbing compound (26-28), many of which are also commercially available from Gelest, Inc., include structures with silicon-based reactive groups attached to phenyl rings or to substituted phenyls, such as methylphenyl, chlorophenyl, and chloromethylphenyl. Specific phenyl-based absorbing compounds include phenyltrimethoxysilane, benzyltrichlorosilane, chloromethylphenyltrimethoxysilane, phenyltrifluorosilane, to name only a few examples. Diphenyl silanes including one or two "leaving groups," such as diphenylmethylethoxysilane, diphenyldiethoxysilane, and diphenyldichlorosilane, to again name only a few examples, are also suitable incorporatable absorbing compounds. Alkoxybenzoic acids may also be used as absorbing compounds, including methoxybenzoic acid.

A general method of synthesizing 9-anthracene carboxy-alkyl trialkoxysilane compounds comprises using 9-anthracene carboxylic acid and a chloromethyl trialkoxysilane compound as reactants. Specifically, a method of synthesizing 9-anthracene carboxy-methyl triethoxysilane (18) uses 9-anthracene carboxylic acid (2) and chloromethyl triethoxysilane as reactants. The reactants are combined with triethylamine and methylisobutylketone (MIBK), previously dried over 4 Å molecular sieves, to form a reaction mixture which is heated to reflux and refluxed for from approximately 6 to 10 hours. After reflux, the reaction mixture is cooled overnight leading to a large quantity of solid precipitate. The remaining solution is roto-evaporated, filtered through a silica gel column, and roto-evaporated a second time, to produce 9-anthracene carboxy-methyl triethoxysilane (18) as a dark amber oily liquid, which may be purified. This method is significant because it is suitable to use to produce any compound in the class of 9-anthracene carboxy-alkyl trialkoxysilanes, including 9-anthracene carboxy-ethyl triethoxysilane, 9-anthracene carboxy-propyl trimethoxysilane, and 9-anthracene carboxy-propyl triethoxysilane.

Porogens

At least one porogen may be added to the inorganic-based composition or inorganic material in order to increase etch selectivity and/or stripping selectivity of the inorganic-based material or composition. Without being bound to any particular theory, it is understood that in one aspect of the subject matter herein the addition of at least one porogen to the inorganic-based material will result in pores or voids being formed in the material, coating and/or film. The pores or voids may be formed as a result of structural rearrangement or loss of material such that a pore or void or increase in free volume is left behind. The pores or voids in the material, coating and/or film create additional surface area in the coating or film which ultimately increases the etch selectivity and/or stripping selectivity of the material, coating and/or film. In addition, the plasma etch rate of the film will increase with increasing porosity giving it better dry etch selectivity to photoresist. This dry etch selectivity is necessary to maintain proper transfer of the critical dimension from printing through etch. Adding at least one porogen increases both the dry and wet etch rate of the absorbing material, coating and/or film versus the porogen content without degrading the lithographic performance of the absorbing film's antireflective properties. The porogen's molecular weight can also be used to determine if the porogen is compatible with the inorganic-based compound's matrix in the material. This compatibility quotient is related to the solubility parameters of the inorganic-based compound's matrix. In an ideal case the porogen should match the solubility parameter of the matrix coating formulation before cure, so that when formulation molecular weights are known, appropriate molecular weights of the porogen can be determined by matching the solubility parameters with the matrix. Solubility parameters may be determined experimentally by relationships to the refractive index, dielectric constant, surface tension and intrinsic viscosity, or by calculation using group contribution methods or by molecular models of cohesive energy. (review ref Physical Properties of Polymers Handbook, Chapter 16 "Solubility Parmaters" Y. Du, Y. Xue, H. L. Frisch pp 227-239; James E. Mark Ed., 1996, American Institute of Physics, Woodbury, N.Y.)

In another aspect of the subject matter taught herein, the porogen may serve a dual purpose or multi-stage purpose. The porogen may be specifically chosen for a particular absorbing composition based on polarity and/or functional groups. Once the porogen is incorporated into the composition it will act effectively as a "magnet" to attract the stripping and/or etching solution to the porogen by utilizing a difference in polarity between the porogen or by utilizing the functional groups on the porogen. This attraction effect by the porogen can be activated in several ways. For example, there may be an exothermic reaction that takes place when the porogen is incorporated into the absorbing composition at room temperature, there may be an external energy and/or heat that needs to be added to "activate" the porogen or there may be a pressure differential applied to the absorbing composition that will "activate" the porogen. However, whether energy is added or not once the porogen is added, it should be understood that, in this embodiment, the porogen activated to the point where a complete pore or void is formed and the porogen remains until the lithography step is completed. Once the lithography step is completed, the absorbing composition comprising the porogen may be further heated so that the porogen can form a pore or void. At, this point, the pores or voids in the material, coating and/or film create additional surface area in the coating or film which ultimately increases the etch selectivity and/or stripping selectivity of the material, coating and/or film, as described in the earlier embodiments.

As used herein, the term "pore" includes voids and cells in a material and any other term meaning space occupied by gas in the material. The term "pore" may also include a differential in material density wherein the free volume has been increased ("porous nature" has been introduced). Appropriate gases include relatively pure gases and mixtures thereof.

Air, which is predominantly a mixture of $N_2$ and $O_2$ is commonly distributed in the pores, but pure gases such as nitrogen, helium, argon, $CO_2$ or CO are also contemplated. Pores are typically spherical but may alternatively or additionally include tubular, lamellar, discoidal, voids having other shapes, or a combination of the preceding shapes and may be open or closed. The term "porogen" as used herein may have a variety of mechanisms available to form the pore but in general is a material which upon removal leaves behind either a "pore" or a "void" or a material that can rearrange to create a "pore" or "void". In one embodiment, a porogen is a decomposable material that is radiation, thermally, chemically or moisture decomposable, degradable, depolymerizable or otherwise capable of breaking down and includes solid, liquid or gaseous material.

The decomposed porogen is removable from or can volatilize or diffuse through a partially or fully cross-linked matrix to create pores in a subsequently fully-cured matrix and thus, lower the matrix's dielectric constant and enhance the sacrificial properties. In another embodiment, the porogen might be a material, which does not decompose but can be dissolved out of the matrix leaving behind the "pore". In a third embodiment the porogen might be a material that does not decompose but is volatile enough to dissipate at specific elevated temperatures such as in the 250-350° C. range. Supercritical materials, such as $CO_2$, may be used to remove the porogen and decomposed porogen fragments. Preferably, for a thermally decomposable porogen, the porogen comprises a material having a decomposition temperature greater than the minimum crosslinking temperature of the material. Preferably, the present novel porogens have a degradation or decomposition temperature of up to about 300° C., and in some cases greater than about 300° C. Preferably, the degraded or decomposed porogens volatilize at a temperature greater than the minimum cross-linking temperature of the material with which the porogen is combined. Preferably, the degraded or decomposed porogens volatilize at a temperature between about 50° to about 450° C.

Although International Patent Publication WO 00/31183 teaches that a porogen may be added to thermosettable benzocyclobutene, polyarylene or thermosettable perfluoroethylene monomer to increase porosity thereof and thus, lower the dielectric constant of that resin, the reference teaches that a porogen that is known to function well with a first matrix system will not necessarily function well with another matrix system.

Known porogens, such as linear polymer, star polymers, cross-linked polymeric nanospheres, block copolymers, and hyperbranched polymers may be used in contemplated embodiments with the inorganic-based compounds and materials. Suitable linear polymers are polyethers, such as poly (ethylene oxide) and polypropylene oxide); polyacrylates such as poly(methylmethacrylate); aliphatic polycarbonates such as poly(propylene carbonate) and poly(ethylene carbonate); polyesters; polysulfones; polystyrene (including monomer units selected from halogenated styrene and hydroxy-substituted styrene); poly(.alpha.-methylstyrene); and other vinyl-based polymers. Useful polyester porogens include polycaprolactone; polyethylene terephthalate; poly(oxyadipoyloxy-1,4-phenylene); poly(oxyterephthaloyloxy-1,4-phenylene); poly(oxyadipoyloxy-1,6-hexamethylene); polyglycolide, polylactide (polylactic acid), polylactide-glycolide, polypyruvic acid, polycarbonate such as poly(hexamethylene carbonate)diol having a molecular weight from about 500 to about 2500; and polyether such as poly(bisphenol A-co-epichlorohydrin) having a molecular weight from about 300 to about 6500. Suitable crosslinked, insoluble nanospheres (prepared as nanoemulsions) are suitably comprised of polystyrene or poly(methylmethacrylate). Suitable block copolymers are poly-gylcolids, polylactic acid, poly (styrene-co-.alpha.-methylstyrene, poly(styrene-ethyleneoxide), poly(etherlactones), poly(estercarbonates) and poly (lactonelactide). Suitable hyperbranched polymers are hyperbranched polyester, e.g. hyperbranched poly(caprolactone), and polyethers such as polyethylene oxide and polypropylene oxide. Another useful porogen is ethylene glycol-poly(caprolactone). Useful polymer blocks include polyvinylpyridines, hydrogenated polyvinyl aromatics, polyacrylonitriles, polysiloxanes, polycaprolactams, polyurethanes, polydienes such as polybutadienes and polyisoprenes, polyvinyl chlorides, polyacetals and amine-capped alkylene oxides. Other useful thermoplastic materials include polyisoprenes, polytetrahydrofurans and polyethyloxazolines.

Other suitable porogens suitable for use in contemplated embodiments include polymers, preferably those which contain one or more reactive groups, such as hydroxyl or amino. Within these general parameters, a suitable polymer porogen for use in the compositions and methods disclosed herein is, e.g. a polyalkylene oxide, a monoether of a polyallylene oxide, a diether of a polyalkylene oxide, bisether of a polyalkylene oxide, an aliphatic polyester, an acrylic polymer, an acetal polymer, a poly(caprolactone), a poly(valeractone), a poly(methlymethoacrylate), a poly(vinylbutyral) and/or combinations thereof. When the porogen is a polyalkylene oxide monoether, one particular embodiment is a $C_1$ to about $C_6$ alkyl chain between oxygen atoms and a $C_1$ to about $C_6$ alkyl ether moiety, and wherein the alkyl chain is substituted or unsubstituted, e.g., polyethylene glycol monomethyl ether, polyethylene glycol dimethyl ether, or polypropylene glycol monomethyl ether.

Porogens comprising at least two fused aromatic rings wherein each of the fused aromatic rings has at least one alkyl substituent thereon and a bond exists between at least two of the alkyl substituents on adjacent aromatic rings may be used in contemplated embodiments. Preferred porogens include unfunctionalized polyacenaphthylene homopolymer, functionalized polyacenaphthylene homopolymer, the polyacenaphthylene copolymers described below, poly(2-vinyl-naphthalene) and vinyl anthracene, and blends with each other. Other useful porogens include adamantane, diamantane, fullerene and polynorbornene. Each of these porogens, including those listed above, may be blended with one another or other porogen material, such as polycaprolactone, polystyrene and polyester. Useful blends include unfunctionalized polyacenaphthylene homopolymer and polycaprolactone. The more preferred porogens are unfunctionalized polyacenaphthylene homopolymer, functionalized polyacenaphthylene homopolymer, polyacenaphthylene copolymer and polynorbornene.

Useful polyacenaphthylene homopolymers may have weight average molecular weights ranging from preferably about 300 to about 20,000; more preferably about 300 to about 10,000; and most preferably about 1000 to about 7000 and may be polymerized from acenaphthylene using different initiators such as 2,2'-azobisisobutyronitrile (AIBN); di-tert-butyl azodicarboxylate; di-phenylazodicarboxylate; 1,1'-azobis(cyclohezanecarbonitrile); benzoyl peroxide (BPO); t-butyl peroxide; and boron trifluoride diethyl etherate. The polyacenaphthylene homopolymer may have functional end groups such as triple bonds or double bonds to the chain end or cationic polymerization quenched with a double or triple bond alcohol, such as allyl alcohol, propargyl alcohol, butynol, butenol or hydroxyethylmethacrylate.

European Patent Publication 315453 teaches that silica and certain metal oxides may react with carbon to form volatile sub oxides and gaseous carbon oxide to form pores and teaches that sources of carbon include any suitable organic polymer including polyacenaphthylene. However, the reference does not teach or suggest that polyacenaphthylene is a porogen useful in non-metallic materials or in reducing the dielectric constant of a matrix or increasing the etch selectivity of an absorbing spin-on material.

Useful polyacenaphthylene copolymers may be linear polymers, star polymers or hyperbranched polymers. The comonomer may have a bulky side group that will result in copolymer conformation that is similar to that of polyacenaphthylene homopolymer or a nonbulky side group that will result in copolymer conformation that is dissimilar to that of polyacenaphthylene homopolymer. Comonomers having a bulky side group include vinyl pivalate; tert-butyl a crylate; styrene; .alpha.-methylstyrene; tert-butylstyrene; 2-vinylnaphthalene; 5-vinyl-2-norbornene; vinyl cyclohexane; vinyl cyclopentant; 9-vinylanthracene; 4-vinylbiphenyl; tetraphenylbutadiene; stilbene; tert-butylstilbene; and indene; and preferably vinyl pivalate. Hydridopolycarbosilane may be used as an additional co-monomer or copolymer component with acenaphthylene and at least one of the preceding comonomers. An example of a useful hydridopolycarbosilane has 10% or 75% allyl groups. Comonomers having a nonbulky side group include vinyl acetate, methyl acrylate, methyl methacrylate, and vinyl ether and preferably vinyl acetate.

When discussing pore generation, the term "degrade" refers to the breaking of covalent bonds. Such breaking of bonds may occur in numerous ways including heterolytic and homolytic breakage. The breaking of bonds need not be complete, i.e., not all breakable bonds must be cleaved. Furthermore, the breaking of bonds may occur in some bonds faster than in others. Ester bonds, for example, are generally less stable than amide bonds, and therefore, are cleaved at a faster rate. Breakage of bonds may also result in the release of fragments differing from one another, depending on the chemical composition of the degraded portion.

In a preferred embodiment of the pore generation process, for thermally degradable porogens, thermal energy is applied to the porogen containing material to substantially degrade or decompose the porogen into its starting components or monomers. As used herein, "substantially degrade" preferably means at least about 40 weight percent of the porogen degrades or decomposes. In more preferred embodiments, at least about 50 weight percent of the porogen degrades or decomposes, and in most preferred embodiments, at least about 80 weight percent of the porogen degrades or decomposes. In another embodiment, the porogen is dissolved out in either a separate process stage or in combination with other stages of process, such as during the photolithography development or during the actual wet stripping of the porogen containing material.

For the preferred embodiment, thermal energy is also applied to volatilize the substantially degraded or decomposed porogen out of the absorbing compound matrix. Preferably, the same thermal energy is used for both the degradation and volatilization steps. As the amount of volatilized degraded porogen increases, the resulting porosity of the anti-reflective material, coating and/or film increases.

Any suitable procedure or condition may be used to remove or at least partially remove the at least one porogen, including heat, dissolution in solvents, preferential etching, exposure to radiation, electromagnetic radiation, such as ultraviolet, x-ray, laser or infrared radiation; mechanical energy, such as sonication or physical pressure, or particle radiation, such as gamma ray, alpha particles, neutron beam or electron beam as taught by commonly assigned patent publication PCT/US96/08678 and U.S. Pat. Nos. 6,042,994; 6,080,526; 6,177,143; and 6,235,353, which are incorporated herein by reference in their entireties.

Solvents

At least one high-boiling solvent and/or at least one replacement solvent may be added to the anti-reflective material, coating and/or film. Without being bound to any particular theory, it is understood that the addition of a high-boiling solvent prevents voiding and improves planarization by making the film a "slow drying" film. As used herein, the phrase "high boiling solvents" means that the solvent volatilizes at a temperature at, near and/or preferably slightly above the drying and/or curing temperature of the material, coating and/or film. Preferred high boiling solvents include glycerol, dibutylether, dibutylglycerol, dimethyl sulfoxide (DMSO), dimethylformamide (DMF), N-methyl-pyrrolidone (NMP), dimethyl-acetamide (DMAc), high boiling aromatic-based solvents, petroleum ether, the carbitol family, and the glycol ether family. High boiling point solvents can also act as porogens, such as dipropyleneglycol or ethyl lactate.

At least one replacement solvent may also be used to replace acetone (or another low boiling solvent) in the original anti-reflective coating material in order to improve the planarization of the coating and/or film and decrease voiding. The replacement solvent doesn't necessarily need to be a high-boiling solvent, but must instead improve the planarization ability of the material, coating and/or film over the conventional solvent being used. The replacement solvent may comprise additional functional groups, such as —OH, that have been shown to lead to better strip properties at similar bake temperatures for the solvent being replaced. Without being bound to any particular theory, it is understood that the additional functional groups may cause the replacement solvent to act almost like a porogen would to attract the stripping chemistry into the composition. This porogen-like action may be based on hydrogen-bonding of the replacement solvent with the matrix or the stripping chemistry. Acetone may also be left out of the material, coating or film altogether depending on the improvement to the planarization ability of the material, coating and/or film. Typical replacement solvents comprise isopropylalcohol, propanol, butanol, ethanol, PGMEA, ethyl lactate and/or 2-heptanone.

To further describe the above-contemplated embodiment, the solvent may serve a dual purpose or multi-stage purpose. The solvent may be specifically chosen for a particular absorbing composition based on polarity and/or functional groups other than those characteristics needed by the solvent to blend with or solvate the absorbing composition. Once the solvent is incorporated into the composition it will act effectively as a "magnet" to attract the stripping and/or etching solution to the solvent by utilizing a difference in polarity between the solvent or by utilizing the functional groups on the solvent. This attraction effect by the solvent can be activated in several ways. For example, there may be an exothermic reaction that takes place when the solvent is incorporated into the absorbing composition at room temperature, there may be an external energy and/or heat that needs to be added to "activate" the solvent or there may be a pressure differential applied to the absorbing composition that will "activate" the solvent. However, whether energy is added or not once the solvent is added, it should be understood that, in this embodiment, the solvent is not heated or activated to the point where it is no longer present until the lithography step is completed. Once the lithography step is completed, the absorbing composition comprising the solvent may be further heated so that the solvent can evaporate. At this point, the coating or film can be further processed, as described in the earlier embodiments.

Typical solvents are also those solvents that are able to solvate the monomers and polymers contemplated herein to be used as absorbing compounds and inorganic-based compounds and materials. Contemplated solvents include any suitable pure or mixture of organic, organometallic or inorganic molecules that are volatilized at a desired temperature. The solvent may also comprise any suitable pure or mixture of polar and non-polar compounds. In preferred embodiments, the solvent comprises water, ethanol, propanol, acetone, toluene, ethers, cyclohexanone, butyrolactone, methylethylketone, methyl isobutylketone, N-methylpyrrolidone, polyethyleneglycolmethylether, mesitylene, ethyl lactate, PGMEA, anisole, and families of poly-ether solvents such as carbitols (which constitute a family of ethyleneglycol ethers capped by hydroxy, alkoxy or carboxy groups) and analogous propyleneglycol ethers.

Catalysts

In other contemplated embodiments, at least one catalyst may be added to the absorbing material in order to improve etch selectivity and/or stripping selectivity. Catalysts may also be added in conjunction with the porogen to expedite pore formation. As used herein, the term "catalyst" means any substance that affects the rate of the chemical reaction without itself being consumed or undergoing a chemical change. Catalysts may be inorganic, organic, or a complex of organic groups and metal halides. Catalysts may also be liquids, solids, gases or a combination thereof. Contemplated catalysts to add irrespective of the porogen addition may comprise acids, such as HNO3, HCl, lactic acid, acetic acid, oxalic acid, succinic acid, maleic acid and the like. Contemplated porogen depolymerization catalysts include simple acids as described above, superacid photosensitive molecules such as triarylsulfonium, triaryloxonium, or diaryliodonium salts, free radical generators typically used for vinyl-based, acryl-based (and other multiple-bond monomer-based polymers) polymerization and other free-radical based chemistries (such as benozyl peroxide, azobisisobutyronitrile).

Adhesion Promoters

The phrase "adhesion promoter" as used herein means any component that when used with the thermally degradable polymer, improves the adhesion thereof to substrates compared with thermally degradable polymers. Preferably the at least one adhesion promoter is used with the thermally degradable polymer. The adhesion promoter may be a co-monomer reacted with the thermally degradable polymer precursor or an additive to the thermally degradable polymer precursor. Examples of useful adhesion promoters are disclosed in commonly assigned pending U.S. application Ser. No. 158,513 filed May 30, 2002 now U.S. Pat. No. 7,141,188 incorporated herein in its entirety.

Adhesion promoters contemplated herein may comprise compounds having at least bifunctionality wherein the bifunctionality may be the same or different and at least one of said first functionality and said second functionality is selected from the group consisting of Si-containing groups; N-containing groups; C bonded to 0-containing groups; hydroxyl groups; and C double bonded to C-containing groups. The phrase "compound having at least bifunctionality" as used herein means any compound having at least two functional groups capable of interacting or reacting, or forming bonds as follows. The functional groups may react in numerous ways including addition reactions, nucleophilic and electrophilic substitutions or eliminations, radical reactions, etc. Further alternative reactions may also include the formation of non-covalent bonds, such as Van der Waals, electrostatic bonds, ionic bonds, and hydrogen bonds.

In some embodiments of the at least one adhesion promoter, preferably at least one of the first functionality and the second functionality is selected from Si-containing groups; N-containing groups; C bonded to O-containing groups; hydroxyl groups; and C double bonded to C-containing groups. Preferably, the Si-containing groups are selected from Si—H, Si—O, and Si—N; the N-containing groups are selected from such as C—$NH_2$ or other secondary and tertiary amines, imines, amides, and imides; the C bonded to O-containing groups are selected from =CO, carbonyl groups such as ketones and aldehydes, esters, —COOH, alkoxyls having 1 to 5 carbon atoms, ethers, glycidyl ethers; and epoxies; the hydroxyl group is phenol; and the C double bonded to C-containing groups are selected from allyl and vinyl groups. For semiconductor applications, the more preferred functional groups include the Si-containing groups; C bonded to O-containing groups; hydroxyl groups; and vinyl groups.

Contemplated adhesion promoters may also comprise an organic resin-based material that further comprises phenolic-containing resins, novolac resins, such as CRJ-406 or HRJ-11040 (both from Schenectady International, Inc.), organic acrylate and/or a styrene, resins. Other adhesion promoters may comprise polydimethylsiloxane materials, ethoxy or hydroxy-containing silane monomers, vinyl-containing silane monomers, acrylated silane monomers, or silyl hydrides.

An example of a contemplated adhesion promoter having Si-containing groups is silanes of the Formula I: $(R_{14})_k(R_{15})_l Si(R_{16})_m(R_{17})_n$ wherein $R_{14}$, $R_{15}$, $R_{16}$, and $R_{17}$ each independently represents hydrogen, hydroxyl, unsaturated or saturated alkyl, substituted or unsubstituted alkyl where the substituent is amino or epoxy, saturated or unsaturated alkoxyl, unsaturated or saturated carboxylic acid radical, or aryl; at least two of $R_{14}$, $R_{15}$, $R_{16}$, and $R_{17}$ represent hydrogen, hydroxyl, saturated or unsaturated alkoxyl, unsaturated alkyl, or unsaturated carboxylic acid radical; and k+l+m+n≤4. Examples include vinylsilanes such as $H_2C\!\!=\!\!CHSi(CH_3)_2H$ and $H_2C\!\!=\!\!CHSi(R_{18})_3$ where $R_{18}$ is $CH_3O$, $C_2H_5O$, AcO, $H_2C\!\!=\!\!CH$, or $H_2C\!\!=\!\!C(CH_3)O\!\!-\!\!$, or vinylphenylmethylsilane; allylsilanes of the formula $H_2C\!\!=\!\!CHCH_2\!\!-\!\!Si(OC_2H_5)_3$ and $H_2C\!\!=\!\!CHCH_2\!\!-\!\!Si(H)(OCH_3)_2$; glycidoxypropylsilanes such as (3-glycidoxypropyl) methyldiethoxysilane and (3-glycidoxypropyl) trimethoxysilane; methacryloxypropylsilanes of the formula $H_2C\!\!=\!\!(CH_3)COO(CH_2)_3\!\!-\!\!Si(OR_{19})_3$ where $R_{19}$ is an alkyl, preferably methyl or ethyl; aminopropylsilane derivatives including $H_2N(CH_2)_3Si(OCH_2CH_3)_3$, $H_2N(CH_2)_3Si(OH)_3$, or $H_2N(CH_2)_3OC(CH_3)_2CH\!\!=\!\!CHSi(OCH_3)_3$. The aforementioned silanes are commercially available from Gelest.

An example of a preferred adhesion promoter having C bonded to O-containing groups is glycidyl ethers including but not limited to 1,1,1-tris-(hydroxyphenyl)ethane tri-glycidyl ether which is commercially available from TriQuest.

An example of a preferred adhesion promoter having C bonded to O-containing groups is esters of unsaturated carboxylic acids containing at least one carboxylic acid group. Examples include trifunctional methacrylate ester, trifunctional acrylate ester, trimethylolpropane triacrylate, dipentaerythritol pentaacrylate, and glycidyl methacrylate. The foregoing are all commercially available from Sartomer.

An example of a preferred adhesion promoter having vinyl groups is vinyl cyclic pyridine oligomers or polymers wherein the cyclic group is pyridine, aromatic, or heteroaromatic. Useful examples include but not limited to 2-vinylpyridine and 4-vinylpyridine, commercially available from Reilly; vinyl aromatics; and vinyl heteroaromatics including but not limited to vinyl quinoline, vinyl carbazole, vinyl imidazole, and vinyl oxazole.

An example of a preferred adhesion promoter having Si-containing groups is the polycarbosilane disclosed in commonly assigned copending allowed U.S. patent application Ser. No. 09/471,299 filed Dec. 23, 1999 now U.S. Pat. No. 6,761,975 incorporated herein by reference in its entirety. The polycarbosilane is that shown in Formula II:

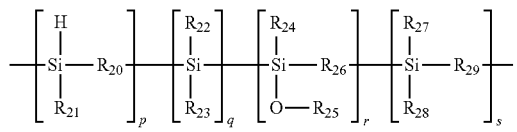

in which $R_{20}$, $R_{26}$, and $R_{29}$ each independently represents substituted or unsubstituted alkylene, cycloalkylene, vinylene, allylene, or arylene; $R_{21}$, $R_{22}$, $R_{23}$, $R_{24}$, $R_{27}$, and $R_{28}$ each independently represents hydrogen atom or organo group comprising alkyl, alkylene, vinyl, cycloalkyl, allyl, or aryl and may be linear or branched; $R_{25}$ represents organosilicon, silanyl, siloxyl, or organo group; and p, q, r, and s satisfy the conditions of [4≤p+q+r+s≤100,000], and q and r and s may collectively or independently be zero. The organo groups may contain up to 18 carbon atoms but generally contain from about 1 to about 10 carbon atoms. Useful alkyl groups include $-\!\!CH_2\!\!-\!\!$ and $-\!\!(CH_2)_t\!\!-\!\!$ where t≥1.

Contemplated polycarbosilanes include dihydridopolycarbosilanes in which $R_{20}$ is a substituted or unsubstituted alkylene or phenyl, $R_{21}$ group is a hydrogen atom and there are no appendent radicals in the polycarbosilane chain; that is, q, r, and s are all zero. Another preferred group of polycarbosilanes are those in which the $R_{21}$, $R_{22}$, $R_{23}$, $R_{24}$, $R_{25}$, and $R_{28}$ groups of Formula II are substituted or unsubstituted alkenyl groups having from 2 to 10 carbon atoms. The alkenyl group may be ethenyl, propenyl, allyl, butenyl or any other unsaturated organic backbone radical having up to 10 carbon atoms. The alkenyl group, may be dienyl in nature and includes unsaturated alkenyl radicals appended or substituted on an otherwise alkyl or unsaturated organic polymer backbone. Examples of these preferred polycarbosilanes include dihydrido or alkenyl substituted polycarbosilanes such as polydihydridocarbosilane, polyallylhydrididocarbosilane and random copolymers of polydihydridocarbosilane and polyallylhydridocarbosilane.

In the more preferred polycarbosilanes, the $R_{21}$ group of Formula II is a hydrogen atom and $R_{21}$ is methylene and the appendent radicals q, r, and s are zero. Other preferred polycarbosilane compounds of the invention are polycarbosilanes of Formula II in which $R_{21}$ and $R_{27}$ are hydrogen, $R_{20}$ and $R_{29}$ are methylene, and $R_{28}$ is an alkenyl, and appendent radicals q and r are zero. The polycarbosilanes may be prepared from well known prior art processes or provided by manufacturers of polycarbosilane compositions. In the most preferred polycarbosilanes, the $R_{21}$ group of Formula II is a hydrogen atom; $R_{24}$ is $-\!\!CH_2\!\!-\!\!$; q, r, and s are zero and p is from 5 to 25. These most preferred polycarbosilanes may be obtained from Starfire Systems, Inc. Specific examples of these most preferred polycarbosilanes follow:

| Polycarbosilane | Weight Average Molecular Weight (Mw) | Polydispersity | Peak Molecular Weight (MP) |
|---|---|---|---|
| 1 | 400-1,400 | 2-2.5 | 330-500 |
| 2 | 330 | 1.14 | 320 |
| 3 (with 10% allyl groups) | 10,000-14,000 | 10.4-16 | 1160 |
| 4 (with 75% allyl groups) | 2,400 | 3.7 | 410 |

As can be observed in Formula II, the polycarbosilanes utilized may contain oxidized radicals in the form of siloxyl groups when r>0. Accordingly, $R_{25}$ represents organosilicon, silanyl, siloxyl, or organo group when r>0. It is to be appreciated that the oxidized versions of the polycarbosilanes (r>0) operate very effectively in, and are well within the purview of the present invention. As is equally apparent, r can be zero independently of p, q, and s the only conditions being that the radicals p, q, r, and s of the Formula II polycarbosilanes must satisfy the conditions of [4<p+q+r+s<100,000], and q and r can collectively or independently be zero.

The polycarbosilane may be produced from starting materials that are presently commercially available from many manufacturers and by using conventional polymerization processes. As an example of synthesis of the polycarbosilanes, the starting materials may be produced from common organo silane compounds or from polysilane as a starting material by heating an admixture of polysilane with polyborosiloxane in an inert atmosphere to thereby produce the corresponding polymer or by heating an admixture of polysilane with a low molecular weight carbosilane in an inert atmosphere to thereby produce the corresponding polymer or by heating an admixture of polysilane with a low molecular carbosilane in an inert atmosphere and in the presence of a catalyst such as polyborodiphenylsiloxane to thereby produce the corresponding polymer. Polycarbosilanes may also be synthesized by Grignard Reaction reported in U.S. Pat. No. 5,153,295 hereby incorporated by reference in its entirety.

An example of a preferred adhesion promoter having hydroxyl groups is phenol-formaldehyde resins or oligomers of the Formula III: $-[R_{30}C_6H_2(OH)(R_{31})]_u-$ where $R_{30}$ is substituted or unsubstituted alkylene, cycloalkylene, vinyl, allyl, or aryl; $R_{31}$ is alkyl, allylene, vinylene, cycloalkylene, allylene, or aryl; and u=3-100. Examples of useful alkyl groups include $-CH_2-$ and $-(CH_2)_v-$ where v>1. A particularly useful phenol-formaldehyde resin oligomer has a molecular weight of 1500 and is commercially available from Schenectady International Inc.

The present adhesion promoter is added in small, effective amounts preferably from about 0.01% up to about 15% and more preferably from about 0.05% to about 7% based on the weight of the present thermally degradable polymer.

The adhesion promoter may also serve a dual purpose or multi-stage purpose. The adhesion promoter may be specifically chosen for a particular absorbing composition based on polarity and/or functional groups other than those characteristics needed by the adhesion promoter in order to promote adhesion in the absorbing composition. Once the adhesion promoter is incorporated into the composition it will act effectively as a "magnet" to attract the stripping and/or etching solution to the adhesion promoter by utilizing a difference in polarity between the adhesion promoter or by utilizing the functional groups on the adhesion promoter. This attraction effect by the adhesion promoter can be activated in several ways. For example, there may be an exothermic reaction that takes place when the adhesion promoter is incorporated into the absorbing composition at room temperature, there may be an external energy and/or heat that needs to be added to "activate" the adhesion promoter, there may not need to be any energy added to the composition depending on the chemical composition of the adhesion promoter, or there may be a pressure differential applied to the absorbing composition that will "activate" the adhesion promoter. However, whether energy is added or not once the adhesion promoter is added, it should be understood that, in this embodiment, the adhesion promoter is not heated or activated to the point where it is chemically modified or broken down until the lithography step is completed. Once the lithography step is completed, the absorbing composition comprising the adhesion promoter may be left unheated or further heated so that the adhesion promoter's chemical composition can change to make it further compatible with the composition. At this point, the coating or film can be further processed, as described in the earlier embodiments.

pH Tuning Agent

The pH tuning agent is a compound, material or solution that is added to the mixture of the inorganic-based material and the absorbing compound in order to "tune" or adjust the pH of the final absorbing composition so that it is compatible or more compatible with any chosen resist material, including those with absorption peaks around 365 nm, 248 nm, 193 nm and 157 nm. pH tuning agents contemplated herein are those also found in commonly assigned PCT Application Serial No.: PCT/US01/45306 filed on Nov. 15, 2001.

It should be appreciated, however, that the pH tuning agent not only adjusts the pH of the absorbing material, coating and/or film, but it also influences the chemical performance and characteristics, mechanical performance and structural makeup of the absorbing material, coating and/or film that is part of the layered material, electronic component or semiconductor component, such that the absorbing material, coating and/or film is more compatible with the resist material that is coupled to it. More specifically, the pH tuning agent strongly influences the polymeric characteristics, the structural makeup and the spatial orientation that results in optimized film architecture by increasing the surface properties of the anti-reflective coating for optimal resist performance. In other words, a pH tuning agent that merely adjusts the pH of the spin-on material without influencing the mechanical properties and structural makeup of the absorbing material, coating and/or film or the coupled resist material is not contemplated herein.

Contemplated pH tuning agents must perform two separate and sometimes related functions: a) to influence the pH of the composition to which it is being added; and b) to influence the mechanical performance and/or structural makeup of the absorbing material, coating and/or film, which can also been stated as strongly influencing the polymeric characteristics, the structural makeup and the spatial orientation that results in enhancing the surface properties of the anti-reflective coating for optimal resist performance.

Contemplated pH tuning agents are partly designed to influence the pH of the composition to which it is added. The class of potential pH tuning agents comprises a) any suitable acidic or basic solution, compound, and/or component and/or b) any suitable strength or concentration of an acidic or basic solution, compound and/or component. This compilation of suitable pH "influencers" is the larger set of compound from which the ultimate pH tuning agent is chosen, because the pH "influencer" must also be able to influence the mechanical performance and/or structural makeup of the absorbing material, coating and/or film while also making the absorbing material, coating and/or film compatible or more compatible. By this, for example, it is meant that the chosen pH tuning agent is also designed to match the solubility parameter, the molecular weight, the melting point or some other physical characteristic of the spin-on material and organic absorbing compound mixture. In other words, the pH tuning agent and the mixture of inorganic matrix material and absorbing compound cannot be physically incompatible, depending on the desirable physical characteristic, even if the pH tuning agent performs its first function of influencing the pH of the mixture. In preferred embodiments, the desirable physical characteristic is the solubility parameter or the molecular weight. In more preferred embodiments, the desirable physical characteristic is the solubility parameter.

It is also contemplated that the pH tuning agent will also mechanically and structurally influence the performance and characteristics of the resist material/ARC couple. For example, a pH tuned absorbing material, coating and/or film is applied to a substrate or layered material, and then a resist material is applied to the absorbing material, coating and/or film. When the resist material is exposed and subsequently developed will have an 85-90 degree angle with respect to the absorbing material, coating and/or film (a development line). In other words, the resist material will not "fall over" onto the absorbing, material, coating and/or film, but instead will have a useful development line. In the case where the absorbing material, coating and/or film is not pH tuned, the resist material may "fall over" onto the absorbing material, coating and/or film after etching, which obviously leads a defective resist material and/or to a defective layered material. It is in this instance where the pH tuned absorbing material, coating and/or film influences the mechanical and structural integrity of the absorbing material, coating and/or film and the compatibility of the resist material/ARC couple. As used herein, the terms "coupled" or "couple" mean that the two materials or compositions are juxtaposed on top of one another to the point where the two materials are physically, mechanically and/or chemically bonded to one another.

Examples of some suitable pH tuning agents comprise various molar concentrations of the class of amines, such as γ-aminoalkyltrialkoxysilanes, specifically γ-aminopropyltriethoxysilanes (APTF or APTEOS); water; oxides and alkoxides, such as sodium alkoxides, potassium alkoxides, potassium hydroxide; hydrogen halides, such as hydrogen bromide, hydrochloric acid; acetic acid; sulfuric acid, lactic acid, nitric acid; TMAH; propylene glycol methyl ether acetate (PGMEA); amine-based oligomers, including those oligomers with inorganic atoms such as silicon, and combinations thereof. Contemplated molar concentrations of the pH tuning agent include pure, 10 Molar, 1.0 Molar, 0.1 Molar and 0.01 Molar concentrations, depending on the pH agent chosen for the resist material.

In yet other embodiments, increased pH solutions result in films that exhibit characteristics of being denser than films cast from non-pH tuned solutions. Wet strip tests were used to determine extent of densification. The effect ARC density as on the photoresist process is follows. If the ARC is not dense enough too much photogenerated acid within the resist (generated during exposure of the photoresist to UV radiation) diffuses across the photoresist—ARC boundary resulting in a decrease in the local concentration of photoacid resulting in a degradation of the local acid catalyzed reactions resulting in an under reacted resist which can lead to resist footing (positive tone resist). Opposite to this, if the ARC layer is too dense then an accumulation of local photo generated acid occurs at the interface resulting in an increase in the local acid catalyzed reactions resulting in an over reacted resist which can lead to resist undercut (positive tone resist).

In another embodiment the pH tuning agent may be found on a solid-support material (such as a propylamine-attached silica, amine-based polymers such as melamine, or other amine-attached materials that are insoluble in the process solvent conditions) that is physically separated from the formulation. For instance the pH may be tuned while the formulation is passed thru the solid support material or the pH may be tuned in a slurry with the solid support material, which is later filtered.

The pH tuning agent may also serve a dual purpose or multi-stage purpose. The pH tuning agent may be specifically chosen for a particular absorbing composition based on polarity and/or functional groups other than those characteristics needed by the pH tuning agent in order to "tune" the absorbing composition. Once the pH tuning agent is incorporated into the composition it will act effectively as a "magnet" to attract the stripping and/or etching solution to the pH tuning agent by utilizing a difference in polarity between the pH tuning agent or by utilizing the functional groups on the pH tuning agent. This attraction effect by the pH tuning agent can be activated in several ways. For example, there may be an exothermic reaction that takes place when the pH tuning agent is incorporated into the absorbing composition at room temperature, there may be an external energy and/or heat that needs to be added to "activate" the pH tuning agent, there may not need to be any energy added to the composition depending on the chemical composition of the pH tuning agent, or there may be a pressure differential applied to the absorbing composition that will "activate" the pH tuning agent. However, whether energy is added or not once the pH tuning agent is added, it should be understood that, in this embodiment, the pH tuning agent is not heated or activated to the point where it is chemically modified or broken down until the lithography step is completed. Once the lithography step is completed, the absorbing composition comprising the pH tuning agent may be left unheated or further heated so that the pH tuning agent's chemical composition can change to make it further compatible with the composition. At this point, the coating or film can be further processed, as described in the earlier embodiments.

Capping Agent

At least one capping agent may also be added to the absorbing composition as a material modification agent. As used herein, the term "capping agent" means a terminating monomer that effectively controls the molecular weight of a particular polymer by "capping" the end of the polymer. In contemplated embodiments, the capping agent comprises a silane monomer with only one reactive group, such as an ethoxy reactive group, with the rest of the monomer being methyl groups. Furthermore, the silane monomer is added late in the parent reaction that forms the absorbing composition. Any suitable terminating monomer may be used in this application, including silane compositions such as TMEOS.

The capping agent may also serve a dual purpose or multi-stage purpose. The capping agent may be specifically chosen for a particular absorbing composition based on polarity and/or functional groups other than those characteristics needed by the capping agent in order to cap all or part of the constituents of the absorbing composition. By controlling molecular weight and the polarity of the functional groups present, the capping agent may also function to adjust solubility parameter of the matrix material which improves it's solubility compatibility throughout the process. Once the capping agent is incorporated into the composition it will act effectively as a "magnet" to attract the stripping and/or etching solution to the capping agent or the compound comprising the capping agent by utilizing a difference in polarity between the capping agent or by utilizing the functional groups on the capping agent. This attraction effect by the capping agent can be activated in several ways. For example, there may be an exothermic reaction that takes place when the capping agent is incorporated into the absorbing composition at room temperature, there may be an external energy and/or heat that needs to be added to "activate" the capping agent, there may not need to be any energy added to the composition depending on the chemical composition of the capping agent, or there may be a pressure differential applied to the absorbing composition that will "activate" the capping agent. However, whether energy is added or not once the capping agent is added, it should be understood that, in this embodiment, the capping agent is not heated or activated to the point where it is chemically modified or broken down until the lithography step is completed. Once the lithography step is completed, the absorbing composition comprising the capping agent may be left unheated or further heated so that the capping agent's chemical composition can change to make it further compatible with the composition. At this point, the coating or film can be further processed, as described in the earlier embodiments.

Leveling Agent

At least one leveling agent may also be added to the absorbing composition as a material modification agent. As contemplated herein, the at least one leveling agent is added to the absorbing composition to improve the via fill bias in the material. Contemplated leveling agents comprise polyacrylates—both ionic and non-ionic, such as BYK 380 and BYK 381.

The leveling agent may also serve a dual purpose or multi-stage purpose. The leveling agent may be specifically chosen for a particular absorbing composition based on polarity and/or functional groups other than those characteristics needed by the leveling agent in order to help level or planarize all or part of the absorbing composition. Once the leveling agent is incorporated into the composition it will act effectively as a "magnet" to attract the stripping and/or etching solution to the leveling agent or the compound comprising the leveling agent by utilizing a difference in polarity between the leveling agent or by utilizing the functional groups on the leveling agent. This attraction effect by the leveling agent can be activated in several ways. For example, there may be an exothermic reaction that takes place when the leveling agent is incorporated into the absorbing composition at room temperature, there may be an external energy and/or heat that needs to be added to "activate" the leveling agent, there may not need to be any energy added to the composition depending on the chemical composition of the leveling agent, or there may be a pressure differential applied to the absorbing composition that will "activate" the leveling agent. However, whether energy is added or not once the leveling agent is added, it should be understood that, in this embodiment, the leveling agent is not heated or activated to the point where it is chemically modified or broken down until the lithography step is completed. Once the lithography step is completed, the absorbing composition comprising the leveling agent may be left unheated or further heated so that the leveling agent's chemical composition can change to make it further compatible with the composition. At this point, the coating or film can be further processed, as described in the earlier embodiments.

Methods of Production

According to another aspect of the subject, methods for synthesizing the absorbing compositions described herein are provided. Absorbing materials are typically synthesized from a variety of silane reactants including, for example, triethoxysilane (HTEOS), tetraethoxysilane (TEOS), methyltriethoxysilane (MTEOS), dimethyldiethoxysilane, tetramethoxysilane (TMOS); dimethyldiethoxysilane, methyltrimethoxysilane (MTMOS), trimethoxysilane, dimethyldimethoxysilane, trimethylethoxysilane (TMEOS), phenyltriethoxysilane (PTEOS), phenyltrimethoxysilane (PTMOS), diphenyldiethoxysilane, diphenyldimethoxysilane, tetracetoxysilane (TAS), methyltriacetoxysilane (MTAS), phenyltriacetoxysilane (PTAS), dimethyldiacetoxysilane, and, diphenyldiacetoxysilane. However, gallium, arsenic, germanium, boron and similar atoms and materials may also be used in conjunction with silicon atoms or as the sole atomic material to produce an absorbing material.

Halosilanes, including chlorosilanes, such as trichlorosilane, methyltrichlorosilane, ethyltrichlorosilane, phenyltrichlorosilane, tetrachlorosilane, dichlorosilane, methyldichlorosilane, dimethyldichlorosilane, chlorotriethoxysilane, chlorotrimethoxysilane, chloromethyltriethoxysilane, chloroethyltriethoxysilane, chlorophenyltriethoxysilane, chloromethyltrimethoxysilane, chloroethyltrimethoxysilane, and chlorophenyltrimethoxysilane are also used as silane reactants.

In general, to produce the absorbing compositions, the absorbing compounds, such as absorbing compounds 1-41, or combinations thereof, are combined with the silane reactants during the synthesis of the absorbing materials. The material modification agent, such as the at least one porogen, the at least one high-boiling solvent, the at least one leveling agent, the at least one capping agent, the at least one catalyst, the at least one replacement solvent, at least one adhesion promoting material, at least one pH tuning agent, and/or a combination thereof may also be combined with the silane reactants during the synthesis of the absorbing materials or once the synthesis is complete, as in the case of the at least one capping agent.

One contemplated method of making an absorbing composition includes combining at least one inorganic-based composition, at least one incorporatable absorbing compound, at least one material modification agent, such as at least one porogen, at least one leveling agent, at least one high-boiling solvent, at least one catalyst, at least one capping agent, at least one replacement solvent, at least one pH tuning agent, at least one adhesion promoter, and/or a combination thereof, an acid/water mixture, such as a nitric acid/water mixture, and at least one solvent to form a reaction mixture; and heating to a temperature about or above 40° C. or refluxing the reaction mixture to form the absorbing composition. The absorbing composition formed is then diluted with at least one solvent to provide coating solutions that produce films of various thicknesses. The material modification agent, such as the at least one porogen, at least one high-boiling solvent, at least one capping agent, at least one leveling agent, at least one catalyst, at least one replacement solvent, at least one pH tuning agent, at least one adhesion promoter and/or a combination thereof may also and alternatively be added during the refluxing step or after the refluxing/heating step.

In another contemplated method of making an absorbing composition, at least one inorganic-based composition, at least one incorporatable absorbing compound, at least one material modification agent, such as at least one porogen or organic-type polymer, at least one high-boiling solvent, at least one catalyst, at least one capping agent, at least one leveling agent, at least one adhesion promoter, at least one replacement solvent, at least one pH tuning agent, and/or a combination thereof, and at least one additional solvent can be combined to form a reaction mixture. The reaction mixture is then heating to a temperature about or above 40° C. or refluxed to form the absorbing composition. The absorbing composition formed is diluted with at least one solvent to provide coating solutions that produce films of various thicknesses. The pH tuning agent in this method may either be a variation of the conventional acid/water mixture, in that a different acid may be added, less acid may be added, or more water may be added. Regardless of the pH tuning agent chosen, however, the basic principal still remains—which is that not only the pH is influenced by the pH tuning agent, but the chemical, mechanical and physical properties of the ARC are also influenced resulting in a more compatible resist/ARC couple.

More specifically, a reaction mixture including silane reactants, for example HTEOS, or TEOS and MTEOS, TMEOS or TMOS and MTMOS; or, alternatively, tetrachlorosilane and methyltrichlorosilane, at least one absorbing compound, such as absorbing compounds 1-41; at least one pH tuning agent, such as APTF; a solvent or combination of solvents; and an acid/water mixture, is formed in a reaction vessel. Appropriate solvents include acetone, 2-propanol, and other simple alcohols, ketones and esters such as 1-propanol, MIBK, propoxypropanol, and propyl acetate. The acid/water mixture is, for example nitric acid and water. Other protic acids or acid anhydrides, such as acetic acid, lactic acid, oxalic acid, formic acid, phosphoric acid, hydrochloric acid or acetic anhydride are alternatively used in the acid mixture. The resulting mixture is heated to a temperature about or above 40° C. or refluxed for between approximately 1 and 24 hours to produce the absorbing solution. As mentioned earlier, the material modification agent, such as the at least one porogen, at least one high-boiling solvent, at least one catalyst, at least one capping agent, at least one replacement solvent, at least one pH tuning agent, at least one adhesion promoter, at least one leveling agent, and/or a combination thereof may be added during or after the heating/refluxing step, depending on the resist material chosen. Also, as mentioned earlier, the acid concentration and/or strength and the water concentration in the acid/water mixture may be varied in order to become a pH tuning agent, depending on the resist material chosen for the specific layered material, electronic component or semiconductor component application.

The absorbing material can be diluted with appropriate solvents to achieve coating solutions that produce films of various thicknesses. Suitable dilutant solvents include acetone, 2-propanol, ethanol, butanol, methanol, propylacetate, ethyl lactate, propylene glycol methyl ether acetate, and propylene glycol propyl ether, referred to commercially as Propasol-P. Dilutant solvents with high boiling points such as ethyl lactate and propylene glycol propyl ether have been found beneficial. It is believed high boiling point solvents decrease the probability of formation of bubble film defects. In contrast, lower boiling point solvents may become entrapped below a crosslinked top layer of a film and subsequently produce voids when driven off during a baking process step. Additional solvents useful in the invention include ethylene glycol dimethyl ether, alternatively termed glyme, anisole, dibutyl ether, dipropyl ether, propylene glycol methyl ether acetate, and pentanol. Optionally, surfactants, can be utilized and data/observations for these optional surfactants are presented below in the Examples section; however, these data and observations are not exhaustive of the studies conducted and do not represent all of the surfactants tested. For example, the following classes of surfactants were tested: polyacrylates (both ionic and non-ionic) (BYK brand surfactants, specifically BYK 306, 307, 308, 380 and 381), functional polydimethylsiloxanes (Tagopren brand surfactants), silicones, fluorinated alkylesters (FC brand surfactants, specifically FC4430, FC430 or FC4432 provided by 3M (Minneapolis, Minn.)), polyether and aliphatic hydrocarbon chain surfactants (Brij surfactants), the product Megaface R08 (provided by DIC (Japan)), or generally the class of fluorocarbon surfactants, are also added to the coating solution. Furthermore, several viscosity agents may be added to the coating solution to effect the viscosity of the coating solution, such as BYK 410 and BYK 420. The coating solution is typically between about 0.5 and 20% polymer by weight. Prior to use, the coating solution is filtered by standard filtration techniques.

According to a second method of forming absorbing materials, a reaction mixture including at least one silane reactant, at least one absorbing compound, such as absorbing compounds 1-41, at least one material modification agent, including at least one porogen, at least one high-boiling solvent, at least one catalyst, at least one leveling agent, at least one capping agent, at least one replacement solvent, at least one pH tuning agent, at least one adhesion promotor, and/or a combination thereof, and an additional solvent or combination of solvents is formed in a reaction vessel. The reaction mixture is heated to about or above a temperature of 40° C. and held at the desired temperature for between approximately 1 and 24 hours. The silane reactants and solvents are as described in the first method above. An acid/water mixture, as described above, is added to the reaction mixture while stirring. The resulting mixture is heated to about of above a temperature of 40° C. and held at the desired temperature for between approximately 1 and 24 hours to produce the absorbing material. The absorbing material is diluted and filtered as described above to form a coating solution. Again, as mentioned earlier, the at least one porogen, at least one high-boiling solvent, at least one catalyst, at least one replacement solvent, at least one leveling agent, at least one adhesion promoter, at least one pH tuning agent, and/or a combination thereof may be added during or after the first heating step.

A method of forming an absorbing organohydridosiloxane material includes forming a mixture of a dual phase solvent which includes both a non-polar solvent and a polar solvent and a phase transfer catalyst; adding at least one organotrihalosilane, hydridotrihalosilane; adding, at least one material modification agent, such as at least one porogen, at least one capping agent, at least one high-boiling solvent, at least one leveling agent, at least one catalyst, at least one replacement solvent, at least one adhesion promoter, at least one pH tuning agent, and/or a combination thereof; and at least one absorbing compound, such as absorbing compounds 1-41, to provide a dual phase reaction mixture; and reacting the dual phase reaction mixture for between 1 and 24 hours to produce the absorbing organohydridosiloxane polymer. The phase transfer catalyst includes but is not limited to tetrabutylammonium chloride and benzyltrimethylammonium chloride. Exemplary non-polar solvents include, but are not limited to, pentane, hexane, heptane, cyclohexane, benzene, toluene, xylene, halogenated solvents such as carbon tetrachloride and mixtures thereof. Useful polar solvents include water, alcohols, and alcohol and water mixtures. The absorbing polymer solution is diluted and filtered as described above to form a coating solution.

In another embodiment, the catalyst may reside on a solid phase, with the polymerization proceeding on the surface. The support materials may include typical silica-based ion-exchange resins which have an attached acid group such as sulfonic acid; or any other acid-containing polymer (such as polylactide, polyacrylic acid, polyvinylsulfonic acid) which is insoluble in the solvent conditions used.

In other embodiments, the water content of the composition during and after the synthesis and/or preparation of the absorbing coating composition can be controlled in order to control the molecular weight growth of the polymer. Controlling the water content has a similar effect as the capping agent to the polymer molecular weight growth.

Alternatively, yet another method of making an absorbing anti-reflective composition, requires at least one inorganic-based monomer to be added after the polymerization reaction has started in a "staged silane addition" manner. Any remaining silane monomers, the incorporatable absorbing compound that absorbs light at wavelengths less than about 375 nm, and the at least one material modification agent, such as the at least one porogen, at least one high-boiling solvent, at least one catalyst, at least one pH tuning agent, at least one leveling agent, at least one capping agent, at least one adhesion promoter, at least one replacement solvent and/or a combination thereof is then added to the reaction mixture.

Applications

The absorbing coating solutions are applied to various substrates to form layered materials, layers used in semiconductor processing, or layers used in electronic components, depending on the specific fabrication process, typically by conventional spin-on deposition techniques. These techniques include a dispense spin, a thickness spin, and thermal bake steps, to produce an absorbing anti-reflective coating. Typical processes include a thickness spin of between 1000 and 4000 rpm for about 20 seconds and one to three bake steps at temperatures between 80° C. and 300° C. for about one minute each. The absorbing anti-reflective coatings, according to the present invention exhibit refractive indices between about 1.3 and about 2.0 and extinction coefficients greater than approximately 0.07.

Substrates contemplated herein may comprise any desirable substantially solid material. Particularly desirable substrate layers would comprise films, glass, ceramic, plastic, metal or coated metal, or composite material. In preferred embodiments, the substrate comprises a silicon or germanium arsenide die or wafer surface, a packaging surface such as found in a copper, silver, nickel or gold plated leadframe, a copper surface such as found, in a circuit board or package interconnect trace, a via-wall or stiffener interface ("copper" includes considerations of bare copper and its oxides), a polymer-based packaging or board interface such as found in a polyimide-based flex package, lead or other metal alloy solder ball surface, glass and polymers such as polyimide. In more preferred embodiments, the substrate comprises a material common in the packaging and circuit board industries such as silicon, copper, glass, and another polymer.

Contemplated coating materials, coating solutions and films can be utilized are useful in the fabrication of a variety of electronic devices, micro-electronic devices, particularly semiconductor integrated circuits and various layered materials for electronic and semiconductor components, including hardmask layers, dielectric layers, etch stop layers and buried etch stop layers. These coating materials, coating solutions and films are quite compatible with other materials that might be used for layered materials and devices, such as adamantane-based compounds, diamantane-based compounds, silicon-core compounds, organic dielectrics, and nanoporous dielectrics. Compounds that are considerably compatible with the coating materials, coating solutions and films contemplated herein are disclosed in PCT Application PCT/US01/32569 filed Oct. 17, 2001; PCT Application PCT/US01/50812 filed Dec. 31, 2001; U.S. Pat. Nos. 6,313,185; 6,380,347; 6,444,715; U.S. Pat. No. 6,214,746; U.S. Pat. No. 6,171,687; U.S. Pat. No. 6,172,128; U.S. Pat. No. 6,156,812, U.S. Application Ser. No. 60/350,187 filed Jan. 15, 2002; and U.S. 60/347,195 filed Jan. 8, 2002, which are all incorporated herein by reference in their entirety.

Figure 1A:
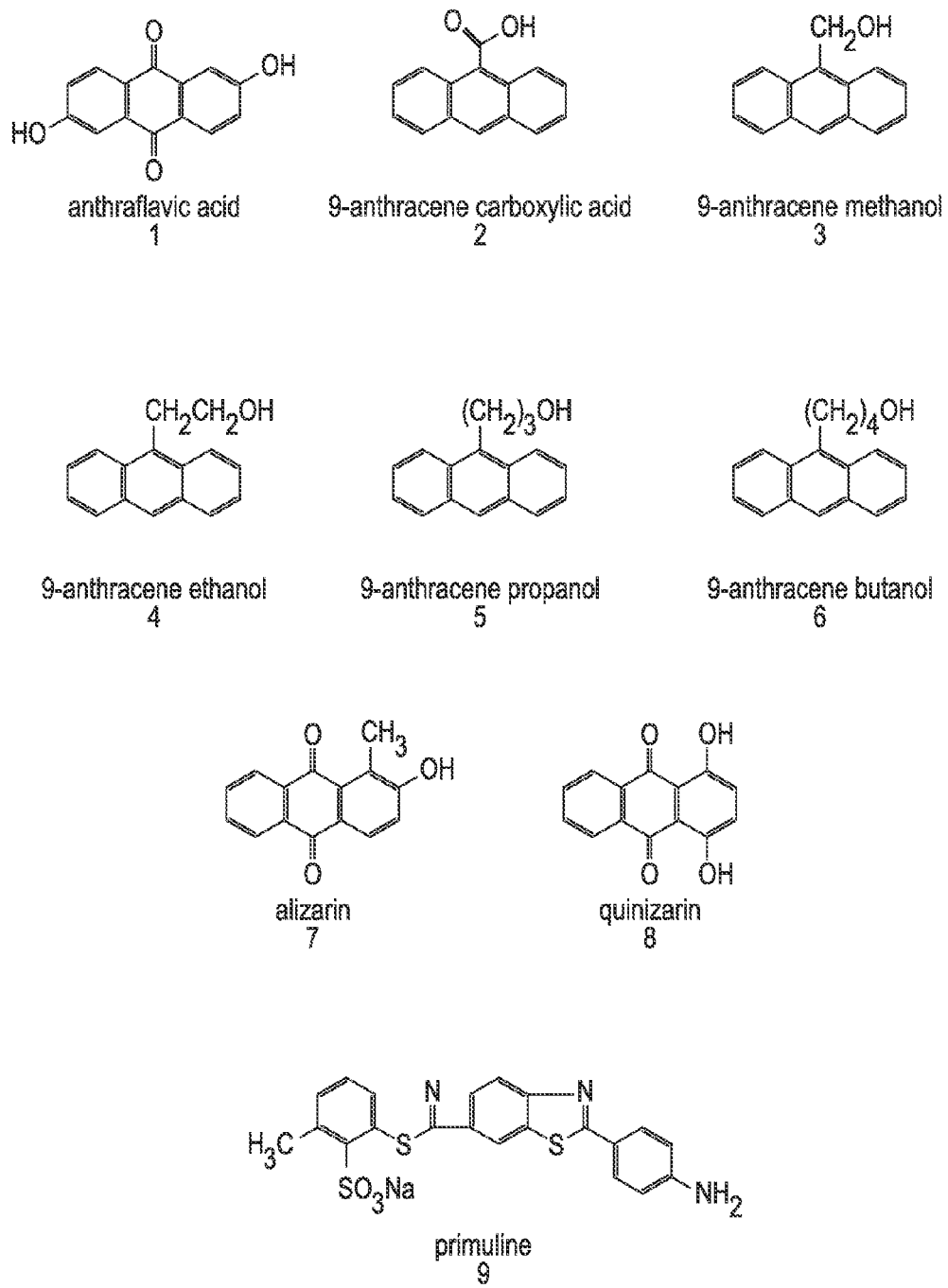
Figure 1B:
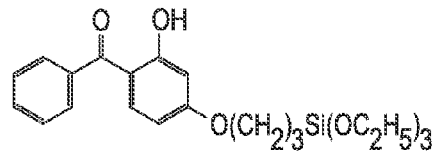
Figure 1B:
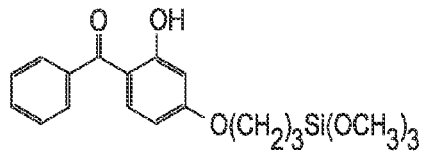
Figure 1B:
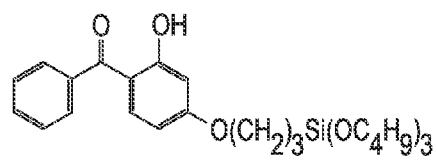
Figure 1B:
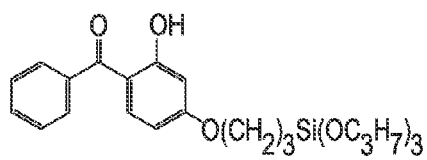
Figure 1B:
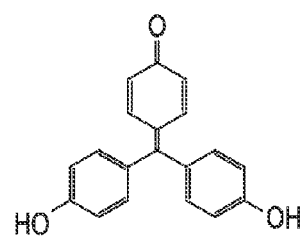
Figure 1B:
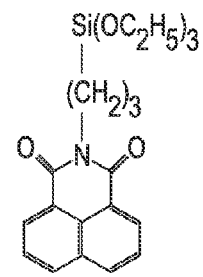
Figure 1B:
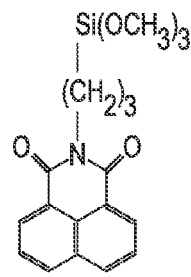
Figure 1B:
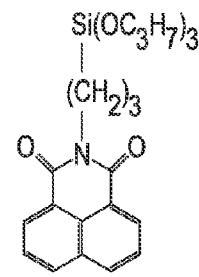
Figure 1D:
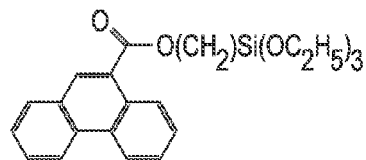
Figure 1D:
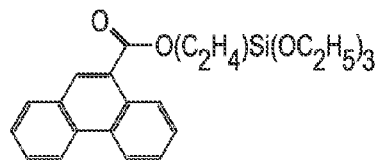
Figure 1D:
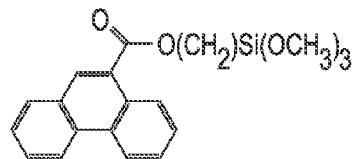
Figure 1D:
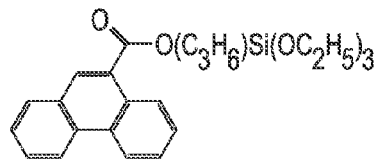
Figure 1D:
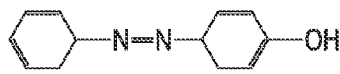
Figure 1D:
Figure 1D:
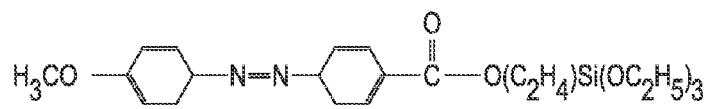
Figure 2A:
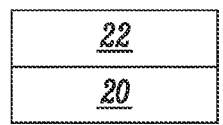
FIGS. 2a-2h illustrate the use of absorbing anti-reflective compositions in a photolithography process.
Figure 2B:
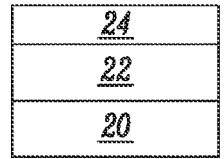
Figure 2C:
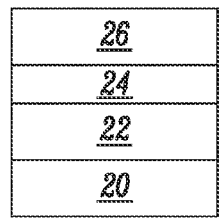
Figure 2D:
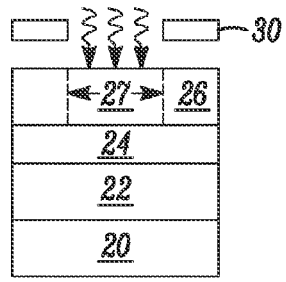

A general method of using an absorbing material according to the present invention as an anti-reflective coating in a photolithographic process is illustrated in FIGS. 2a-2h. As shown in FIG. 2a, a dielectric layer 22 is deposited on a silicon substrate 20. Dielectric layer 22 can be composed of a variety of dielectric materials including, for example, a silicon dioxide layer derived from TEOS, a silane based silicon dioxide layer, a thermally grown oxide, or a chemical-vapor-deposition-produced methylhydridosiloxane, OSG, FSG, NANOGLASS™-type of materials or silicon dioxide incorporating other elements or compounds. Dielectric layer 22 is typically an optically transparent medium, but it does not have to be an optically transparent medium. An absorbing anti-reflective coating layer 24 is applied above dielectric layer 22 (FIG. 2b) that is covered by a photoresist layer 26, of a conventional positive photoresist, to produce the stack shown in FIG. 2c. The stack of FIG. 2c is exposed to ultra-violet radiation 32 through mask 30, as shown in FIG. 2d. During the to exposure, the absorbing ARC layer 24 absorbs UV light 32 transmitted through the photoresist. Because the dielectric layer 22 is generally and usually transparent in the UV wavelength range, if absorbing ARC layer 24 were not present, the UV light 32 would reflect off the underlying silicon layer 20, or other reflective surfaces such as poly silicon, copper, and high refractive index surfaces such as silicon nitride, etc., degrading a critical dimension, for example critical dimension 27 of the exposed photoresist. In this example, a positive photoresist, which provides direct image transfer, is assumed. It should be appreciated, however, that some organic dielectrics are not optically transparent.

Figure 2E:
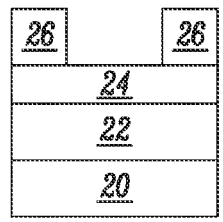

The exposed stack is developed to produce the stack of FIG. 2e. The absorbing ARC layer 24 is resistant to conventional photoresist developer solutions such as a 2.3% solution of tetramethylammoniumhydroxide (TMAH). In contrast, ARC layers, which have some of the chemical characteristics of the photoresist materials, are more sensitive to photoresist developers. Furthermore, it is anticipated that absorbing ARC layers are resistant to photoresist stripping processes, whereas organic ARC's are not resistant. Thus, use of absorbing layers may facilitate photoresist rework, without the need to reapply the ARC layer.

Figure 2F:
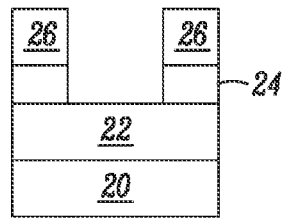

Next, a pattern is etched in the absorbing ARC layer 24 through the opening in photoresist layer 26 to produce the etched stack of FIG. 2f. A fluorocarbon etch, which has a high selectivity to photoresist, is used to etch the absorbing spin-on ARC layer 24. The response of the absorbing layer to a fluorocarbon etch provides an additional advantage of the absorbing layer over organic ARC layers, which require an oxygen plasma etch [RIE based plasma]. An oxygen plasma etch can degrade the critical dimension of the developed photoresist because the photoresist, being organic based, is also etched by an oxygen plasma. A fluorocarbon plasma consumes less photoresist than an oxygen plasma. At shorter UV wavelengths, depth of focus requirements will limit the thickness of photoresist layer 26 at the exposure step shown in FIG. 2d. For example, it is estimated that at 193 nm, the thickness of photoresist layer should be approximately 300 nm, and in several contemplated embodiments, thicknesses of about 250 nm are being used. Thus, as these short wavelengths start to be employed, it will be important to have an ARC layer that can be etched selectively with respect to the photoresist. Note the plasma etch rate selectivity of organic ARCs to photoresist rarely exceeds 2:1. Si—O based ARCs can show etch rate selectivities in excess of 6:1.

Figure 2G:
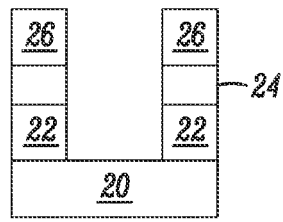
Figure 2H:
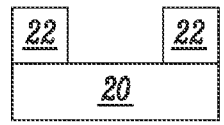
Figure 3:
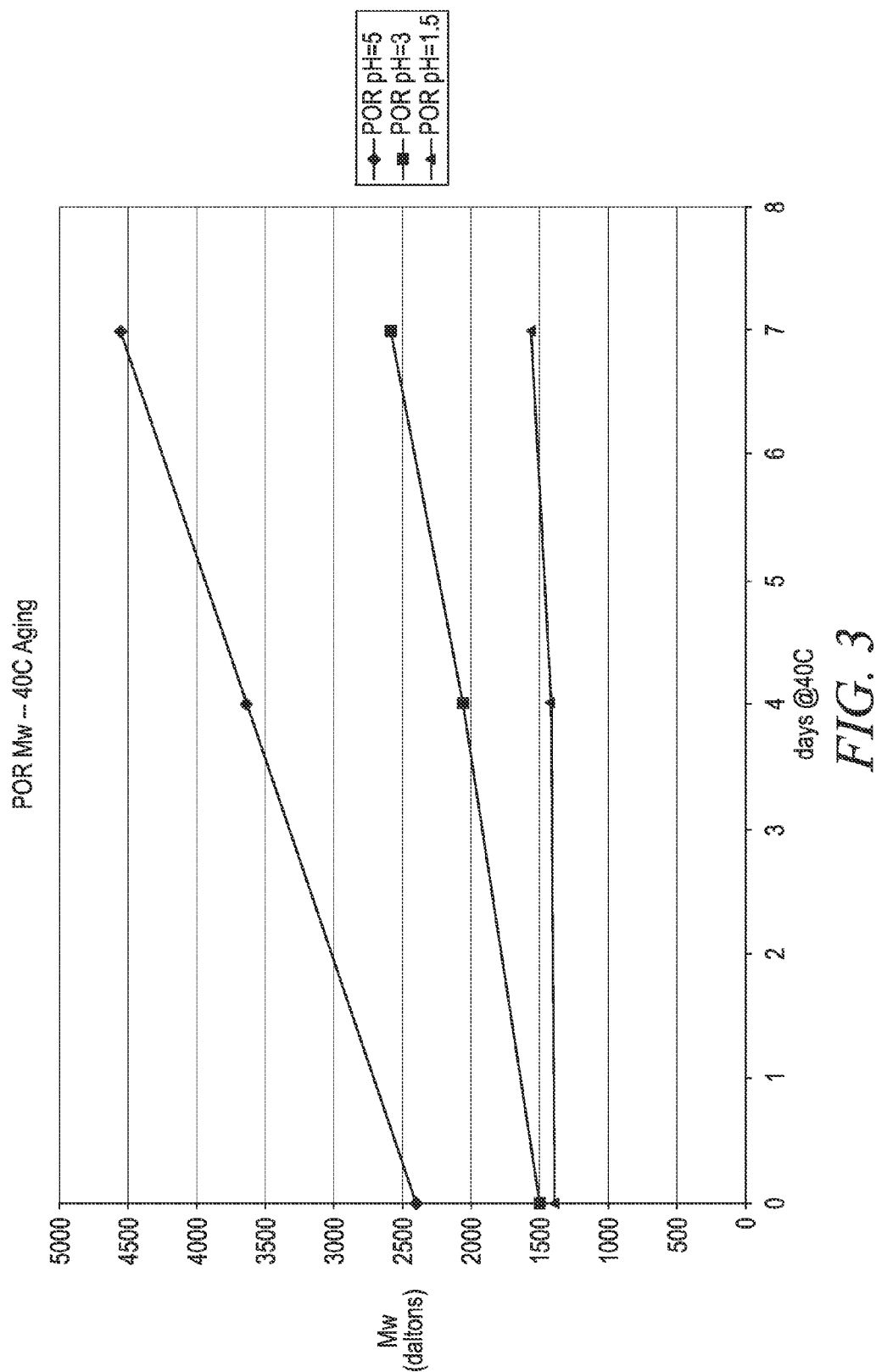
FIG. 3 graphically illustrates MW (daltons) v. days at about 40° C. for a contemplated compound.
Figure 4:
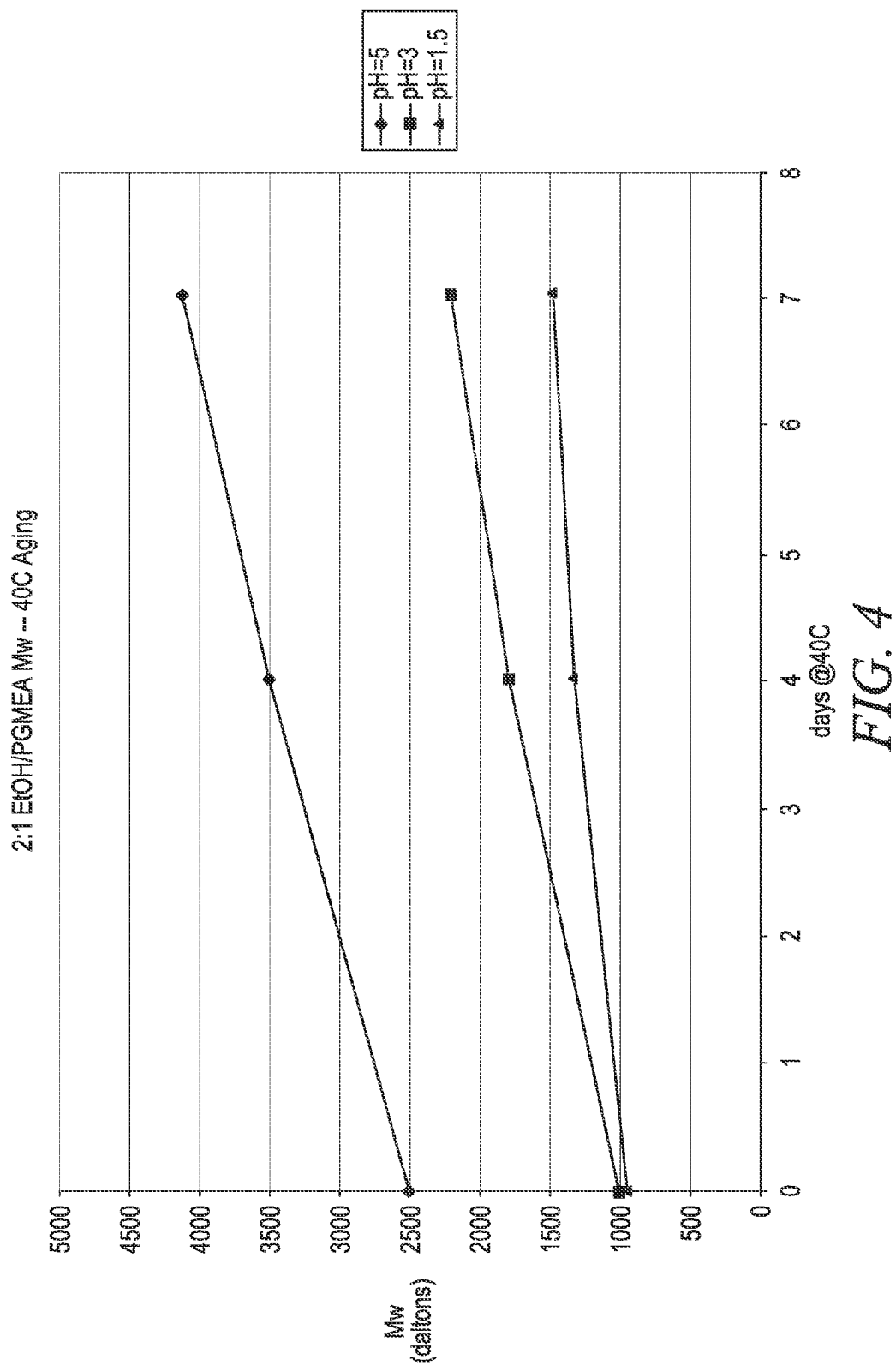
FIG. 4 graphically illustrates MW (daltons) v. days at about 40° C. for a contemplated compound.
Figure 5:
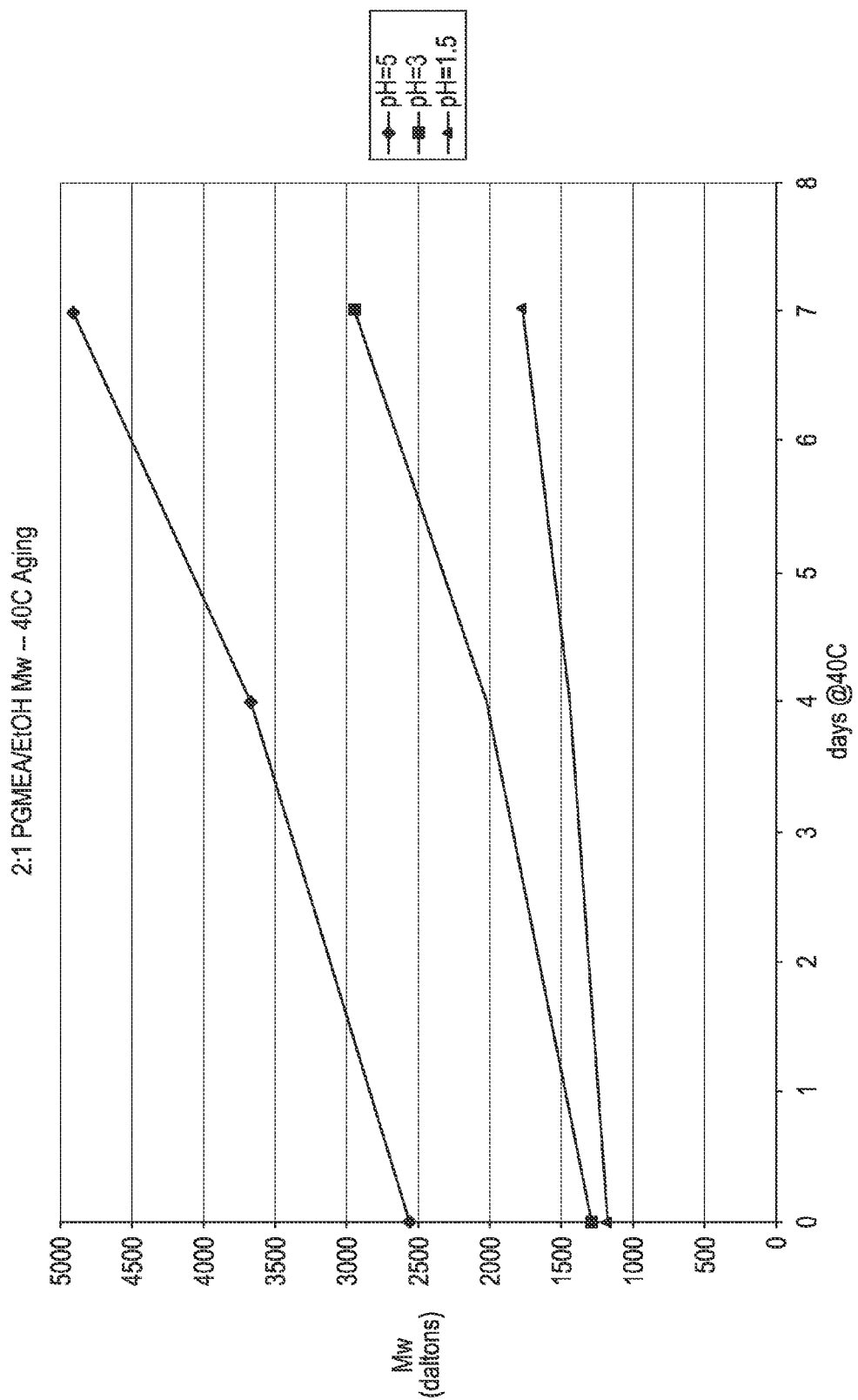
FIG. 5 graphically illustrates MW (daltons) v. days at about 40° C. for a contemplated compound.
Figure 6:
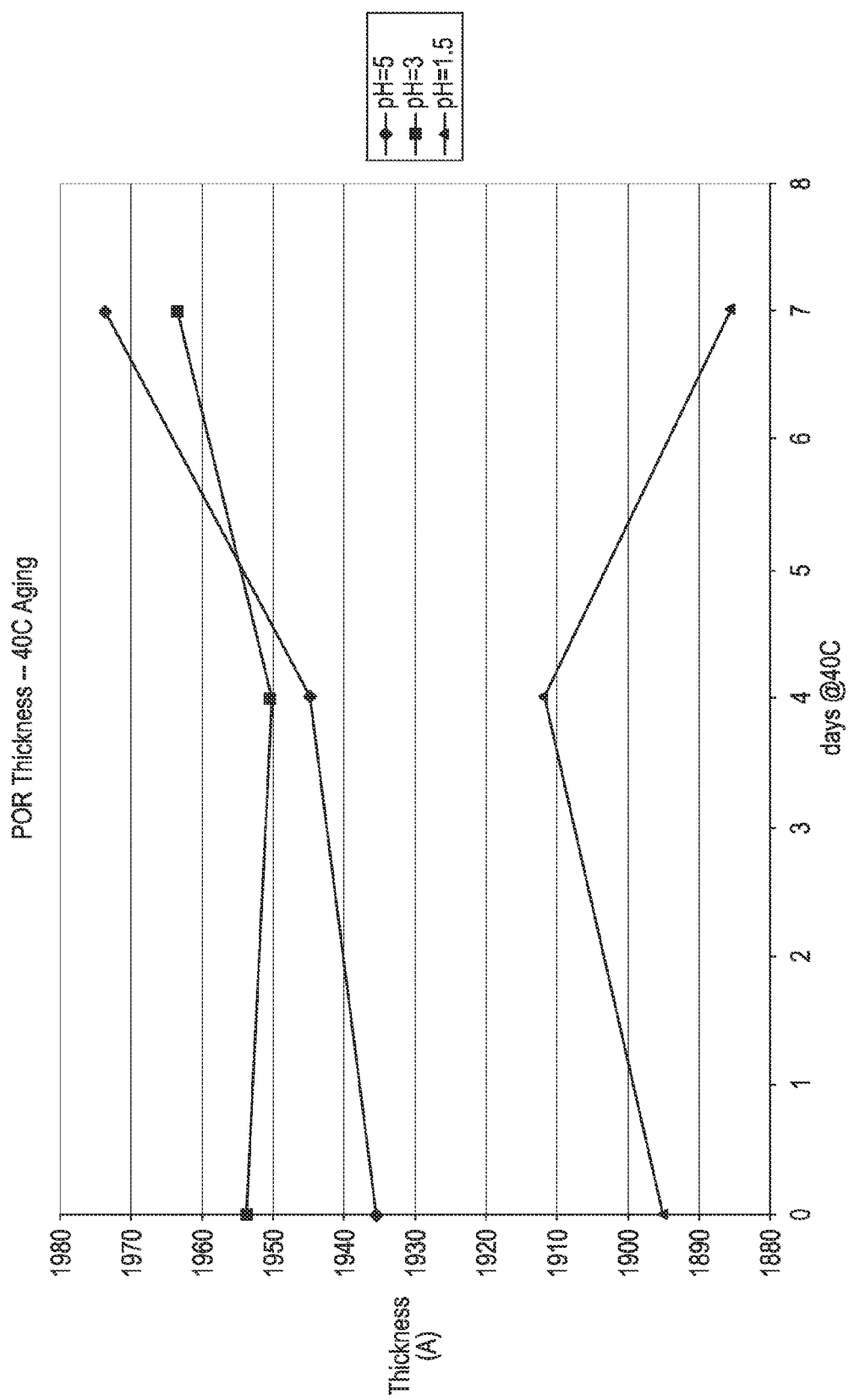
FIG. 6 graphically illustrates Thickness (Angstroms) v. days at about 40° C. for a contemplated compound.
Figure 7:
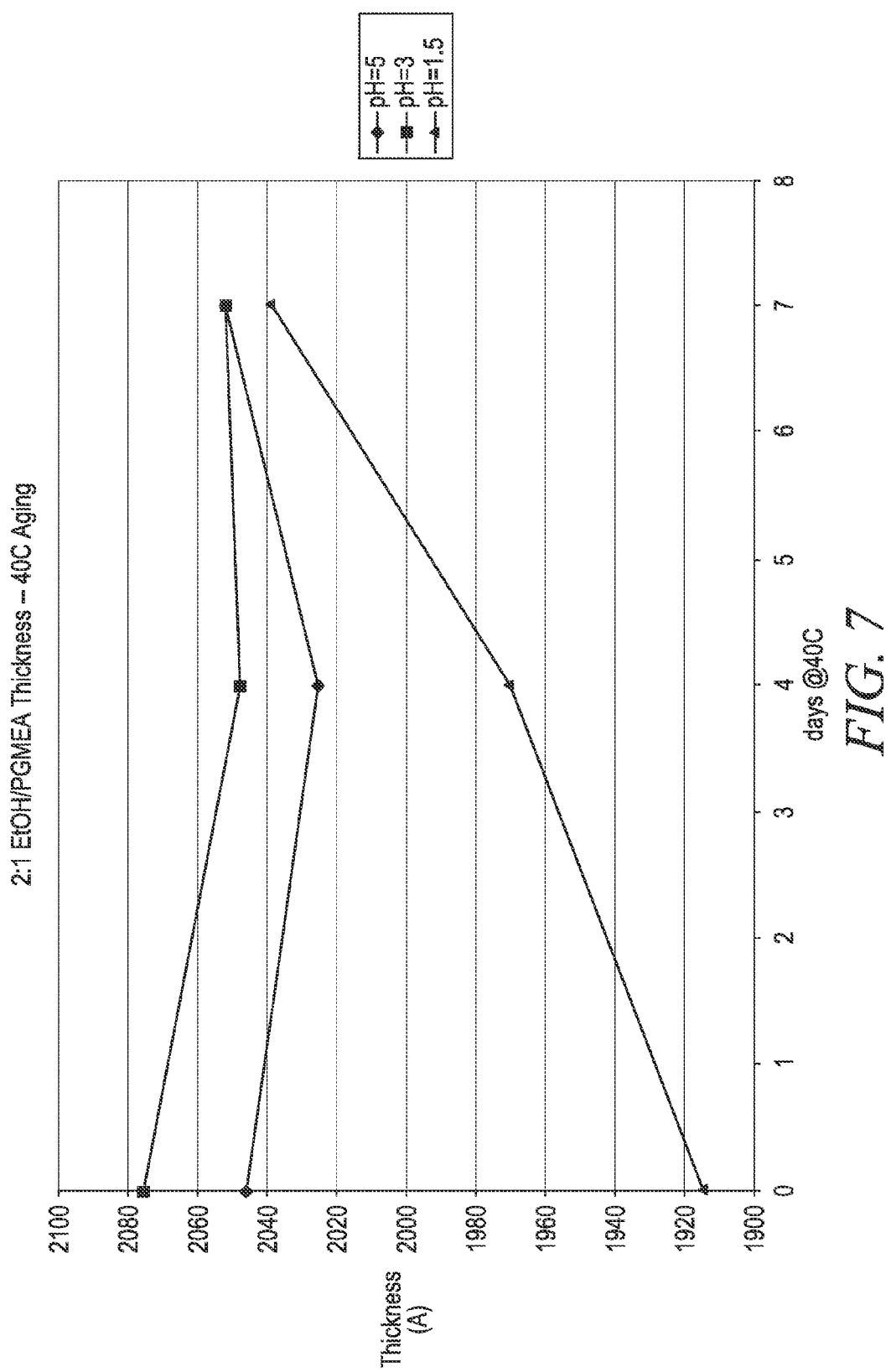
FIG. 7 graphically illustrates Thickness (Angstroms) v. days at about 40° C. for a contemplated compound.
Figure 8:
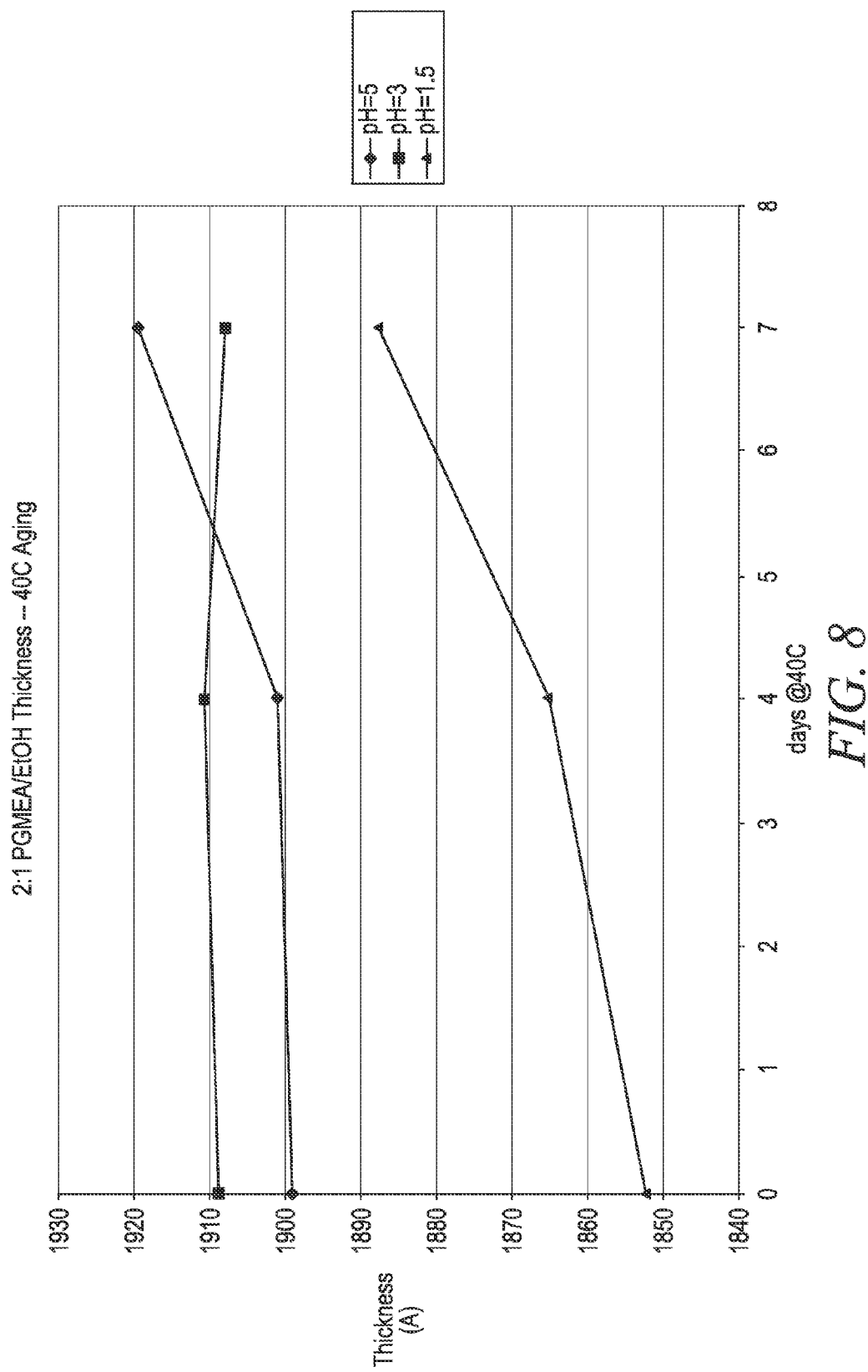
FIG. 8 graphically illustrates Thickness (Angstroms) v. days at about 40° C. for a contemplated compound.
Figure 9:
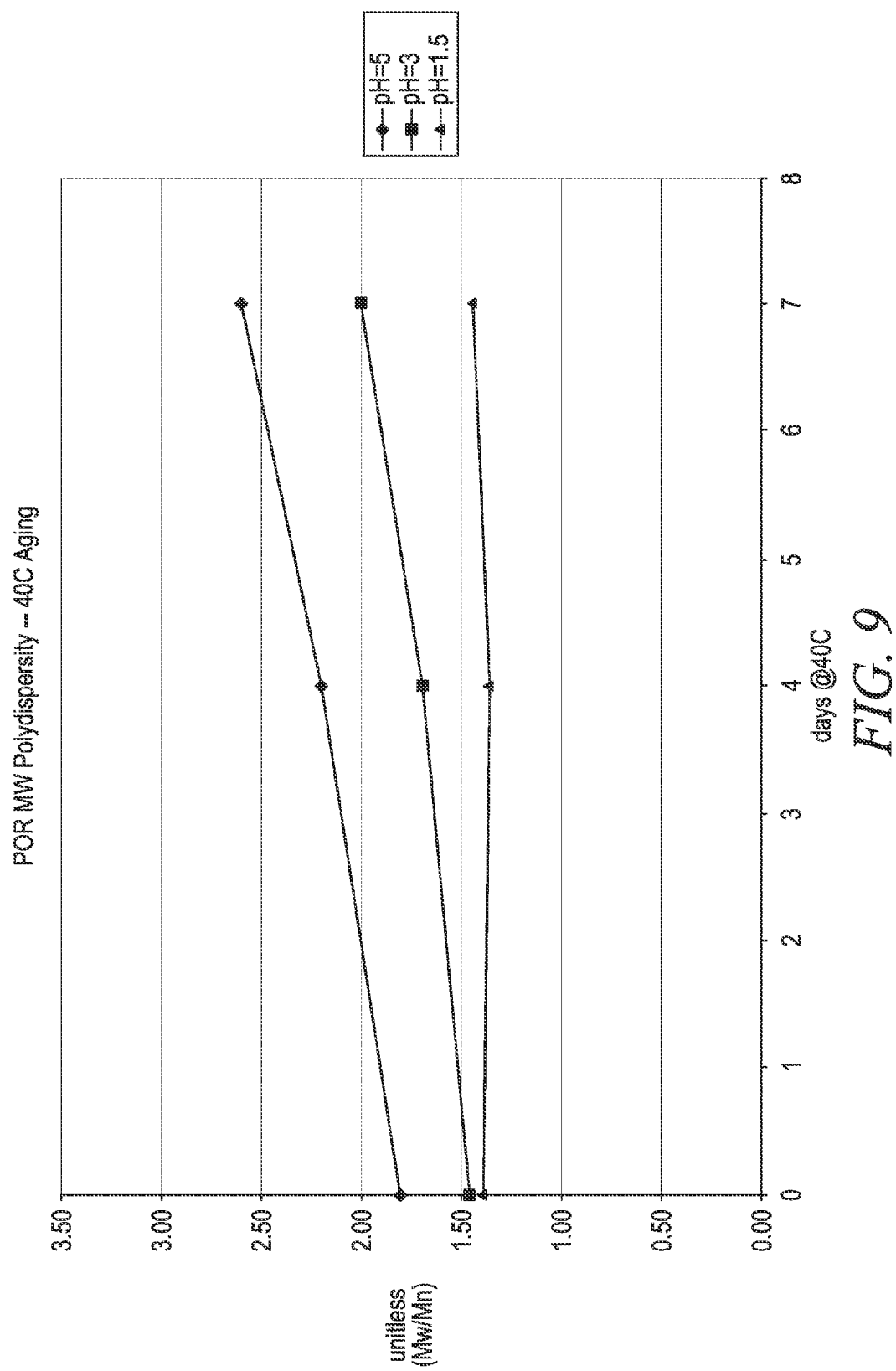
FIG. 9 graphically illustrates Polydispersity (Mw/Mn—unitless) v. days at about 40° C. for a contemplated compound.
Figure 10:
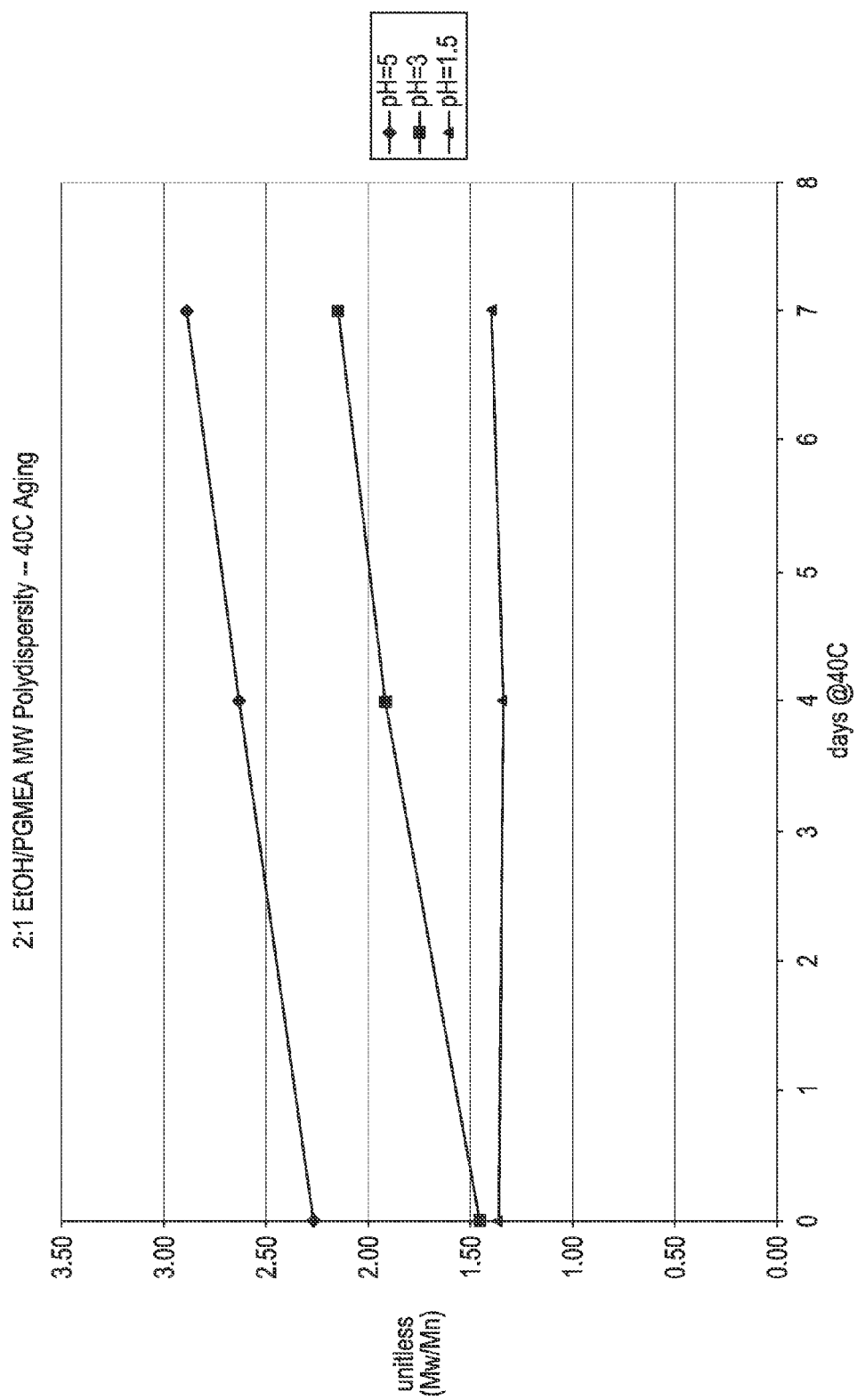
FIG. 10 graphically illustrates Polydispersity (Mw/Mn—unitless) v. days at about 40° C. for a contemplated compound.
Figure 11:
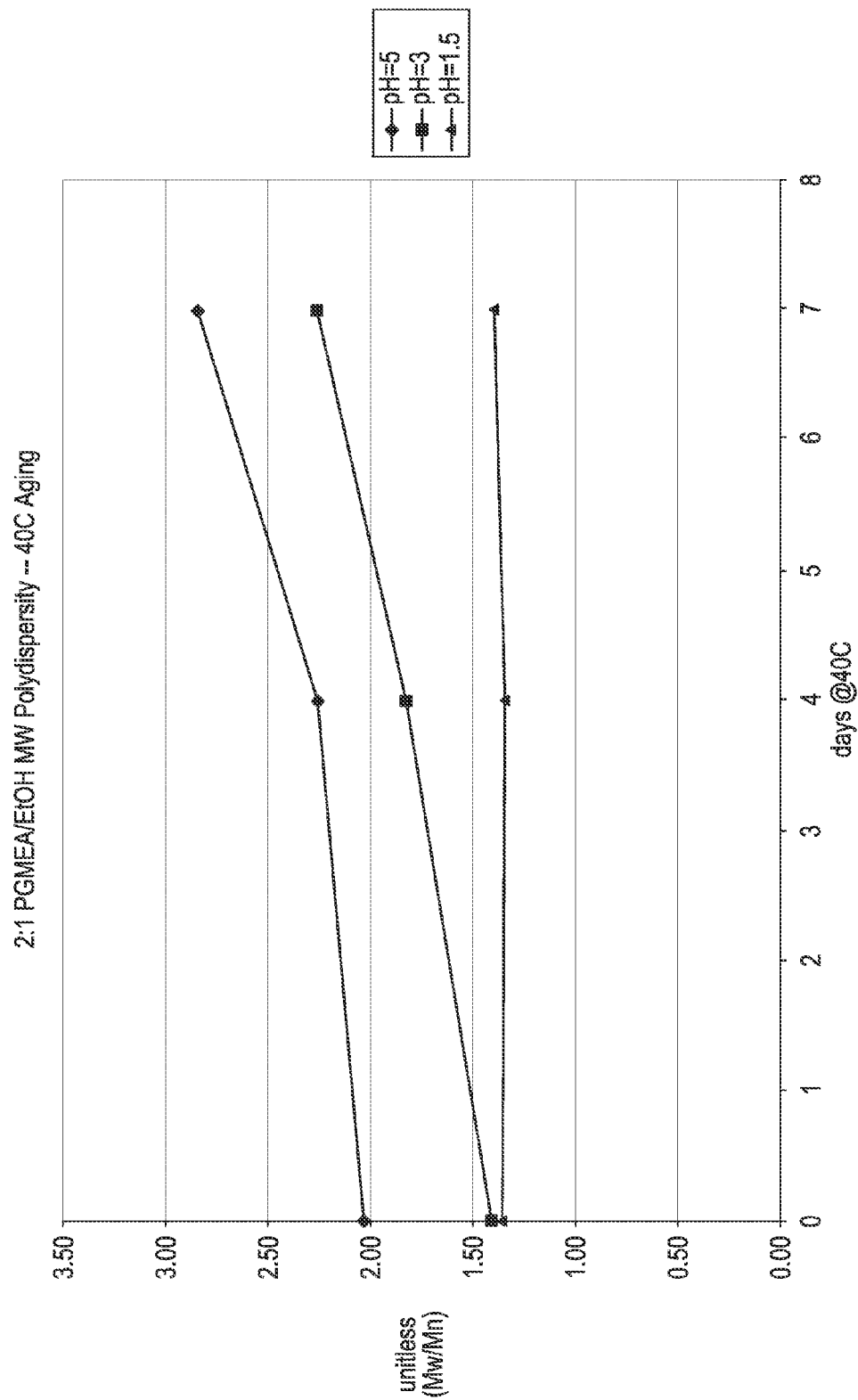
FIG. 11 graphically illustrates Polydispersity (Mw/Mn—unitless) v. days at about 40° C. for a contemplated compound.
Figure 12:
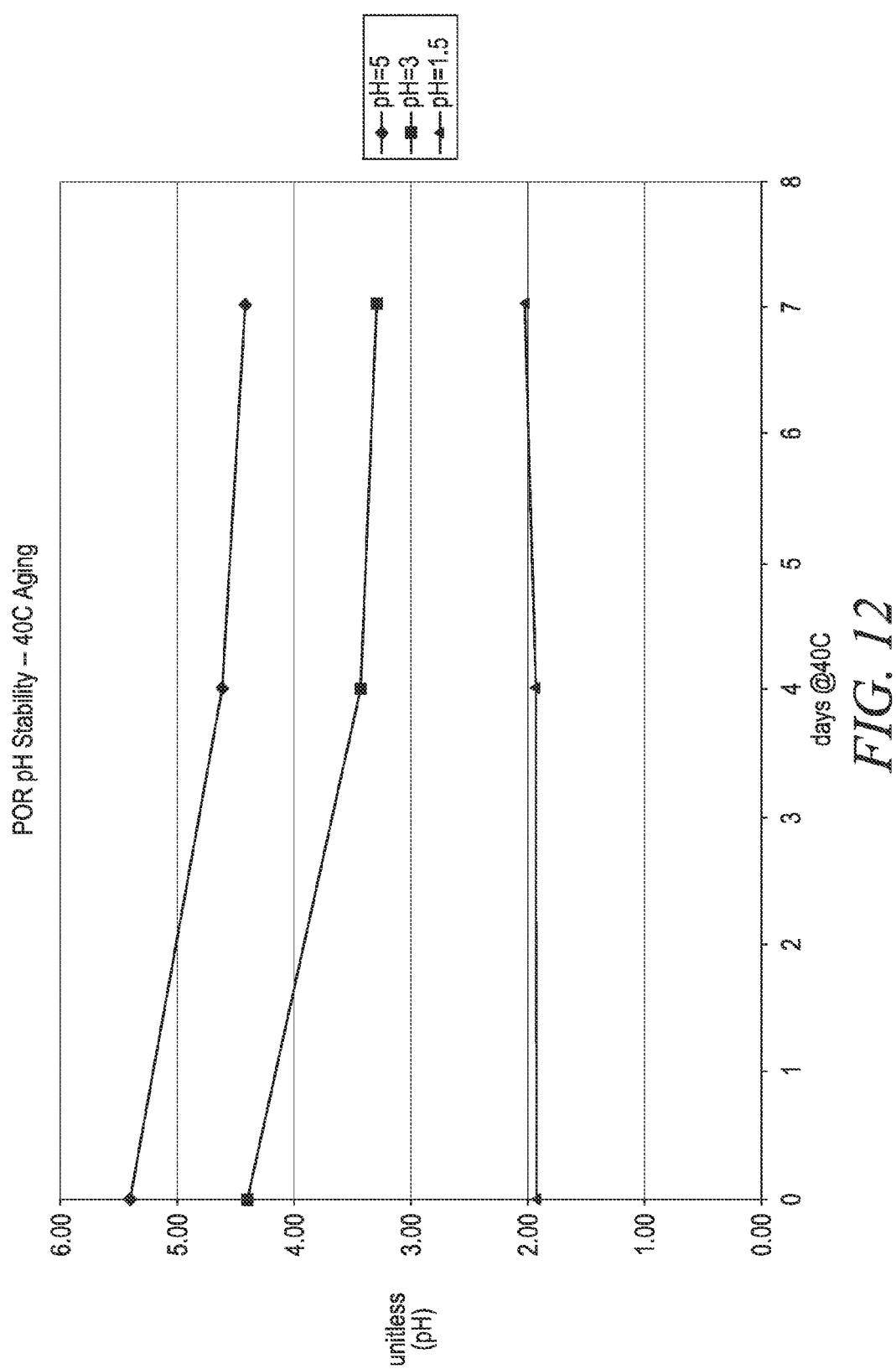
FIG. 12 graphically illustrates pH (unitless) v. days at about 40° C. for a contemplated compound.
Figure 13:
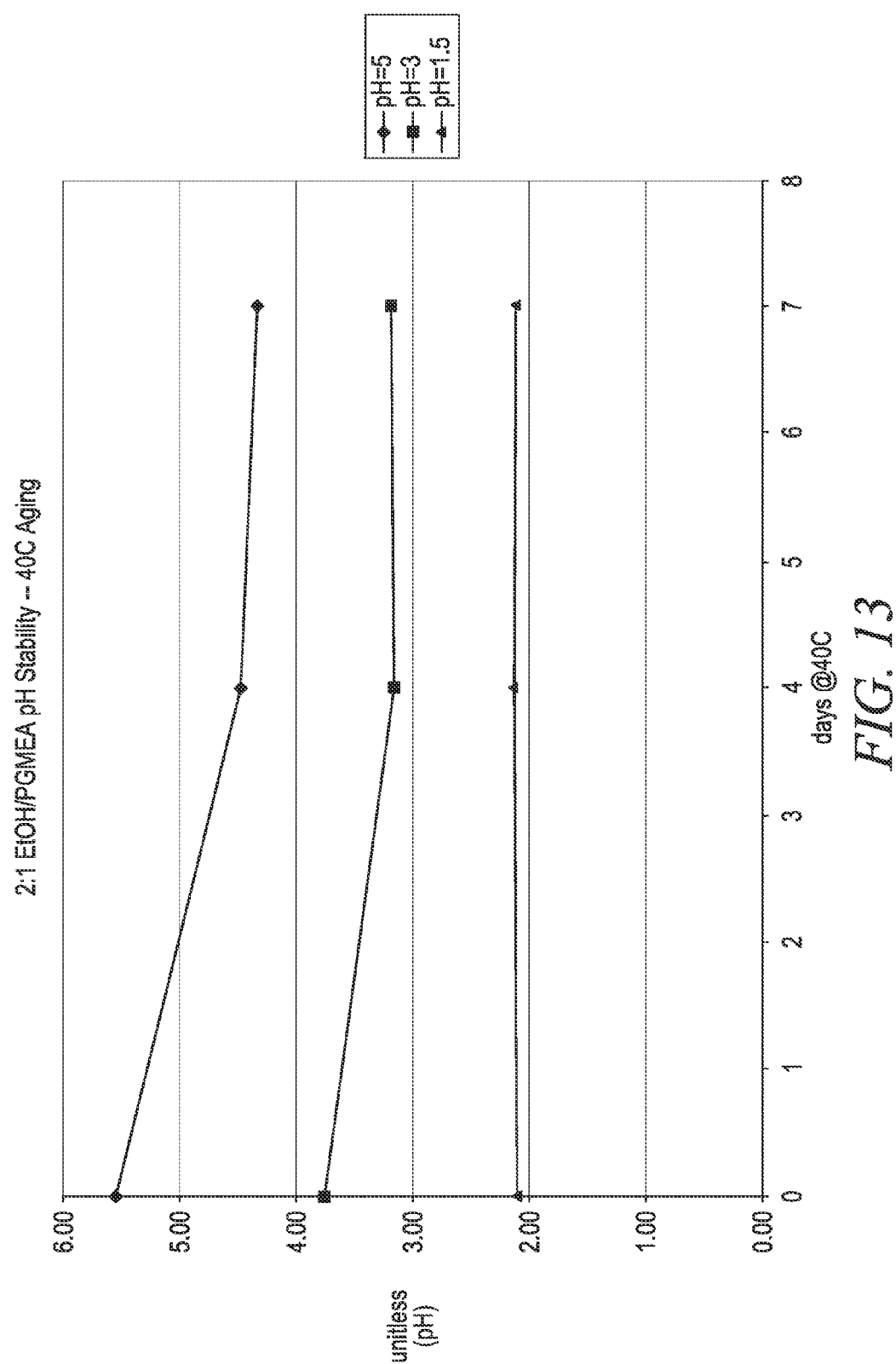
FIG. 13 graphically illustrates pH (unitless) v. days at about 40° C. for a contemplated compound.
Figure 14:
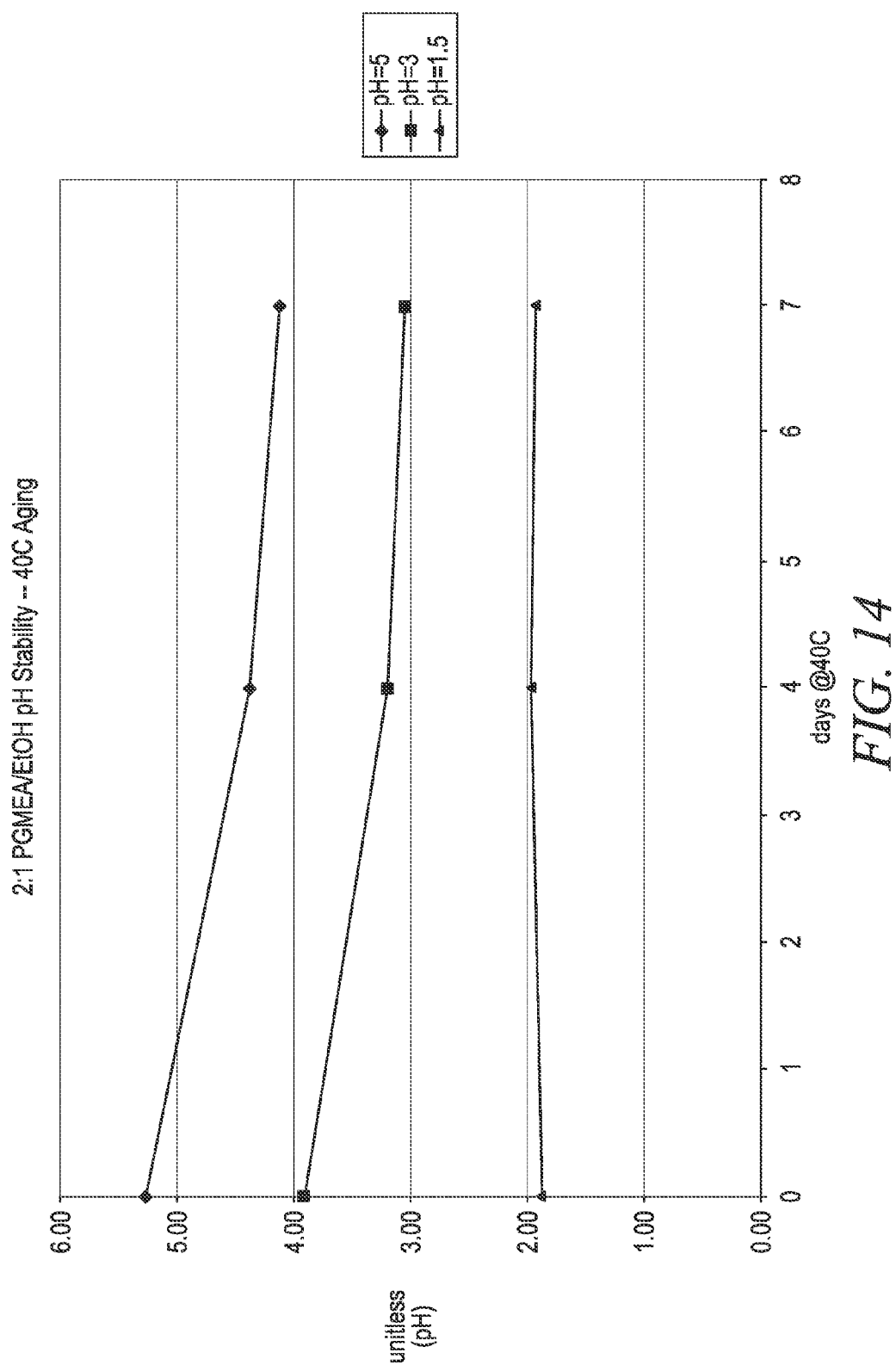
FIG. 14 graphically illustrates pH (unitless) v. days at about 40° C. for a contemplated compound.

The fluorocarbon etch is continued through the dielectric layer 22 to produce the stack of FIG. 2g. Photoresist layer 26 is partially consumed during the continued etch process. Finally, the photoresist layer 26 is stripped using a suitable energy source, such as an oxygen plasma in some cases or a hydrogen reducing chemistry or via a wet chemistry and the ARC layer 24 is stripped using either a buffered oxide etch, for example a standard hydrofluoric acid/water mixture, non, partially or complete aqueous fluoride chemistry, or an aqueous or non-aqueous organoamine. Advantageously, the ARC layer can be stripped with solutions that show a good selectivity with respect to the underlying dielectric layer. Thus, the general photolithographic method shown in FIGS. 2a-2h illustrates the process advantages of absorbing materials as anti-reflective coating layers and as sacrificial anti-reflective coating layers.

The compounds, coatings, films, materials and the like described herein may be used to become a part of, form part of or form an electronic component and/or semiconductor component. As used herein, the term "electronic component" also means any device or part that can be used in a circuit to obtain some desired electrical action. Electronic components contemplated herein may be classified in many different ways, including classification into active components and passive components. Active components are electronic components capable of some dynamic function, such as amplification, oscillation, or signal control, which usually requires a power source for its operation. Examples are bipolar transistors, field-effect transistors, and integrated circuits. Passive components are electronic components that are static in operation, i.e., are ordinarily incapable of amplification or oscillation, and usually require no power for their characteristic operation. Examples are conventional resistors, capacitors, inductors, diodes, rectifiers and fuses.

Electronic components contemplated herein may also be classified as conductors, semiconductors, or insulators. Here, conductors are components that allow charge carriers (such as electrons) to move with ease among atoms as in an electric current. Examples of conductor components are circuit traces and vias comprising metals. Insulators are components where the function is substantially related to the ability of a material to be extremely resistant to conduction of current, such as a material employed to electrically separate other components, while semiconductors are components having a function that is substantially related to the ability of a material to conduct current with a natural resistivity between conductors and insulators. Examples of semiconductor components are transistors, diodes, some lasers, rectifiers, thyristors and photosensors.

Electronic components contemplated herein may also be classified as power sources or power consumers. Power source components are typically used to power other components, and include batteries, capacitors, coils, and fuel cells. Power consuming components include resistors, transistors, integrated circuits (ICs), sensors, and the like.

Still further, electronic components contemplated herein may also be classified as discreet or integrated. Discreet components are devices that offer one particular electrical property concentrated at one place in a circuit. Examples are resistors, capacitors, diodes, and transistors. Integrated components are combinations of components that that can provide multiple electrical properties at one place in a circuit. Examples are integrated circuits in which multiple components and connecting traces are combined to perform multiple or complex functions such as logic.

EXAMPLES

Analytical Test Methods

Shrinkage:

Film shrinkage is measured by determining the film thickness before and after the process. Shrinkage is expressed in percent of the original film thickness. Shrinkage is positive if the film thickness decreased. The actual thickness measurements are performed optically using a n&k Analyzer spectrophotometer.

Refractive Index:

The refractive index (n) measurements are performed together with the thickness measurements using a n&k Analyzer spectrophotometer.

Absorption Coefficient:

The absorption coefficient (k) is measurements are performed together with the thickness measurements using a n&k Analyzer spectrophotometer.

Molecular Weight:

The molecular weight (Mw) measurements are performed by using Gas Phase Chromatography.

Blanket Film Thickness:

The blanket film thickness measurements are performed using an N&K Analyzer.

% Via Fill:

The % Via Fill measurements are performed using a via-fill wafer along with a Scanning Electron Microscope.

Film Quality:

The film quality measurements are performed using visual inspection along with a microscope.

The methods of synthesizing the absorbing materials comprising at least one inorganic-based material or composition and at least one material modification agent that includes at least one porogen, at least one high-boiling solvent, at least one capping agent, at least one leveling agent, at least one catalyst, at least one replacement solvent, at least one adhesion promoter, at least one pH tuning agent, and/or a combination thereof in order to couple with and improve the compatibility of a resist material, increase etch selectivity and/or stripping selectivity and increase planarization ability, while decreasing voiding are illustrated in the following examples. The solutions and coatings prepared in the following examples are tuned and/or prepared in order to be compatible with several photoresist materials, including those that absorb around 157 nm, 193 nm, 248 nm, and 375 nm. An example of the 193 nm resist material is an acrylate resist material.

Example 1

In a 22-liter flask 6497.86 grams solvent, 2633.78 grams TEOS, 1639.78 grams MTEOS, 958.97 grams 9-anthracene carboxy-methyl triethoxysilane, 119.24 grams 0.1 M nitric acid and 1425.58 grams deionized water were combined. The flask was refluxed and/or heated for 1 to 12 hours. To the solution, 932.80 grams of butanol and 20650.0 g of ethyl lactate was added. The acetone alone or the 2-propanol/acetone mixture that would have normally been used in the reaction is replaced with at least one replacement solvent. In one embodiment, a 2:1 mixture of ethanol/PGMEA is used as the at least one replacement solvent. In another embodiment, a 2:1 mixture of PGMEA/ethanol is used as the at least one replacement solvent. It is important to note that any of the compounds and/or mixtures found in Examples 6-21 can be substituted for the above-referenced compound. It is also important to note that even though Examples 6-21 deal with absorbing compounds and pH tuning agent addition, the pH tuning agent may be included or excluded along with the acetone-free situation described in this Example, in order to produce an absorbing composition such as those described herein.

Table 1 shows a preliminary aging study using the acetone-free and acetone/IPA-free mixtures. In Table 1, "POR" stands for the control, which used both acetone and IPA as solvents.

FIGS. 3-14 show the graphical representations of the preliminary aging data found in Table 1, including molecular weights, thickness, polydispersity and pH stability over a 7 day period of time.

Figure 15:
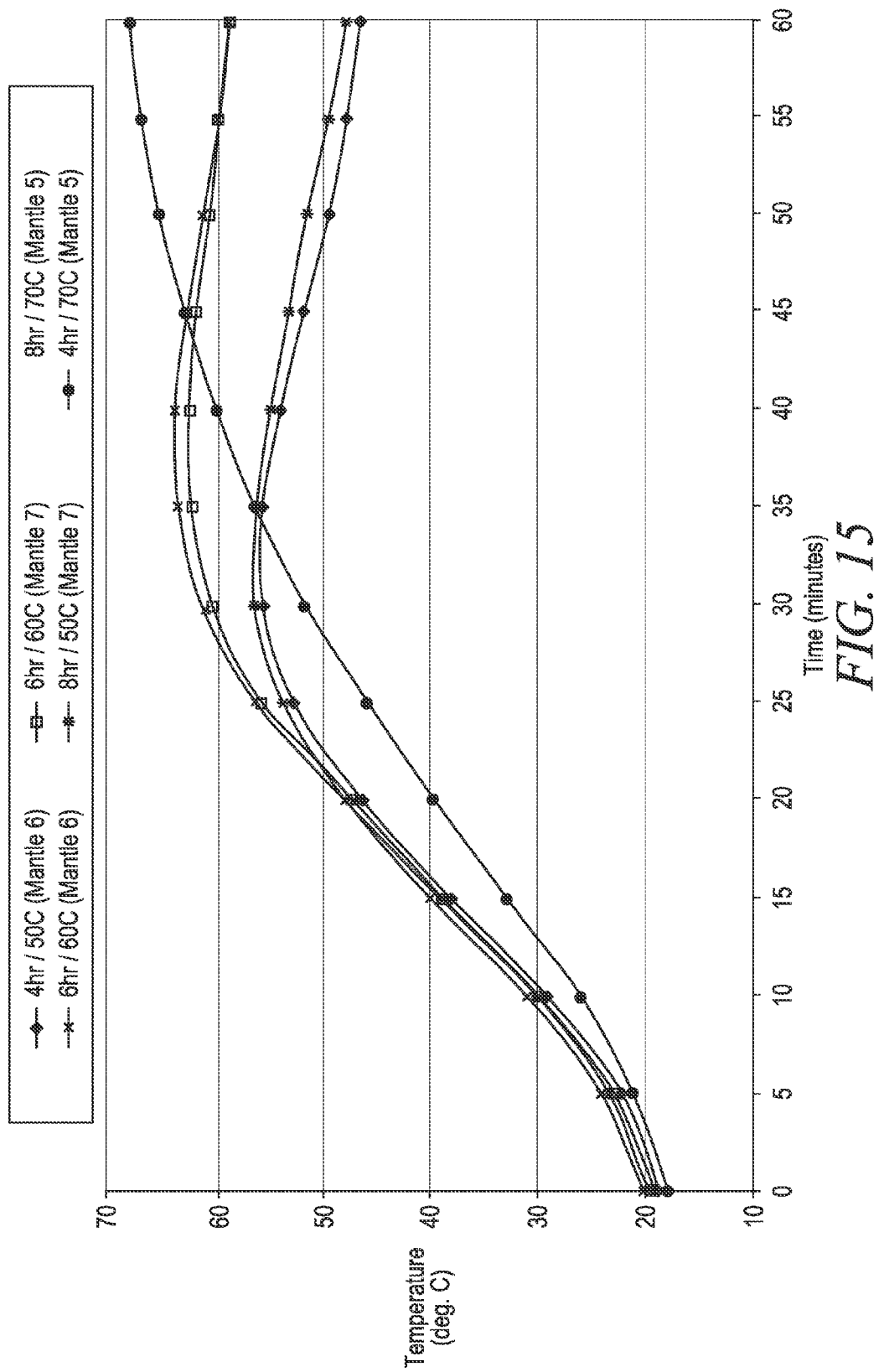
FIG. 15 graphically illustrates Temperature (° C.) v. Time (minutes) for a group of contemplated compounds.
Figure 16:
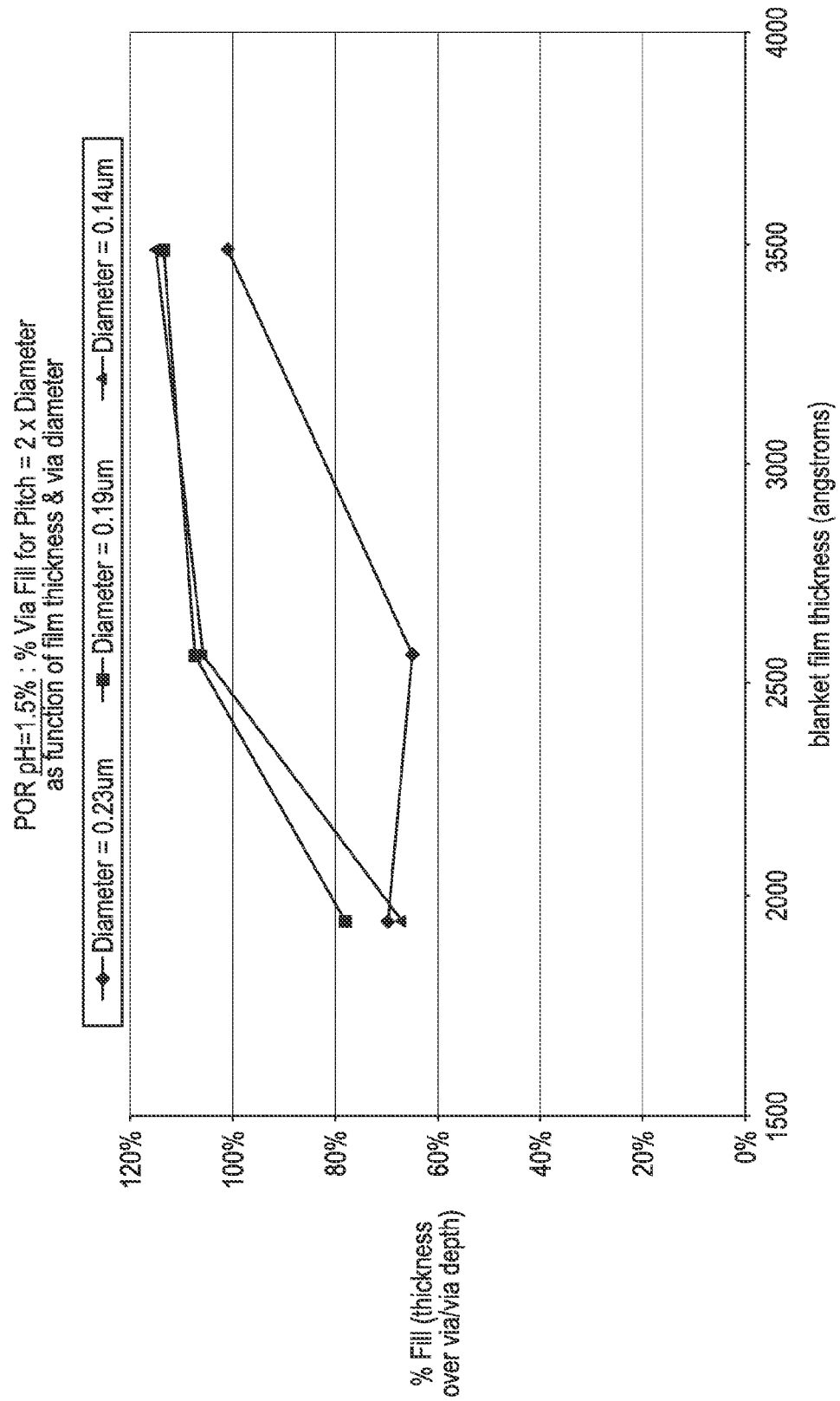
FIG. 16 graphically illustrates % Fill (Thickness over via/via depth) v. blanket film thickness (Angstroms) for a contemplated compound.
Figure 17:
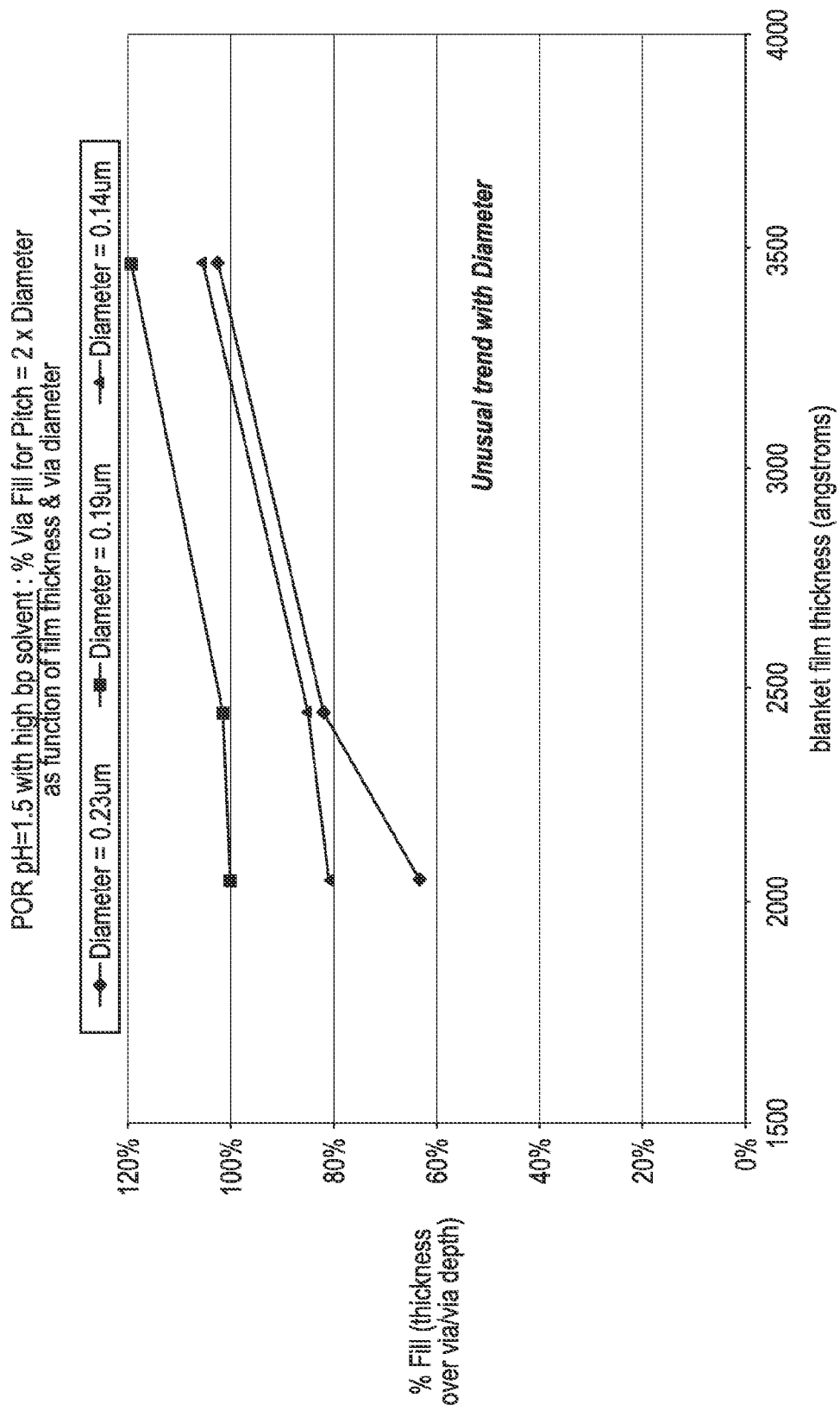
FIG. 17 graphically illustrates % Fill (Thickness over via/via depth) v. blanket film thickness (Angstroms) for a contemplated compound.
Figure 18:
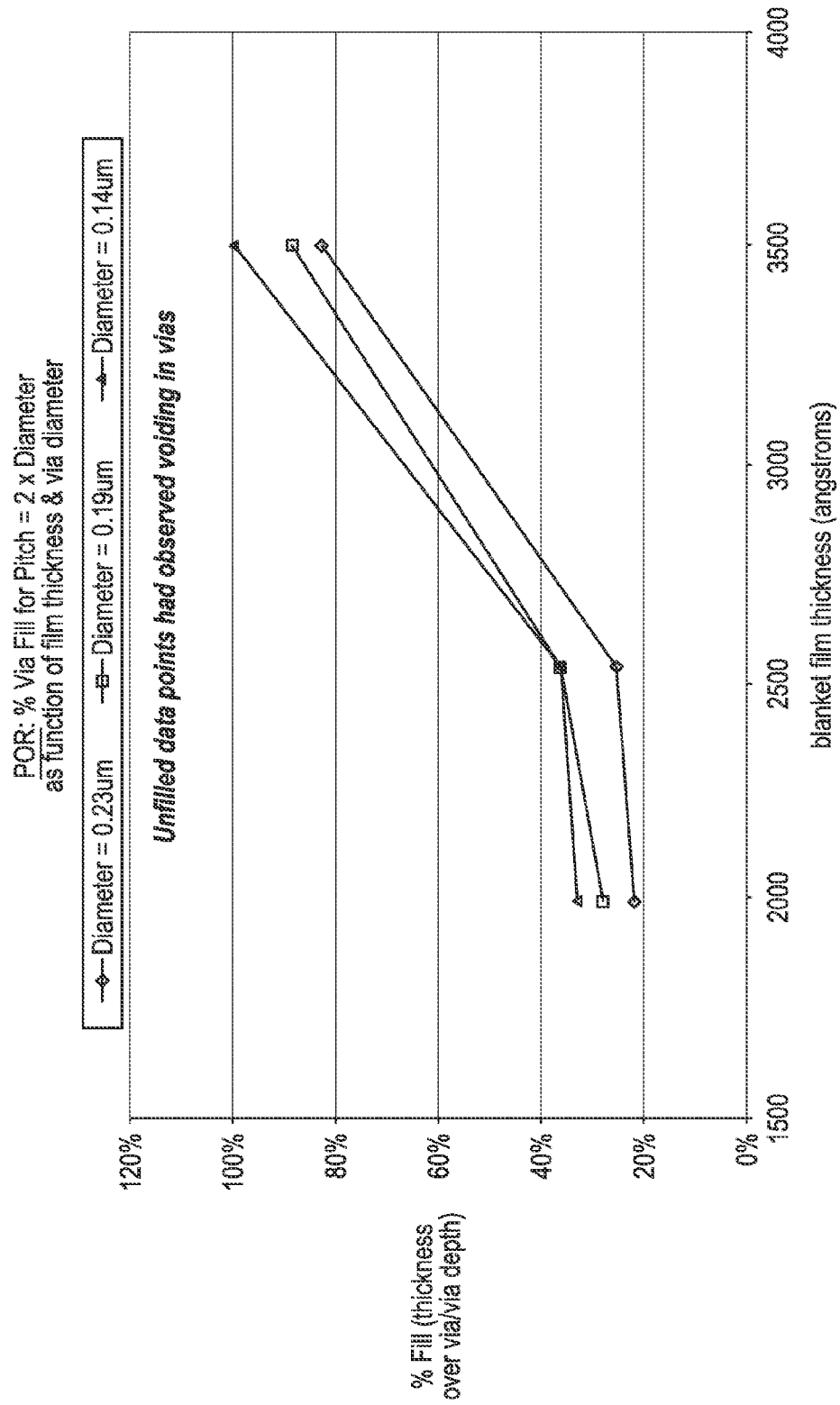
FIG. 18 graphically illustrates % Fill (Thickness over via/via depth) v. blanket film thickness (Angstroms) for a contemplated compound.
Figure 19:
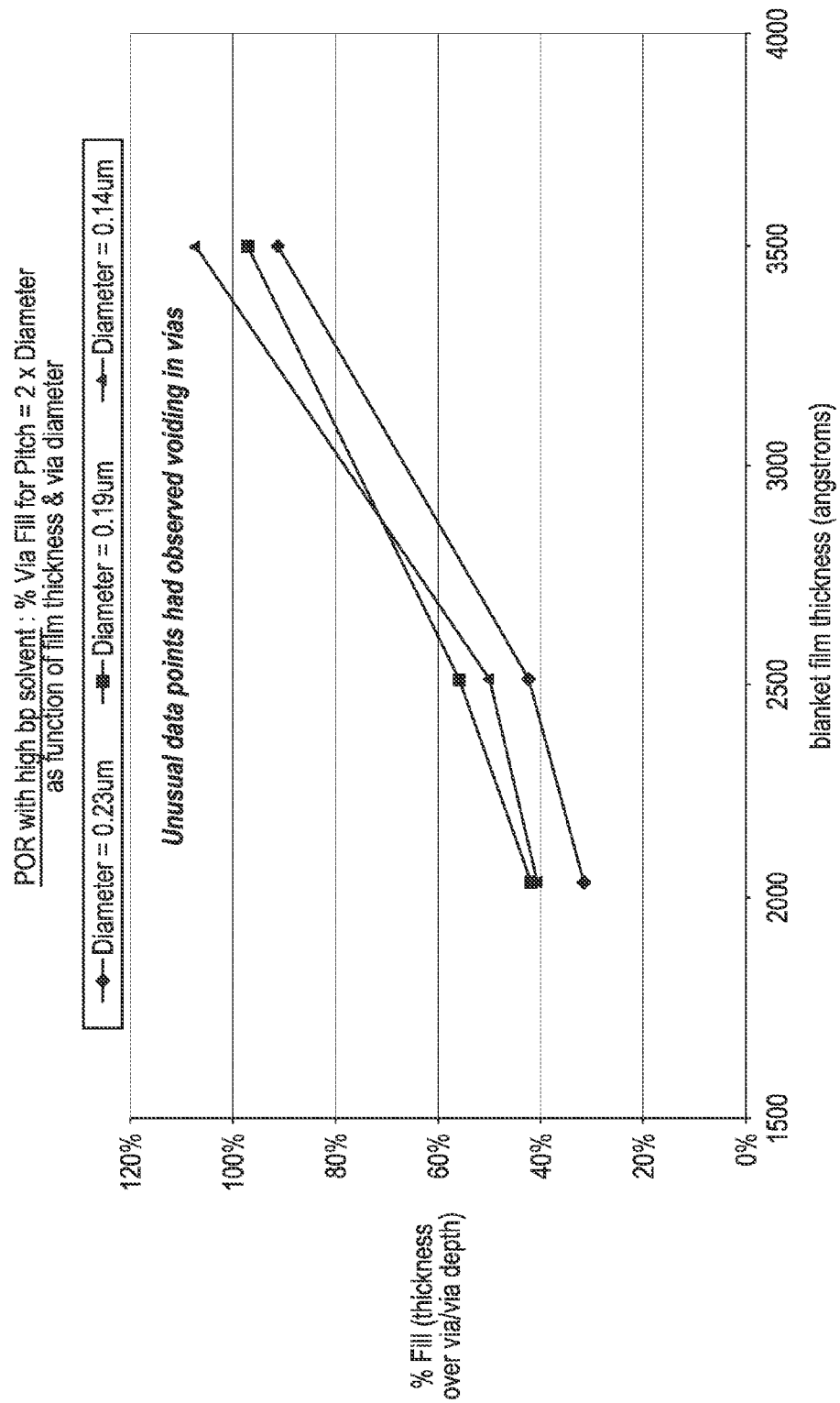
FIG. 19 graphically illustrates % Fill (Thickness over via/via depth) v. blanket film thickness (Angstroms) for a contemplated compound.
Figure 20:
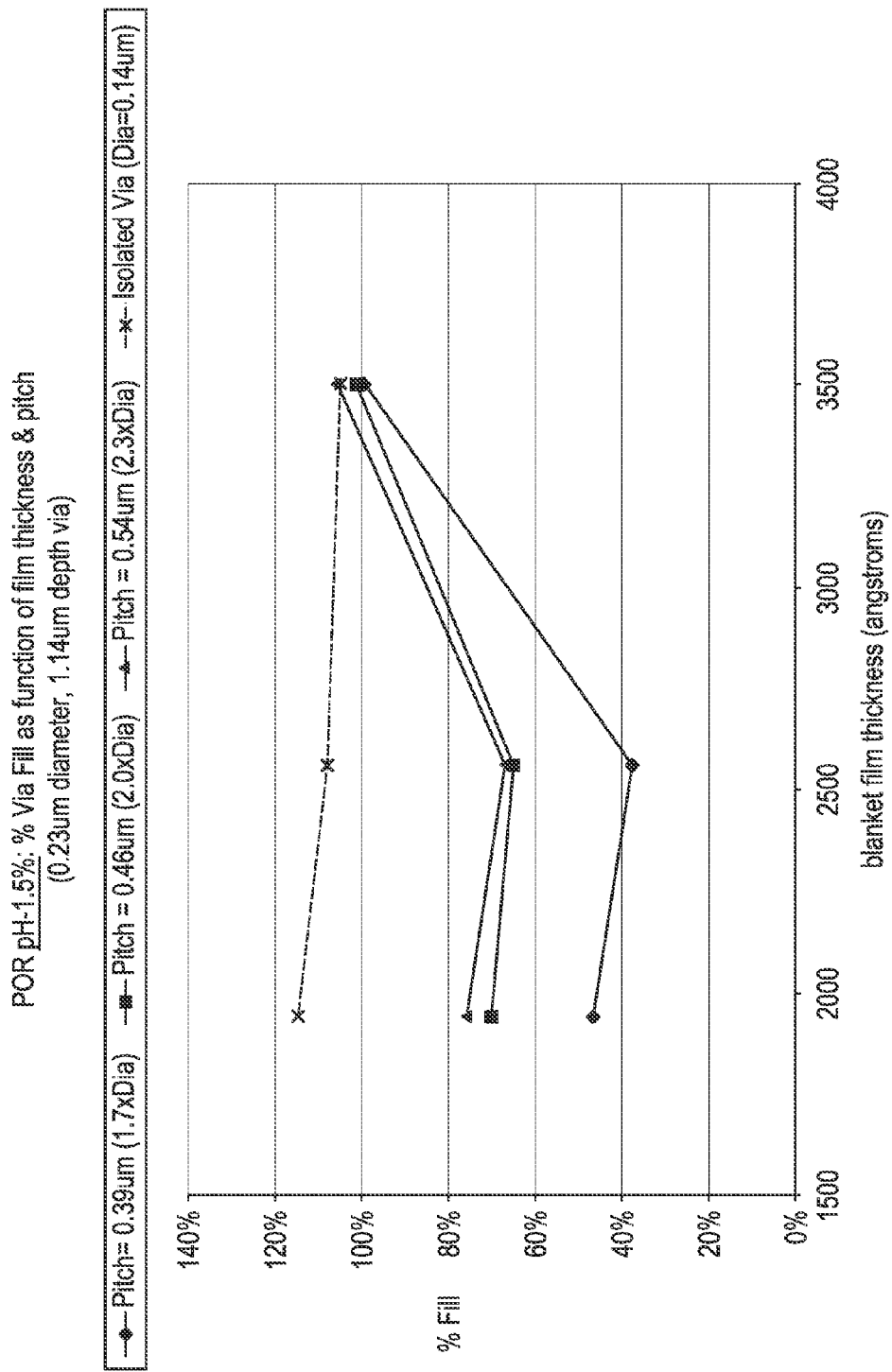
FIG. 20 graphically illustrates % Fill (Thickness over via/via depth) v. blanket film thickness (Angstroms) for a contemplated compound.
Figure 21:
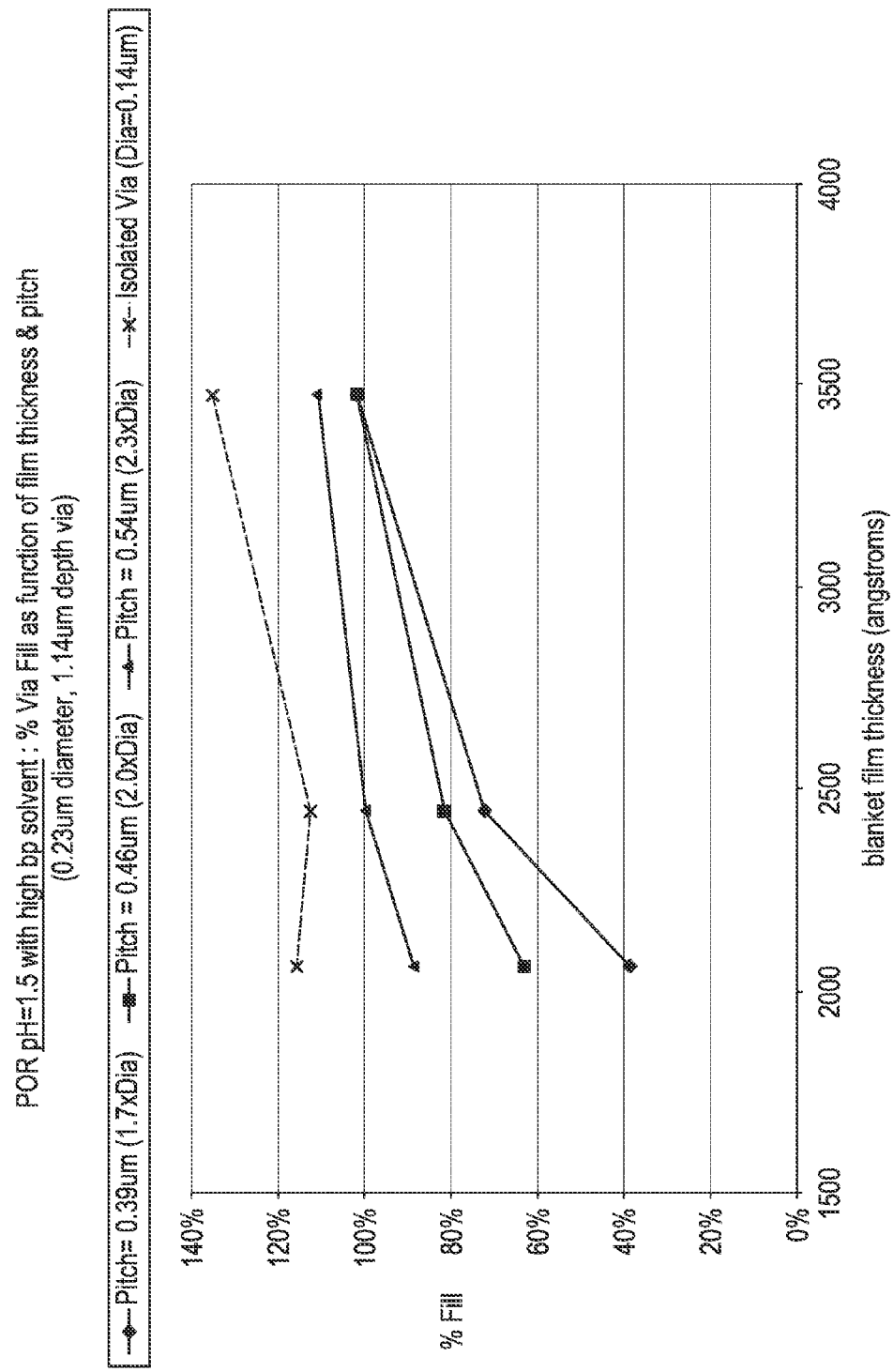
FIG. 21 graphically illustrates % Fill (Thickness over via/via depth) v. blanket film thickness (Angstroms) for a contemplated compound.
Figure 22:
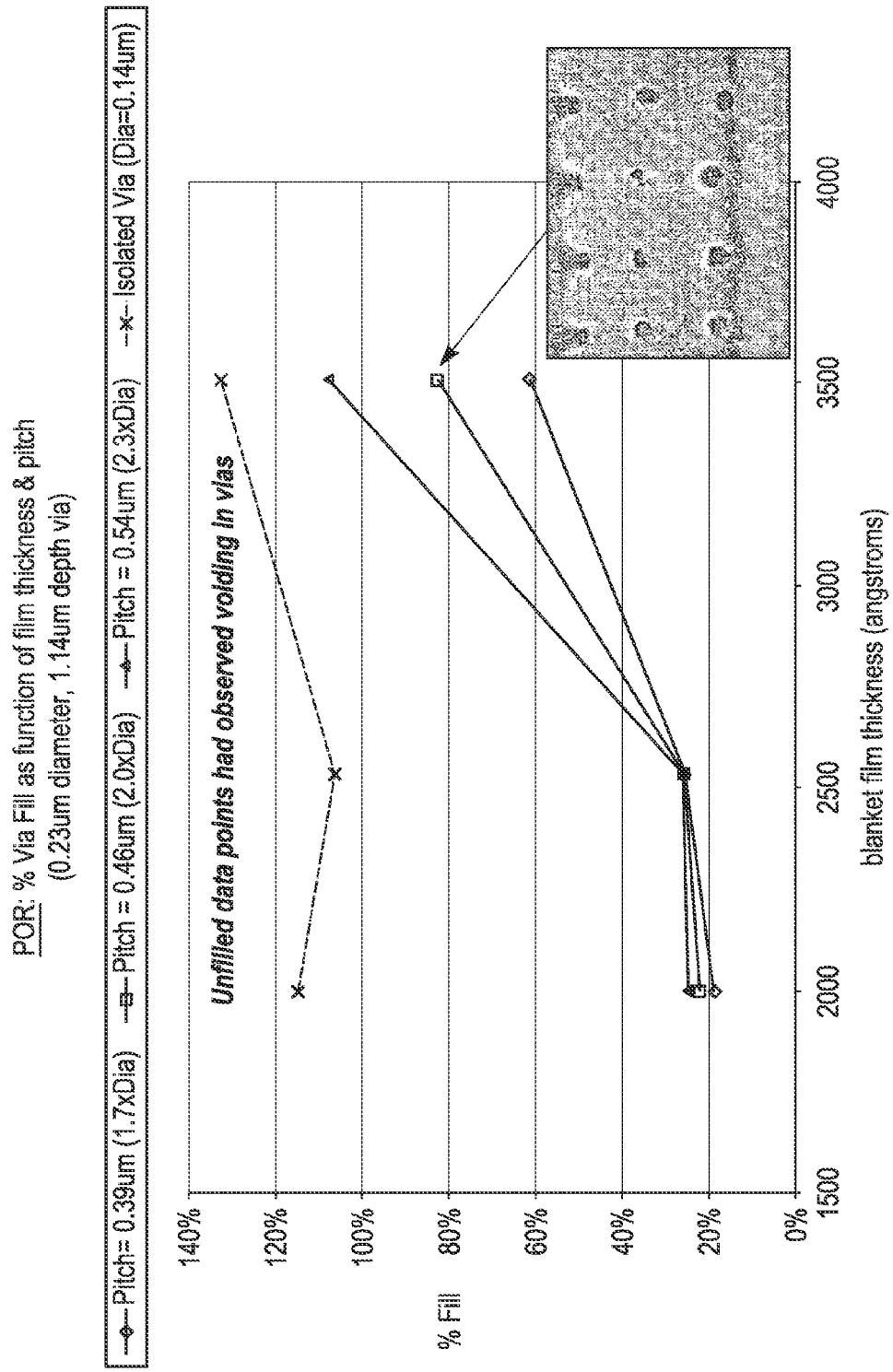
FIG. 22 graphically illustrates % Fill (Thickness over via/via depth) v. blanket film thickness (Angstroms) for a contemplated compound and also shows SEM data for one contemplated embodiment.
Figure 23:
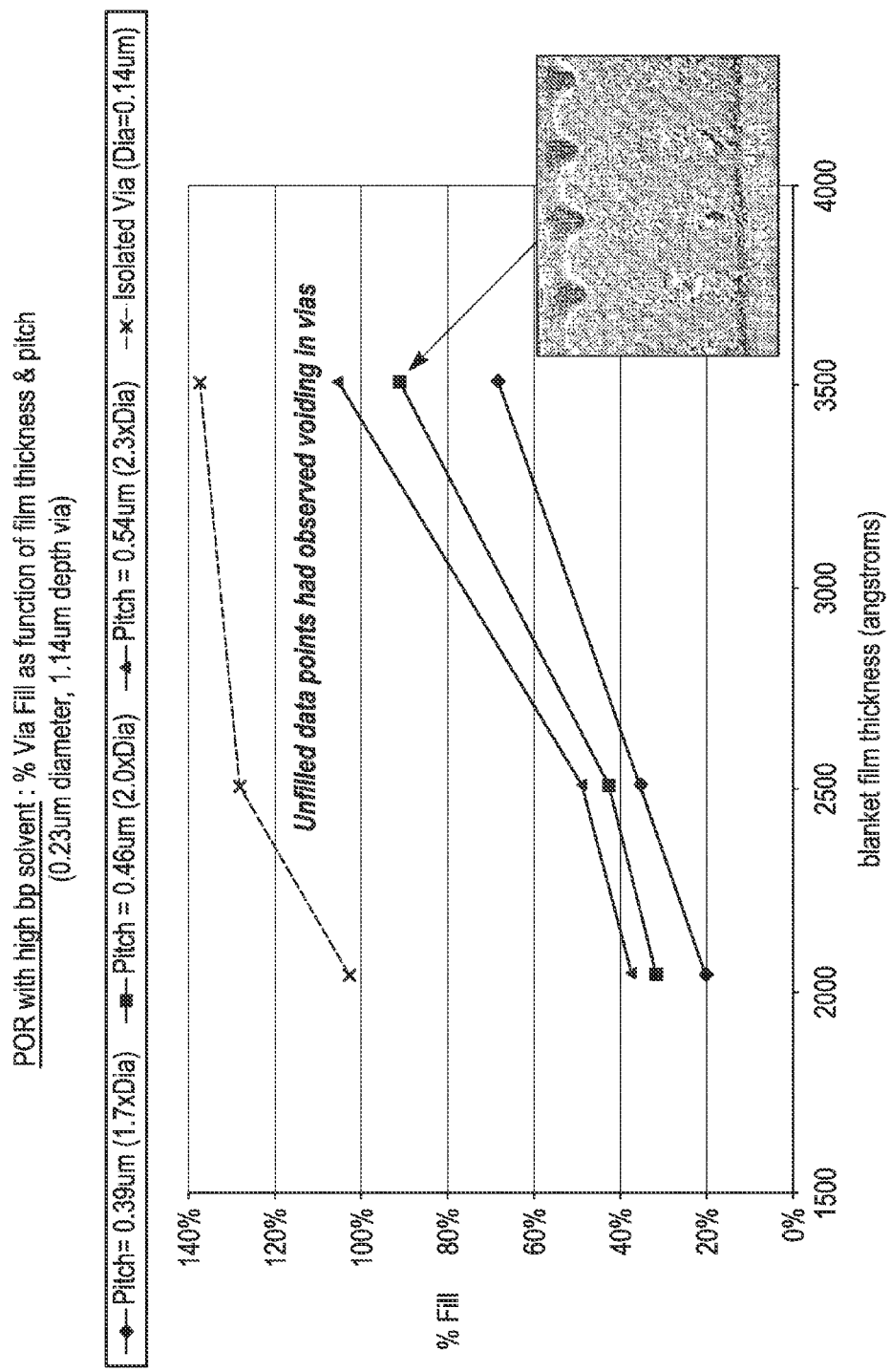
FIG. 23 graphically illustrates % Fill (Thickness over via/via depth) v. blanket film thickness (Angstroms) for a contemplated compound and also shows SEM data for one contemplated embodiment.
Figure 24:
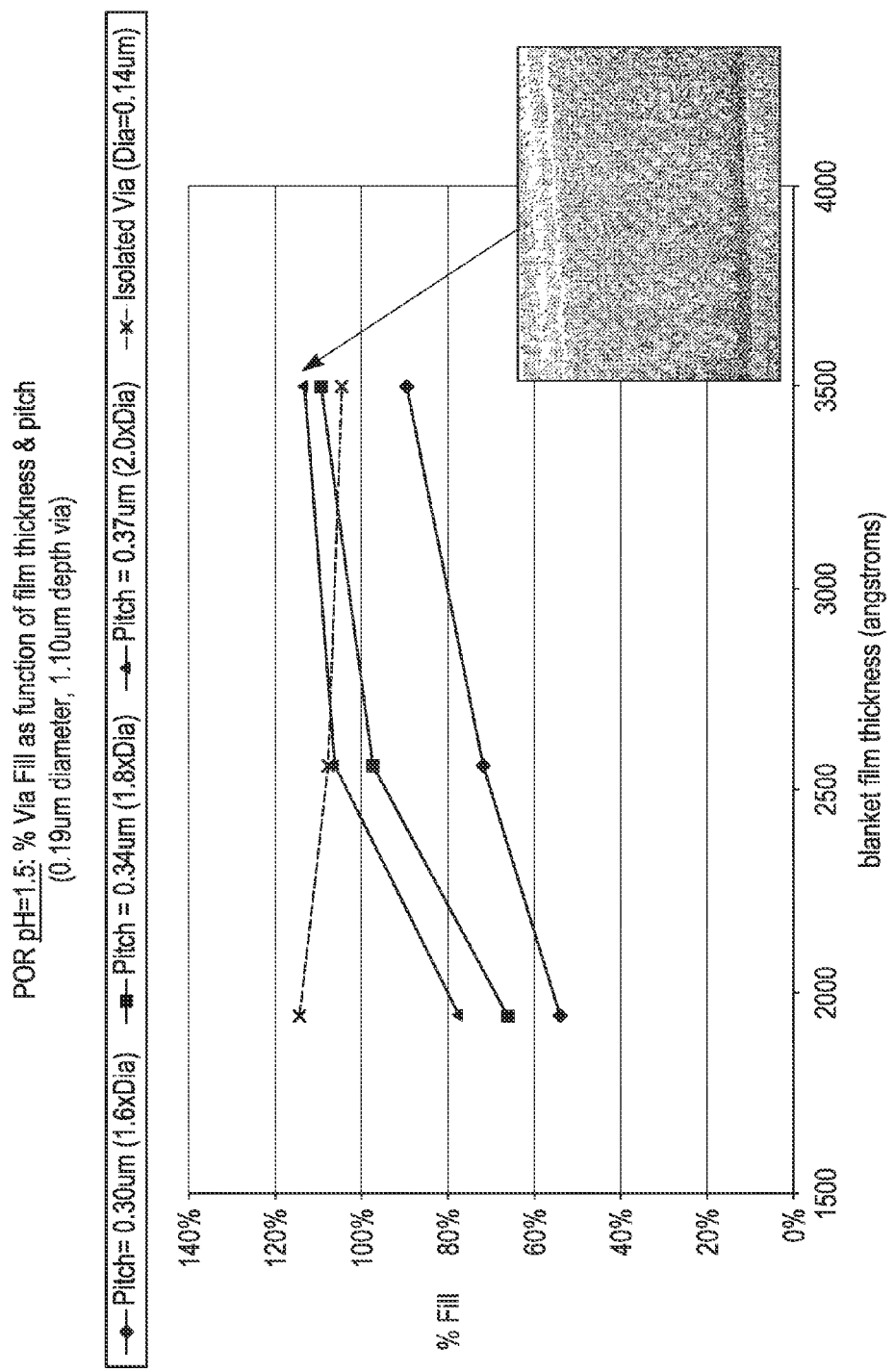
FIG. 24 graphically illustrates % Fill (Thickness over via/via depth) v. blanket film thickness (Angstroms) for a contemplated compound and also shows SEM data for one contemplated embodiment.
Figure 25:
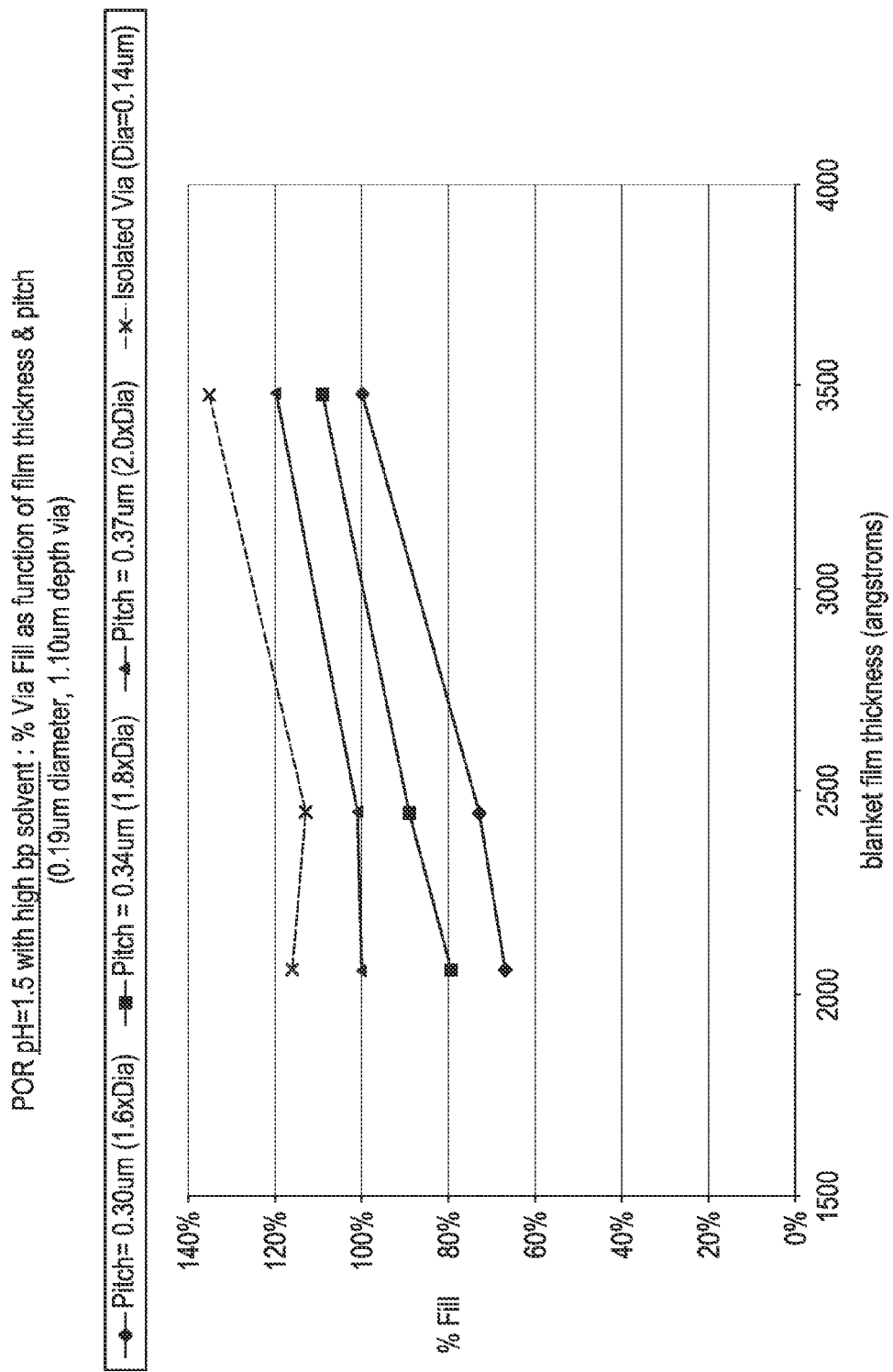
FIG. 25 graphically illustrates % Fill (Thickness over via/via depth) v. blanket film thickness (Angstroms) for a contemplated compound.
Figure 26:
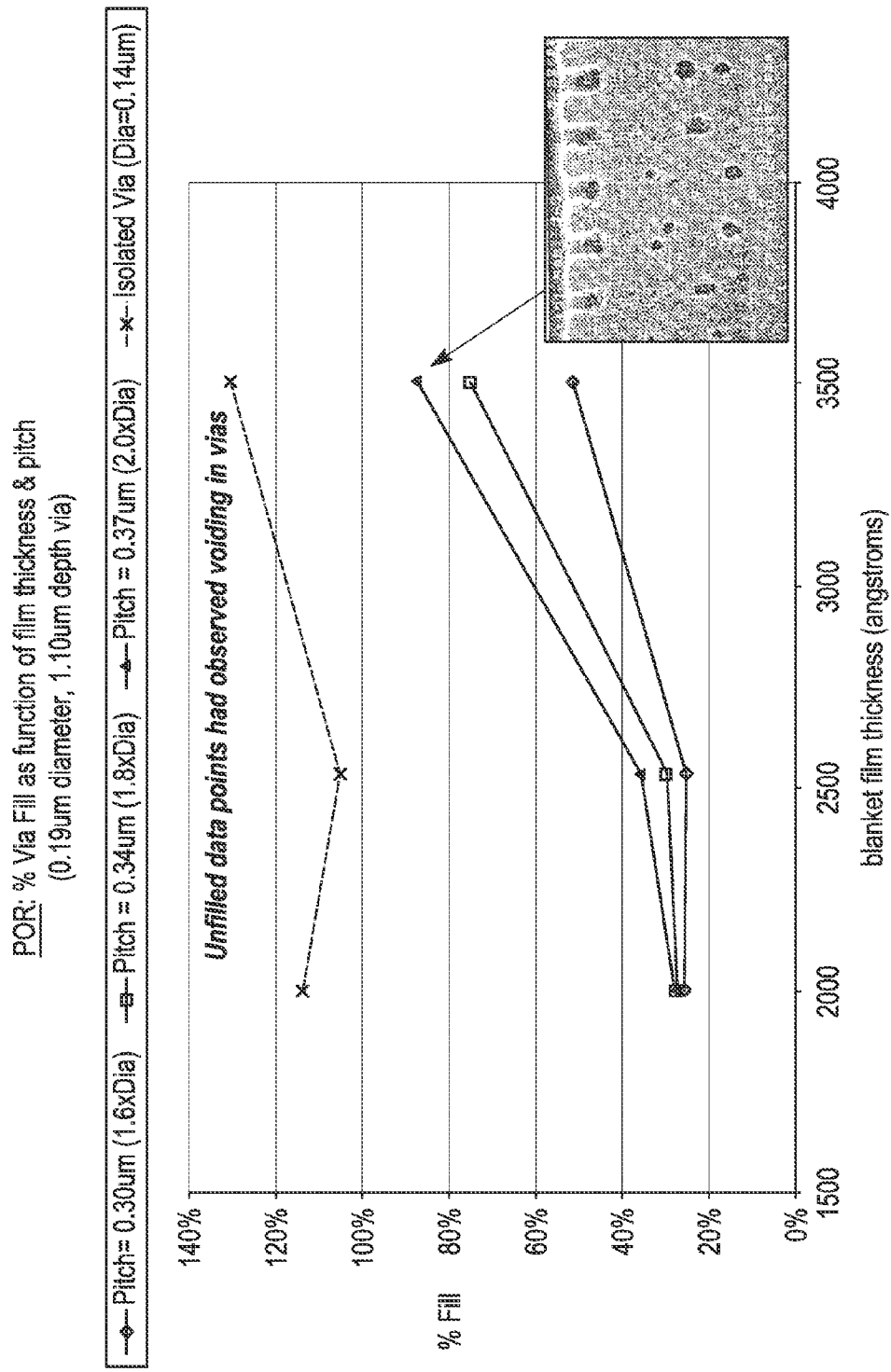
FIG. 26 graphically illustrates % Fill (Thickness over via/via depth) v. blanket film thickness (Angstroms) for a contemplated compound and also shows SEM data for one contemplated embodiment.
Figure 27:
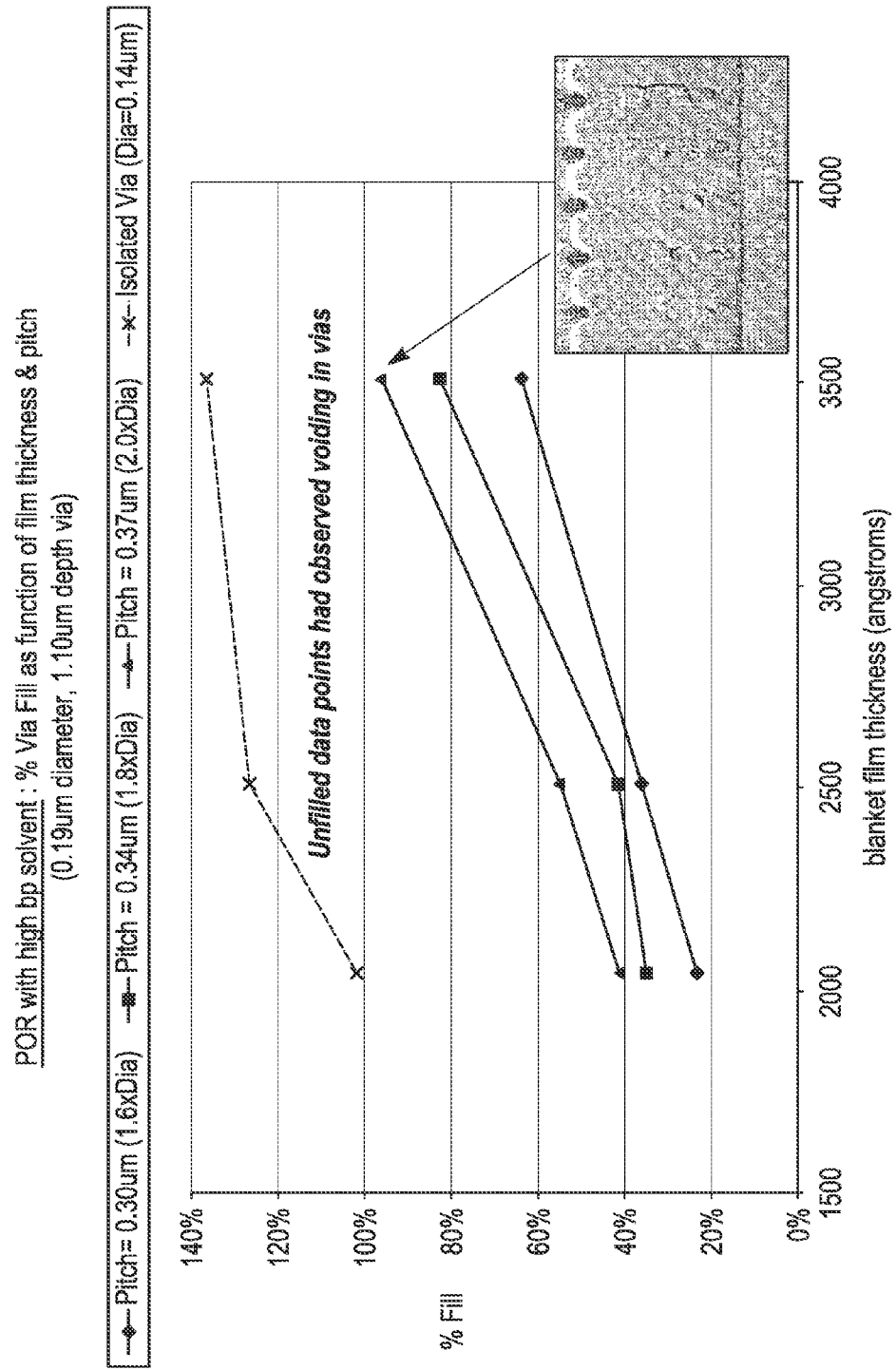
FIG. 27 graphically illustrates % Fill (Thickness over via/via depth) v. blanket film thickness (Angstroms) for a contemplated compound and also shows SEM data for one contemplated embodiment.

Table 2 shows the reflux time, temperature, gas chromotography information, thickness, optical properties, ratios of water, ethanol, butanol and PGMEA, density, pH and total percent solids for 6 "runs" of the above-referenced material. Table 3 shows the heat ramp data for those 6 runs (each run having a specific "Run ID" meaning a particular reflux time v. reflux temperature), and FIG. 15 shows the graphical representations of the time v. temperature for those 6 runs. The heat ramp experiments are designed to show how well the materials respond to applied heat. The temperature of the material is measured at specific time intervals as a constant heat is applied.

Example 2

In a 22-liter flask 6331.20 grams 2-propanol, 3166.66 grams solvent, such as acetone, 2633.78 grams TEOS, 1639.78 grams MTEOS, 958.97 grams 9-anthracene carboxy-methyl triethoxysilane, 119.24 grams 0.1 M nitric acid and 1425.58 grams deionized water were combined. The flask was refluxed and/or heated for 1 to 12 hours. To the solution, 932.80 grams of butanol and 20650.0 g of ethyl lactate was added. The material modification agent added for this set of examples was the at least one high boiling solvent, which was in this case glycerol. For this set of experimental data, 1% glycerol was added to the mixture to eliminate voiding and to improve the % via fill in the absorbing composition coating material. It is important to note that any of the compounds and/or mixtures found in Examples 6-21 can be substituted for the above-referenced compound. It is also important to note that even though Examples 6-21 deal with absorbing compounds and pH tuning agent addition, the pH tuning agent may be included or excluded along with the high boiling point solvent situation described in this Example, in order to produce an absorbing composition such as those described herein.

Figure 28:
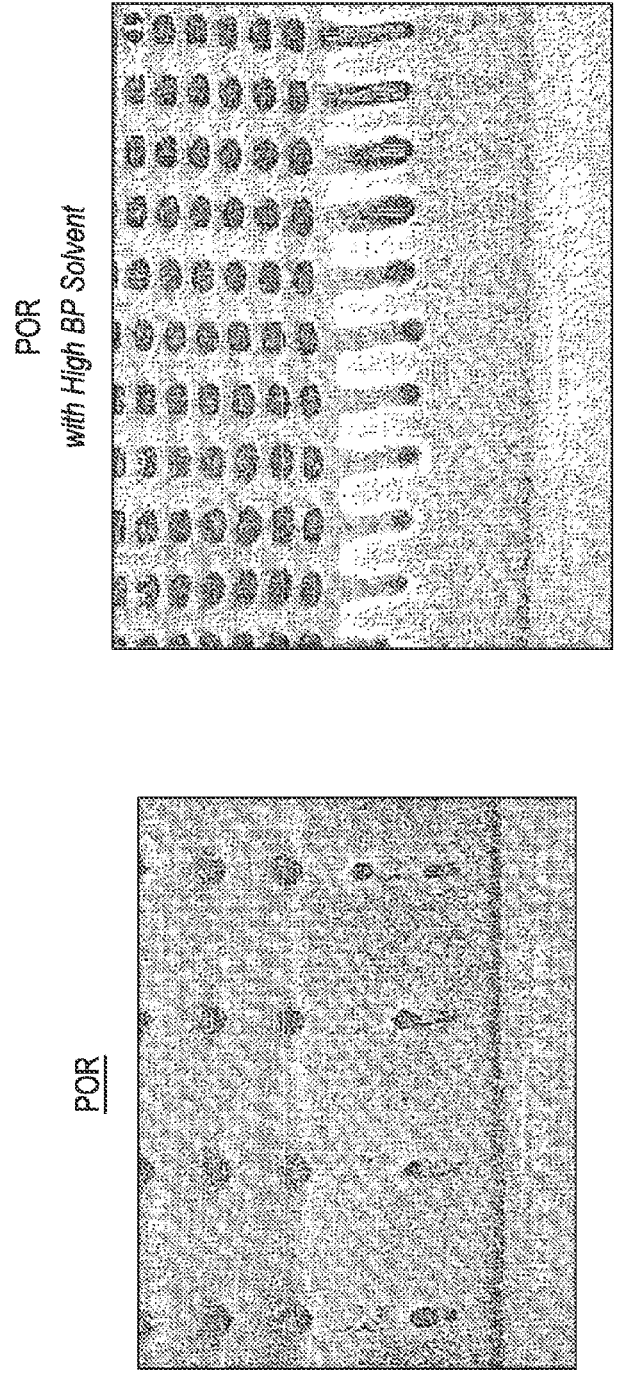
FIG. 28 shows SEM data for contemplated embodiments of the present subject matter.

Table 4 (parts 1 and 2) shows the summary of the via fill versus the thickness and pitch for control materials at different pH measurements versus the control materials plus the high boiling point solvents at different pH measurements. FIGS. 16-27 show the graphical representation of the data and resulting trends regarding blanket film thickness and % fill in Table 4 (parts 1 and 2). FIG. 28 shows the actual SEM data for a wafer with absorbing composition and a wafer with absorbing composition that further comprises a high boiling point solvent.

Example 3

In a 22-liter flask 6331.20 grams 2-propanol, 3166.66 grams acetone, 2633.78 grams TEOS, 1639.78 grams MTEOS, 958.97 grams 9-anthracene carboxy-methyl triethoxysilane, 119.24 grams 0.1 M nitric acid and 1425.58 grams deionized water were combined. The flask was refluxed and/or heated for 1 to 12 hours. The heating/refluxing time was divided into four relatively equal time intervals, and at each time interval TMEOS was added in 0.2 g, 0.5 g, 1 g and 5 g amounts respectively. To the solution, 20650.0 g of ethyl lactate was added. Also, in some of the embodiments 932.80 grams of butanol was added after the TMEOS addition was completed. The material modification agent added for this set of examples was the at least one capping agent, which was in this case TMEOS. It is important to note that any of the compounds and/or mixtures found in Examples 6-21 can be substituted for the above-referenced compound. It is also important to note that even though Examples 6-21 deal with absorbing compounds and pH tuning agent addition, the pH tuning agent may be included or excluded along with the high boiling point solvent situation described in this Example, in order to produce an absorbing composition such as those described herein.

The parents were aged for one week at 40° C. For the aged parent, time of addition of TMEOS was not significant to polymer molecular weight growth. The polymer molecular weight growth was smallest for the three aged parents where 5 g of TMEOS were added. For the three parents where 5 g of TMEOS were added (3 hrs into reflux, before butanol, after butanol), the GC showed a peak for TMEOS, except for the parent where TMEOS was added three hours into reflux. Five samples with the smallest polymer molecular weight growth slope were chosen as possible candidates. The parents chosen were all three samples with 5 g of TMEOS added, one sample with 1 g of TMEOS added 3 hrs into reflux, and one sample with 1 g of TMEOS added instead of butanol. The five parents were diluted to form the absorbing coating composition and aged for 1 week at 40° C. For the aged child, the polymer molecular weight growth was smallest for the three children where 5 g of TMEOS were added.

The polymer molecular weight growth may also be controlled and/or stopped by controlling the water content of the parent formulation, since a majority of the polymer molecular weight growth occurs upon dilution, regardless of the parent molecular weight. In some embodiments, the water was reduced by about 20%. Table 5 and Table 6 show the Parent and Child QC results from the water controlling experiments.

Figure 29:
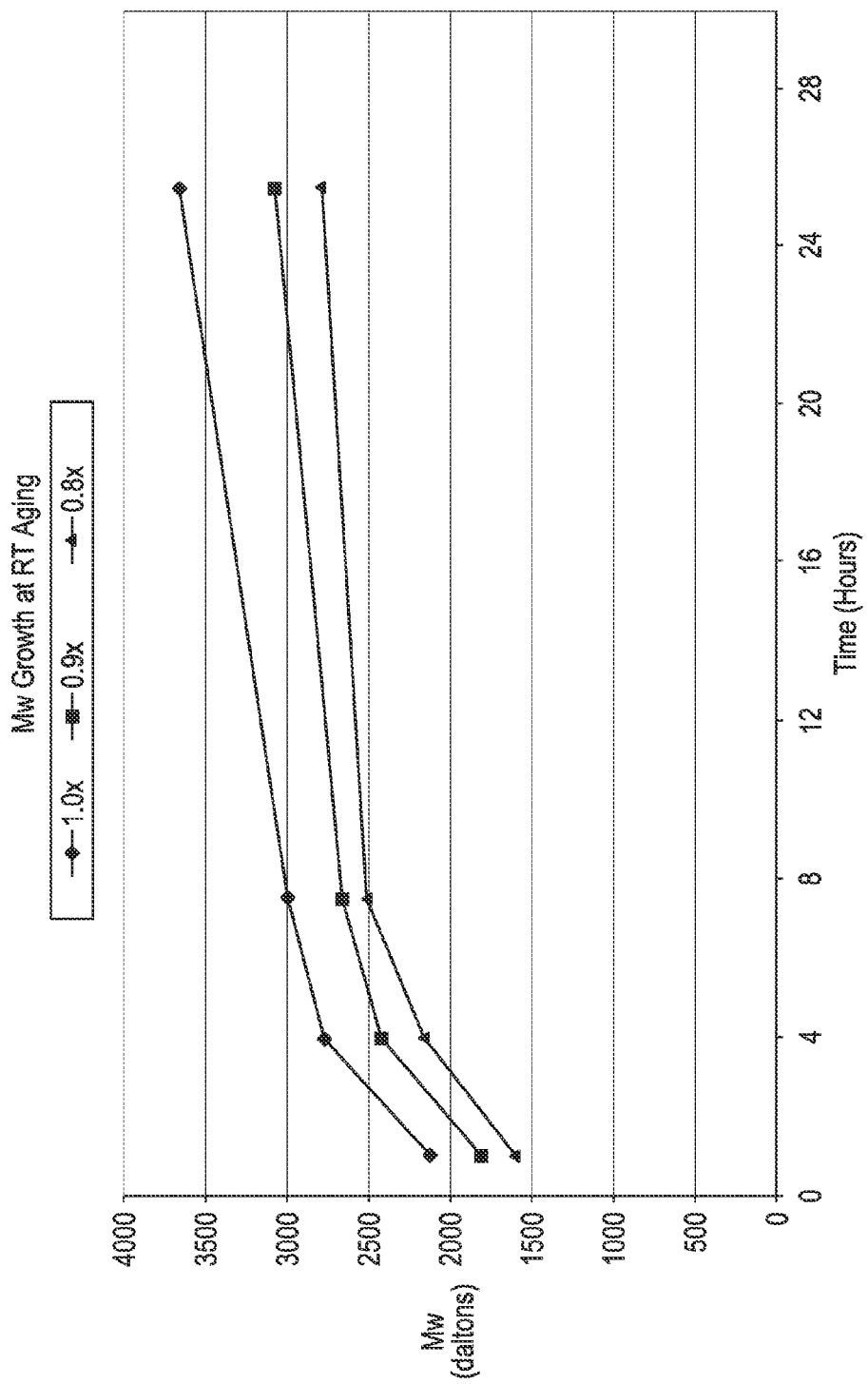
FIG. 29 graphically illustrates Mw (Daltons) v. Time (Hours) for several contemplated embodiments of the present subject matter.
Figure 30:
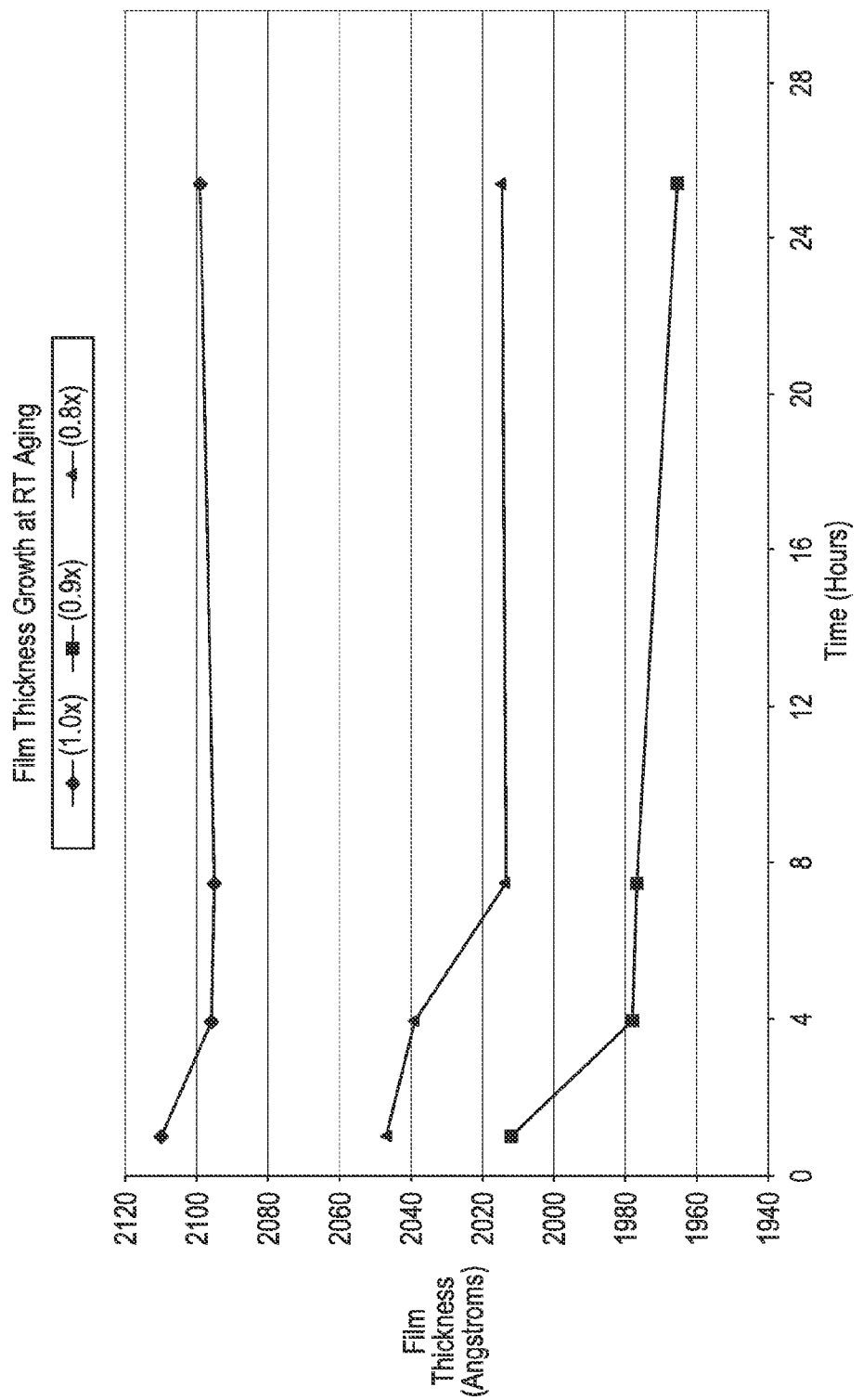
FIG. 30 graphically illustrates Film Thickness (Angstroms) v. Time (Hours) for several contemplated embodiments of the present subject matter.

FIGS. 29 and 30 show a graphical representation of the water controlling experiment data based on molecular weight versus time (hours).

Example 4

In a 22-liter flask 6331.20 grams 2-propanol, 3166.66 grams solvent, such as acetone, 2633.78 grams TEOS, 1639.78 grams MTEOS, 958.97 grams 9-arithracene carboxy-methyl triethoxysilane, 119.24 grams 0.1 M nitric acid and 1425.58 grams deionized water were combined. The flask was refluxed and/or heated for 1 to 12 hours. To the solution, 20650.0 g of ethyl lactate and 932.80 grams of butanol was added. The material modification agent added for this set of examples was either one specific agent, such as a replacement solvent or a combination of several agents, such as at least one leveling agent and at least one replacement solvent. It is important to note that any of the compounds and/or mixtures found in Examples 6-21 can be substituted for the above-referenced compound. It is also important to note that even though Examples 6-21 deal with absorbing compounds and pH tuning agent addition, the pH tuning agent may be included or excluded along with the high boiling point solvent situation described in this Example, in order to produce an absorbing composition such as those described herein. Table 7 shows the data collected for this example and FIG. 31 shows a graphical representation of some of this data—the delta thickness (isolated-dense).

In another related example, the viscosity of the absorbing composition was modified by the following procedure. The above-prepared absorbing composition that comprised a replacement solvent and no acetone was spun-on to a substrate at 2000 RPM a thickness of 3000 Å with BYK 306 surfactant present. About 2 grams of leveling and viscosity agents BYK 410, 420, 380 and/or 381 may be added. The surfactant may or may not be present in additional examples when the leveling and/or viscosity agents are added. The additive may be added to a child (already diluted like in the example above), they may be diluted further after the additive is added or not. Or the additive may be added to a parent and then either diluted or not. There may be only one additive added or we might combine the additives using more than one on a sample to get the combined effects. A range of dilution factors were used for 410, 420, 380, and 381 to test the effect on the properties. The main effect that we were looking for was via fill, as these samples were spun up on patterned wafers and looked at under the SEM.

For the data related to surfactants, the following summary applies:

| SURFACTANTS TESTED | |
|---|---|
| FC-4430 | (3M) |
| FC-4432 | (3M) |
| L-18459 | (3M) |
| Brij-30 | (Aldrich) |
| Brij-35 | (Aldrich) |
| Brij-58 | (Aldrich) |
| Brij-72 | (Aldrich) |
| Brij-76 | (Aldrich) |
| Brij-78 | (Aldrich) |
| Brij-98 | (Aldrich) |
| Brij-700 | (Aldrich) |
| PolycarboMethylSilane | (Aldrich) |
| Tergitol TMN-6 | (Dow) |
| Tergitol minifoam 2x | (Dow) |
| Tagopren-6870D | (Goldschmit) |
| Tagopren-5843 | (Goldschmit) |

SURFACTANTS TESTED

| | |
|---|---|
| Tagopren-5852 | (Goldschmit) |
| Tagopren-6871 | (Goldschmit) |
| Tagopren-7008 | (Goldschmit) |
| Tagopren-5884 | (Goldschmit) |
| Tagopren-5863 | (Goldschmit) |
| Tagopren-5851 | (Goldschmit) |
| Tagopren-5857 | (Goldschmit) |
| Tagopren-5040 | (Goldschmit) |
| Clarian surfactant | (Clarian) |
| BYK 306 | (BYK Chemie) |
| BYK 307 | (BYK Chemie) |
| BYK 320 | (BYK Chemie) |
| BYK 333 | (BYK Chemie) |

At this time, several of the above-listed surfactants are successfully being utilized to eliminate striations at various loading points. Data and observations for several of the surfactants utilized are presented below; however, these data and observations are not exhaustive of the studies conducted and do not represent all of the surfactants tested. For example, the following classes of surfactants were tested: polyacrylates (both ionic and non-ionic) (BYK brand surfactants), functional polydimethylsiloxanes (Tagopren brand surfactants), silicones, fluorinated alkylesters (FC brand surfactants), polyether and aliphatic hydrocarbon chain surfactants (Brij surfactants).

FC-4430

Five 200 mm samples were made with the loading range of 0.007 to 0.116 of FC-4430, and all were tested before and after filtration and the highest three loading were sent to Sunnyvale for testing on 8" wafers. All loadings had striations before and after filtration.

FC-4430 was then tested on 300 mm material loading range of 0.004 to 0.019. The striations were seen to decrease in severity as the loading increased with some wafers of loading 0.019 having no visible striations and other having visible striations.

FC-4430 300 mm samples with surfactant loading 0.015, 0.019, 0.023 at multiple spin speeds. There were striations seen on 0.015 and 0.019 loading wafers and some of the 0.023 loading wafers had visible striations and others didn't.

FC-4432

FC-4432 in 200 mm Sample loading 0.004 to 0.2, sample loading 0.08 and 0.1 had no striations visible so samples were sent to Sunnyvale along with std 200 mm material to be spun on 8" wafers and similarly no striations were visible, dewetting was noticeable on 0.1 loading sample. No filtration was done to eliminate and filtration interactions.

FC-4432 was tested in 200 mm and 300 mm in loadings from 0.004 to 0.11 in small increments to determine the lowest concentration that the FC-4432 worked to eliminate striations. The loading was found to be 0.005 in 300 mm and 0.04 in 200 mm. No filtration was done to eliminate filtration interactions.

FC-4432 the samples loadings that worked in the previous samples were repeated with larger sample sizes and half was filtered and half was unfiltered. 200 mm material had loading 0.03 to 0.06. 300 mm had loadings of 0.04 to 0.06. The filtered samples required a slightly higher surfactant loading than the unfiltered to eliminate striations.

Tagopren 5884

Tagopren 5884 was tested in 300 mm with loadings of 0.006 to 0.11. None of the wafers had striations however there was a large thickness variation around the edge of the wafer.

Tagopren 5884 was mixed with other surfactants that did not have a large edge thickness variation, Tagopren 5851 and 5857 and FC-4430, to determine if mixing could create no striations and no edge thickness variation. The edge thickness variation was not eliminated.

Tagopren 5884 was used in the same loading that worked in earlier experiments (Loading 0.004, 0.006, and 0.008). The samples were made and filtered, none had striations.

Tagopren 5863

Tagopren 5863 was tested in 300 mm with loadings of 0.006 to 0.11. Samples with a loading of 0.015 or higher did not show striations, samples with a loading lower than 0.015 did have striations. There was a large thickness variation around the edge of the wafer.

Tagopren 5863 was mixed with other surfactants that did not have a large edge thickness variation, Tagopren 5851 and 5857, to determine if mixing could create no striations and no edge thickness variation. The edge thickness variation was not eliminated.

Tagopren 5863 was used in the same loading that worked in earlier experiments (Loading 0.015, 0.017, and 0.019). The sample with loading 0.019 did not have striations, the 0.015 and 0.017 had a few striations however did not show the striation pattern.

Tagopren 5851, and 5857

Tagopren 5851 and 5857 were tested in 300 mm with loadings of 0.006 to 0.11. All wafers spun had visible striations. There was not a large thickness variation around the edge of the wafer.

Tagopren 5851 and 5857 were mixed with other surfactants that did not have striations to see if these surfactants would eliminate the edge thickness variation seen in other Tagopren samples to determine if mixing could create no striations and no edge thickness variation. Edge thickness variation was visible on the mixed surfactant samples.

L-18459

This sample was tested in a 10% solution of EL and tested at loadings of 0.003 to 0.02 and wafers at loadings of 0.005 and above showed no striations.

Example 5

One of the best ways to improve the etching selectivity and/or stripping selectivity of the absorbing composition, as mentioned earlier, is increasing the surface area through the addition of a porogen to the material and then creating pores after the application of energy.

In a 22-liter flask 6331.20 grams 2-propanol, 3166.66 grams acetone, 2633.78 grams TEOS, 1639.78 grams MTEOS, 958.97 grams 9-anthracene carboxy-methyl triethoxysilane, 119.24 grams 0.1 M nitric acid and 1425.58 grams deionized water were combined. The flask was refluxed and/or heated for 1 to 12 hours. To the solution, 20650.0 g of ethyl lactate and 932.80 grams of butanol was added. The material modification agent added for this set of examples was at least one porogen, such as poly(ethylene oxide) (PEO) or poly(propylene oxide) (PPO). It is important to note that any of the compounds and/or mixtures found in Examples 6-21 can be substituted for the above-referenced compound. It is also important to note that even though Examples 6-21 deal with absorbing compounds and pH tuning agent addition, the pH tuning agent may be included or excluded along with the high boiling point solvent situation described in this Example, in order to produce an absorbing composition such as those described herein. Table 8 shows a set of experiments conducted using the absorbing compound in this example. Again, it should be noted that any one of the absorbing compositions can be substituted in these experiments. In Table 8, the following abbreviations are used:

PEO=poly(ethylene oxide); TMAA=tetramethylammonium acetate; TMAH=etching solution at 2.3% and 23° C.

TABLE 8

| Added to 248 nm absorbing compound | PEO Loading | TMAA Loading | Bake Temps (° C.) | Pre-TMAH Dip Thickness Before (Angstroms) | Error | Post-TMAH Dip Thickness After (Angstroms) | Error' | Change in Thickness |
|---|---|---|---|---|---|---|---|---|
| Control | 0 | 0 | 130/250/300 | 1306.11 | 8.077 | 1323.22 | 5.544 | 17.11 |
| 0.025 PEO | 0.025 | 0 | 130/250/300 | 1337.9 | 3.966 | 1320.23 | 5.943 | −17.67 |
|  | 0.025 | 0 | 130/200/250 | 1387.44 | 6.154 | 1313.27 | 6.501 | −74.17 |
| 0.025PEO 0.0004 TMAA | 0.025 | 0.0004 | 130/250/300 | 1443.24 | 5.109 | 1433.17 | 11.474 | −10.07 |
|  | 0.025 | 0.0004 | 130/200/250 | 1453.95 | 6.319 | 1451.52 | 4.405 | −2.43 |
|  | 0.025 | 0.0004 | 130/250/300 | 1444.83 | 3.722 | 1430.99 | 7.652 | −13.84 |
|  | 0.025 | 0.0004 | 130/200/250 | 1447.68 | 11.305 | 1520.1 | 5.492 | 72042 |
| 0.025 PEO 0.0008 TMAA | 0.025 | 0.0008 | 130/250/300 | 1449.61 | 5.359 | 1439.04 | 7.335 | −10.57 |
|  | 0.025 | 0.0008 | 130/200/250 | 1459.76 | 4.681 | 1460.35 | 5.609 | 0.59 |
| 0.025 PEO 0.0012 TMAA | 0.025 | 0.0012 | 130/250/300 | 1449.66 | 3.589 | 1445.21 | 9.189 | −4.45 |
|  | 0.025 | 0.0012 | 130/200/250 | 1453.16 | 8.004 | 1461.43 | 4.365 | 8.27 |
|  | 0.025 | 0.0012 | 130/250/300' | 1450.41 | 4.333 | 1444.04 | 8.872 | −6.37 |
|  | 0.025 | 0.0012 | 130/200/250 | 1464.64 | 6.23 | 1452.44 | 5.895 | −12.2 |
| 0.01 PEO | 0.01 | 0 | 130/250/300 | 1420.51 | 4.607 | 1350.19 | 5.369 | −70.32 |
|  | 0.01 | 0 | 130/200/250 | 1500.26 | 4.078 | 1501.14 | 4.926 | 0.88 |
| 0.01 PEO 0.0004 TMAA | 0.01 | 0.0004 | 130/250/300 | 1566.8 | 5.655 | 1465.9 | 8.667 | −100.9 |
|  | 0.01 | 0.0004 | 130/200/250 | 1590.99 | 5.982 | 44.32 | 78.299 | −1546.67 |
| 0.01 PEO 0.0008 TMAA | 0.01 | 0.0008 | 130/250/300 | 1584.02 | 5.874 | 1488.89 | 8.474 | −95.13 |
|  | 0.01 | 0.0008 | 130/200/250 | 1601.38 | 5.655 | 1479.67 | 4.406 | −121.71 |
| 0.01 PEO 0.0012 TMAA | 0.01 | 0.0012 | 130/250/300 | 1588.45 | 6.463 | 1495.91 | 8.531 | −92.54 |
|  | 0.01 | 0.0012 | 130/200/250 | 1608.47 | 6.685 | 1504.56 | 5.171 | −103.91 |
| 0.05 PEO | 0.05 | 0 | 130/250/300 | 1375.22 | 8.297 | 1341.01 | 6.316 | −34.21 |
|  | 0.05 | 0 | 130/200/250 | 1426.35 | 7.529 | 1293.13 | 7.829 | −133.22 |
| 0.05 PEO 0.0004 TMAA | 0.05 | 0.0004 | 130/250/300 | 1492.67 | 6.268 | 1463.57 | 10.238 | −29.1 |
|  | 0.05 | 0.0004 | 130/200/250 | 1508.78 | 4.395 | 1293.13 | 7.829 | −215:65 |
|  | 0.05 | 0.0004 | 130/250/300 | 1491.96 | 6.696 | 1460.68 | 8.451 | −31.28 |
|  | 0.05 | 0.0004 | 130/200/250 | 1514.64 | 5.787 | 1488.56 | 8.167 | −26.08 |
| 0.05 PEO 0.0008 TMAA | 0.05 | 0.0008 | 130/250/300 | 1502.61 | 5.237 | 1475.98 | 6.47 | −26.63 |
|  | 0.05 | 0.0008 | 130/200/250 | 1515.99 | 4.985 | 1483.06 | 3.413 | −32.93 |
| 0.05 PEO 0.0012 TMAA | 0.05 | 0.0012 | 130/250/300 | 1503.28 | 5.771 | 1475.95 | 6.665 | −27.33 |
|  | 0.05 | 0.0012 | 130/200/250 | 1516.91 | 4.53 | 1495.9 | 3.86 | −21.01 |
|  | 0.05 | 0.0012 | 130/250/300 | 1498.59 | 6.526 | 1472.97 | 8.438 | −25.62 |
|  | 0.05 | 0.0012 | 130/200/250 | 1522.47 | 7.068 | 1505.01 | 6.411 | −17.46 |

Example 6

Synthesis of an Absorbing Material Containing 9-anthracene carboxy-methyl Triethoxysilane and a pH Tuning Agent In a 22-liter flask 6331.20 grams 2-propanol, 3166.66 grams acetone 2633.78 grams TEOS, 1639.78 grams MTEOS, 958.97 grams 9-anthracene carboxy-methyl triethoxysilane, 119.24 grams 0.1 M nitric acid and 1425.58 grams deionized water were combined. The flask was refluxed and/or heated for 1 to 12 hours. To the solution, 932.80 grams of butanol and 20650.0 g of ethyl lactate was added. The solution was filtered to be used in the pH tuning experiments. A pH tuning agent, 0.1 M nitric acid, was added to 2 separate solutions of 650 g of the spin-on material that has a starting pH of about 1.5. The nitric acid was added in the following amounts and gave the following pH: a) 2.794 g (pH=0.7); b) 0.293 g (pH=0.75). APTEOS was added to two additional and separate solutions of 650 g of the same spin-on material in the following amounts giving the following pH values: a) 0.053 g (pH=4.13); b) 0.151 g (pH=5.47). The solutions were then dispensed, followed by a 3000 rpm thickness spin for 20 seconds, and baked at 80° C. and at 180° C. for one minute each. Optical properties were measured with an N & K Technology Model 1200 analyzer. The film thickness was 1402.17 Å. At 248 nm, the refractive index (n) was 1.47 and the extinction coefficient (k) was 0.429. The same spin and bake process parameters and measurement technique was used in all of the following examples.

Synthesis of Another Absorbing Material Containing 9-anthracene carboxy-methyl Triethoxysilane and pH Tuning Agent In a 1-liter flask 297 grams 2-propanol, 148 grams acetone, 123 grams TEOS, 77 grams MTEOS, 60 grams 9-anthracene carboxy-methyl triethoxysilane, 0.6 grams 0.1 M nitric acid and 72 grams deionized water were combined. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer. The film thickness was 1635 Å. At 248 nm, the refractive index (n) was 1.373 and the extinction coefficient (k) was 0.268. It should be appreciated, however, that the refractive index and extinction coefficient data for this example and all, of the following and contemplated examples could change depending on the purity of the initial reactants and starting compounds. The same spin and bake process parameters and measurement technique was used in all of the following examples.

Synthesis of Absorbing Material Containing 9-anthracene carboxy-methyl Triethoxysilane and pH Tuning Agent In a 1-liter flask 297 grams 2-propanol, 148 grams acetone, 123 grams TEOS, 77 grams MTEOS, 60 grams 9-anthracene carboxy-methyl triethoxysilane, 0.6 grams 0.01 M nitric acid and 72 grams deionized water were combined. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer. The film thickness was 1635 Å. At 248 nm, the refractive index (n) was 1.373 and the extinction coefficient (k) was 0.268.

Synthesis of Absorbing Material Containing 9-anthracene carboxy-methyl Triethoxysilane and pH Tuning Agent In a 1-liter flask 297 grams 2-propanol, 148 grams acetone, 123 grams TEOS, 77 grams MTEOS, 60 grams 9-anthracene carboxy-methyl triethoxysilane, 0.6 grams 1.0 M nitric acid and 72 grams deionized water were combined. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer. The film thickness was 1635 Å.

Synthesis of Absorbing Material Containing 9-anthracene carboxy-methyl Triethoxysilane and pH Tuning Agent In a 1-liter flask 297 grams 2-propanol, 148 grams acetone, 123 grams TEOS, 77 grams MTEOS, 60 grams 9-anthracene carboxy-methyl triethoxysilane, 0.6 grams 0.1 M nitric acid and 100 grams deionized water were combined. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer. The film thickness was 1635 Å.

Synthesis of Absorbing Material Containing 9-anthracene carboxy-methyl Triethoxysilane and pH Tuning Agent In a 1-liter flask 297 grams 2-propanol, 148 grams acetone, 123 grams TEOS, 77 grams MTEOS, 60 grams 9-anthracene carboxy-methyl triethoxysilane, 0.6 grams 0.1 M nitric acid and 130 grams deionized water were combined. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer. The film thickness was 1635 Å.

Synthesis of Absorbing Material Containing 9-anthracene carboxy-methyl Triethoxysilane and pH Tuning Agent In a 1-liter flask 297 grams 2-propanol, 148 grams acetone, 123 grams TEOS, 77 grams MTEOS, 60 grams 9-anthracene carboxy-methyl triethoxysilane, 0.6 grams 0.1 M nitric acid and 77 grams deionized water were combined. The flask was refluxed and/or heated for 1 to 12 hours. 1 g of APTEOS was added to the solution during refluxing. After refluxing, to the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer. The film thickness was 1635 Å. At 248 nm, the refractive index (n) was 1.373 and the extinction coefficient (k) was 0.268.

Synthesis of Absorbing Material Containing 9-anthracene carboxy-methyl Triethoxysilane and pH Tuning Agent In a 1-liter flask 297 grams 2-propanol, 148 grams acetone, 123 grams TEOS, 77 grams MTEOS, 60 grams 9-anthracene carboxy-methyl triethoxysilane, 0.6 grams 0.1 M nitric acid and 77 grams deionized water were combined. The flask was refluxed and/or heated for 1 to 12 hours. 1 g of APTEOS was added to the solution after refluxing. Also after refluxing, to the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer. The film thickness was 1635 Å.

Synthesis of Absorbing Material Containing 9-anthracene carboxy-ethyl Triethoxysilane and a pH Tuning Agent In a 1-liter flask 297 grams 2-propanol, 148 grams acetone, 123 grams TEOS, 77 grams MTEOS, 60 grams 9-anthracene carboxy-ethyl triethoxysilane, 0.6 grams 10 M acetic acid and 72 grams deionized water were combined. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Material Containing 9-anthracene carboxy-ethyl Triethoxysilane and a pH Tuning Agent In a 1-liter flask 297 grams 2-propanol, 148 grams acetone, 123 grams TEOS, 77 grams MTEOS, 60 grams 9-anthracene carboxy-ethyl triethoxysilane, 0.6 grams 1.0 M acetic acid and 72 grams deionized water were combined. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Material Containing 9-anthracene carboxy-ethyl Triethoxysilane and a pH Tuning Agent In a 1-liter flask 297 grams 2-propanol, 148 grams acetone, 123 grams TEOS, 77 grams MTEOS, 60 grams 9-anthracene carboxy-ethyl triethoxysilane, 0.6 grams pure acetic acid and 72 grams deionized water were combined. The flask was refluxed and/or heated for 1 to 12 hours. To the solution, 115 grams of butanol, 488 grams 2-propanol, 245 gams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Material Containing 9-anthracene carboxy-ethyl Triethoxysilane and a pH Tuning Agent In a 1-liter flask 297 grams 2-propanol, 148 grams acetone, 123 grams TEOS, 77 grams MTEOS, 60 grams 9-anthracene carboxy-ethyl triethoxysilane, 0.6 grams 10 M acetic acid and 100 grams deionized water were combined. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Material Containing 9-anthracene carboxy-ethyl Triethoxysilane and a pH Tuning Agent In a 1-liter flask 297 grams 2-propanol, 148 grams acetone, 123 grams TEOS; 77 grams MTEOS, 60 grams 9-anthracene carboxy-ethyl triethoxysilane, 0.6 grams 1.0 M acetic acid and 130 grams deionized water were combined. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Material Containing 9-anthracene carboxy-ethyl Triethoxysilane and a pH Tuning Agent In a 1-liter flask 297 grams 2-propanol, 148 grams acetone, 123 grams TEOS, 77 grams MTEOS, 60 grams 9-anthracene carboxy-ethyl triethoxysilane, 0.6 grams pure acetic acid and 72 grams deionized water were combined. 1.0 g of potassium hydroxide was added before refluxing. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Material Containing 9-anthracene carboxy-ethyl Triethoxysilane and a pH Tuning Agent In a 1-liter flask 297 grams 2-propanol, 148 grams acetone, 123 grams TEOS, 77 grams MTEOS, 60 grams 9-anthracene carboxy-ethyl triethoxysilane, 0.6 grams 10 M acetic acid and 72 grams deionized water were combined. 1.0 g of potassium hydroxide was added during refluxing. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Material Containing 9-anthracene carboxy-ethyl Triethoxysilane and a pH Tuning Agent In a 1-liter flask 297 grams 2-propanol, 148 grams acetone, 123 grams TEOS, 77 grams MTEOS, 60 grams 9-anthracene carboxy-ethyl triethoxysilane, 0.6 grams 1.0 M acetic acid and 72 grams deionized water were combined. The flask was refluxed and/or heated for 1 to 12 hours. 1.0 g of potassium hydroxide was added before refluxing. Also, to the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Material Containing 9-anthracene carboxy-propyl Triethoxysilane and a pH Tuning Agent In a 1-liter flask 178 grams 2-propanol, 89 grams acetone, 52 grams TEOS, 59 grams MTEOS, 29 grams 9-anthracene carboxy-propyl triethoxysilane, 3.3 grams pure lactic acid and 40 grams deionized water were combined. The flask was refluxed and/or heated for 1 to 12 hours. To the solution, 26 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer. Thickness is 1487.1 Angstroms; k=0.4315; n=1.4986.

Synthesis of Absorbing Material Containing 9-anthracene carboxy-propyl Triethoxysilane and a pH Tuning Agent In a 1-liter flask 178 grams 2-propanol, 89 grams acetone, 52 grams TEOS, 59 grams MTEOS, 29 grams 9-anthracene carboxy-propyl triethoxysilane, 3.3 grams 10 M lactic acid and 40 grams deionized water were combined. The flask was refluxed and/or heated for 1 to 12 hours. To the solution, 26 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Material Containing 9-anthracene carboxy-propyl Triethoxysilane and a pH Tuning Agent In a 1-liter flask 178 grams 2-propanol, 89 grams acetone, 52 grams TEOS, 59 grams MTEOS, 29 grams 9-anthracene carboxy-propyl triethoxysilane, 3.3 grams pure lactic acid and 40 grams deionized water were combined. The flask was refluxed and/or heated for 1 to 12 hours. To the solution, 26 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Material Containing 9-anthracene carboxy-propyl Triethoxysilane and a pH Tuning Agent In a 1-liter flask 178 grams 2-propanol, 89 grams acetone, 52 grams TEOS, 59 grams MTEOS, 29 grams 9-anthracene carboxy-propyl triethoxysilane, 3.3 grams 1.0 M lactic acid and 70 grams deionized water were combined. The flask was refluxed and/or heated for 1 to 12 hours. To the solution, 26 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Material Containing 9-anthracene carboxy-propyl Triethoxysilane and a pH Tuning Agent In a 1-liter flask 178 grams 2-propanol, 89 grams acetone, 52 grams TEOS, 59 grams MTEOS, 29 grams 9-anthracene carboxy-propyl triethoxysilane, 3.3 grams 10 M lactic acid and 90 grams deionized water were combined. The flask was refluxed and/or heated for 1 to 12 hours. To the solution, 26 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Material Containing 9-anthracene carboxy-propyl Triethoxysilane and a pH Tuning Agent In a 1-liter flask 178 grams 2-propanol, 89 grams acetone, 52 grams TEOS, 59 grams MTEOS, 29 grams 9-anthracene carboxy-propyl triethoxysilane, 3.3 grams 10 M lactic acid and 40 grams deionized water were combined. 1.5 g of TMAH was added to the solution before refluxing. The flask was refluxed and/or heated for 1 to 12 hours. To the solution, 26 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Material Containing 9-anthracene carboxy-propyl Triethoxysilane and a pH Tuning Agent In a 1-liter flask 178 grams 2-propanol, 89 grams acetone, 52 grams TEOS, 59 grams MTEOS, 29 grams 9-anthracene carboxy-propyl triethoxysilane, 3.3 grams 10 M lactic acid and 40 grams deionized water were combined. 1.5 g of TMAH was added to the solution during refluxing. The flask was refluxed and/or heated for 1 to 12 hours. To the solution, 26 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Material Containing 9-anthracene carboxy-propyl Triethoxysilane and a pH Tuning Agent In a 1-liter flask 178 grams 2-propanol, 89 grams acetone, 52 grams TEOS, 59 grams MTEOS, 29 grams 9-anthracene carboxy-propyl triethoxysilane, 3.3 grams 10 M lactic acid and 40 grams deionized water were combined. The flask was refluxed and/or heated for 1 to 12 hours. 1.5 g of TMAH was added to the solution after refluxing. Also after refluxing, to the solution, 26 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Material Containing 9-anthracene carboxy-propyl Triethoxysilane and a pH Tuning Agent In a 1-liter flask 178 grams 2-propanol, 89 grams acetone, 52 grams TEOS, 59 grams MTEOS, 29 grams 9-anthracene carboxy-propyl triethoxysilane, 3.3 grams 10 M lactic acid and 40 grams deionized water were combined. The flask was refluxed and/or heated for 1 to 12 hours. To the solution, 26 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer. Thickness is 1487.1 Angstroms; k=0.4315; n=1.4986.

Example 7

Synthesis of Absorbing Material Containing 9-anthracene Methanol, 2-hydroxy-4-(3-triethoxysilypropoxy)-diphenylketone, Rosolic Acid, and a pH Tuning Agent In a 1-liter flask 297 grams 2-propanol, 148 grams acetone, 123 grams TEOS, 77 grams MTEOS, 25 grams 9-anthracene methanol, 10 grams 2-hydroxy-4-(3-triethoxysilypropoxy)-diphenylketone, 5 grams rosolic acid, 0.6 grams 0.1 M nitric acid and 72 grams deionized water were combined. The flask was refluxed and/or heated for 1 to 12 hours. To the solution, 111 grams of butanol, 459 grams 2-propanol, 230 grams of acetone, 309 grams of ethanol, 50 grams deionized water and 3.75 grams of 10% FC 430 (3M, Minneapolis, Minn.) were added. Thickness=1436 Å, n=1.479, k=0.1255.

Synthesis of Absorbing Material Containing 9-anthracene Methanol, 2-hydroxy-4-(3-triethoxysilypropoxy)-diphenylketone, Rosolic Acid, and a pH Tuning Agent In a 1-liter flask 297 grams 2-propanol, 148 grams acetone, 123 grams TEOS, 77 grams MTEOS, 25 grams 9-anthracene methanol, 10 grams 2-hydroxy-4-(3-triethoxysilypropoxy)-diphenylketone, 5 grams rosolic acid, 0.6 grams 0.01 M nitric acid and 72 grams deionized water were combined. The flask was refluxed and/or heated for 1 to 12 hours. To the solution, 111 grams of butanol, 459 grams 2-propanol, 230 grams of acetone, 309 grams of ethanol, 50 grams deionized water and 3.75 grams of 10% FC 430 (3M, Minneapolis, Minn.) were added.

Synthesis of Absorbing Material Containing 9-anthracene Methanol, 2-hydroxy-4-(3-triethoxysilypropoxy)-diphenylketone, Rosolic Acid, and a pH Tuning Agent In a 1-liter flask 297 grams 2-propanol, 148 grams acetone, 123 grams TEOS, 77 grams MTEOS, 25 grams 9-anthracene methanol, 10 grams 2-hydroxy-4-(3-triethoxysilypropoxy)-diphenylketone, 5 grams rosolic acid, 0.6 grams 1.0 M nitric acid and 72 grams deionized water were combined. The flask was refluxed and/or heated for 1 to 12 hours. To the solution, 111 grams of butanol, 459 grams 2-propanol, 230 grams of acetone, 309 grams of ethanol, 50 grams deionized water and 3.75 grams of 10% FC 430 (3M, Minneapolis, Minn.) were added.

Synthesis of Absorbing Material Containing 9-anthracene Methanol, 2-hydroxy-4-(3-triethoxysilypropoxy)-diphenylketone, Rosolic Acid, and a pH Tuning Agent In a 1-liter flask 297 grams 2-propanol, 148 grams acetone, 123 grams TEOS, 77 grams MTEOS, 25 grams 9-anthracene methanol, 10 grams 2-hydroxy-4-(3-triethoxysilypropoxy)-diphenylketone, 5 grams rosolic acid, 0.6 grams 0.1 M nitric acid and 95 grams deionized water were combined. The flask was refluxed and/or heated for 1 to 12 hours. To the solution, 111 grams of butanol, 459 grams 2-propanol, 230 grams of acetone, 309 grams of ethanol, 50 grams deionized water and 3.75 grams of 10% FC 430 (3M, Minneapolis, Minn.) were added.

Synthesis of Absorbing Material Containing 9-anthracene Methanol, 2-hydroxy-4-(3-triethoxysilypropoxy)-diphenylketone, Rosolic Acid, and a pH Tuning Agent In a 1-liter flask 297 grams 2-propanol, 148 grams acetone, 123 grams TEOS, 77 grams MTEOS, 25 grams 9-anthracene methanol, 10 grams 2-hydroxy-4-(3-triethoxysilypropoxy)-diphenyllcetone, 5 grams rosolic acid, 0.6 grams 0.1 M nitric acid and 110 grams deionized water were combined. The flask was refluxed and/or heated for 1 to 12 hours. To the solution, 111 grams of butanol, 459 grams 2-propanol, 230 grams of acetone, 309 grams of ethanol, 50 grams deionized water and 3.75 grams of 10% FC 430 (3M, Minneapolis, Minn.) were added.

Synthesis of Absorbing Material Containing 9-anthracene Methanol, 2-hydroxy-4-(3-triethoxysilypropoxy)-diphenylketone, Rosolic Acid, and a pH Tuning Agent In a 1-liter flask 297 grams 2-propanol, 148 grams acetone, 123 grams TEOS, 77 grams MTEOS, 25 grams 9-anthracene methanol, 10 grams 2-hydroxy-4-(3-triethoxysilypropoxy)-diphenylketone, 5 grams rosolic acid, 0.6 grams 0.1 M nitric acid and 72 grams deionized water were combined. 1.2 g of APTEOS was added to the solution before refluxing. The flask was refluxed and/or heated for 1 to 12 hours. To the solution, 111 grams of butanol, 459 grams 2-propanol, 230 grams of acetone, 309 grams of ethanol, 50 grams deionized water and 3.75 grams of 10% FC 430 (3M, Minneapolis, Minn.) were added.

Synthesis of Absorbing Material Containing 9-anthracene Methanol, 2-hydroxy-4-(3-triethoxysilypropoxy)-diphenylketone, Rosolic Acid, and a pH Tuning Agent In a 1-liter flask 297 grams 2-propanol, 148 grams acetone, 123 grams TEOS, 77 grams MTEOS, 25 grams 9-anthracene methanol, 10 grams 2-hydroxy-4-(3-triethoxysilypropoxy)-diphenylketone, 5 grams rosolic acid, 0.6 grams 0.1 M nitric acid and 72 grams deionized water were combined. 1.2 g of APTEOS was added to the solution during refluxing. The flask was refluxed and/or heated for 1 to 12 hours. To the solution, 111 grams of butanol, 459 grams 2-propanol, 230 grams of acetone, 309 grams of ethanol, 50 grams deionized water and 3.75 grams of 10% FC 430 (3M, Minneapolis, Minn.) were added.

Synthesis of Absorbing Material Containing 9-anthracene Methanol, 2-hydroxy-4-(3-triethoxysilypropoxy)-diphenylketone, Rosolic Acid, and a pH Tuning Agent In a 1-liter flask 297 grams 2-propanol, 148 grams acetone, 123 grams TEOS, 77 grams MTEOS, 25 grams 9-anthracene methanol, 10 grams 2-hydroxy-4-(3-triethoxysilypropoxy)-diphenylketone, 5 grams rosolic acid, 0.6 grams 0.1 M nitric acid and 72 grams deionized water were combined. The flask was refluxed and/or heated for 1 to 12 hours. 1.2 g of APTEOS was added to the solution after refluxing. Also, after refluxing, to the solution, 111 grams of butanol, 459 grams 2-propanol, 230 grams of acetone, 309 grams of ethanol, 50 grams deionized water and 3.75 grams of 10% FC 430 (3M, Minneapolis, Minn.) were added.

Example 8

Synthesis of Absorbing SOG Containing 9-anthracene Methanol, 2-hydroxy-4-(3-triethoxysilypropoxy)-diphenylketone, Rosolic Acid, and a pH Tuning Agent In a 1-liter flask 297 gams 2-propanol, 148 grams acetone, 93 grams TEOS, 77 grams MTEOS, 20 grams 9-anthracene methanol, 60 grams 2-hydroxy-4-(3-triethoxysilypropoxy)-diphenylketone, 5 grams rosolic acid, 0.5599 grams 10 M acetic acid and 71.90 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing SOG Containing 9-anthracene Methanol, 2-hydroxy-4-(3-triethoxysilypropoxy)-diphenylketone, Rosolic Acid, and a pH Tuning Agent In a 1-liter flask 297 grams 2-propanol, 148 grams acetone, 93 grams TEOS, 77 grams MTEOS, 20 grams 9-anthracene methanol, 60 grams 2-hydroxy-4-(3-triethoxysilypropoxy)-diphenylketone, 5 grams rosolic acid, 0.5599 grams 1.0 M acetic acid and 71.90 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing SOG Containing 9-anthracene Methanol, 2-hydroxy-4-(3-triethoxysilypropoxy)-diphenylketone, Rosolic Acid, and a pH Tuning Agent In a 1-liter flask 297 grams 2-propanol, 148 grams acetone, 93 grams TEOS, 77 grams MTEOS, 20 grams 9-anthracene methanol, 60 grams 2-hydroxy-4-(3-triethoxysilypropoxy)-diphenylketone, 5 grams rosolic acid, 0.5599 grams pure acetic acid and 71.90 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing SOG Containing 9-anthracene Methanol, 2-hydroxy-4-(3-triethoxysilypropoxy)-diphenylketone, Rosolic Acid, and a pH Tuning Agent In a 1-liter flask 297 grams 2-propanol, 148 grams acetone, 93 grams TEOS, 77 grams MTEOS, 20 grams 9-anthracene methanol, 60 grams 2-hydroxy-4-(3-triethoxysilypropoxy)-diphenylketone, 5 grams rosolic acid, 0.5599 grams 10 M acetic acid and 95 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing SOG Containing 9-anthracene Methanol, 2-hydroxy-4-(3-triethoxysilypropoxy)-diphenylketone, Rosolic Acid, and a pH Tuning Agent In a 1-liter flask 297 grams 2-propanol, 148 grams acetone, 93 grams TEOS, 77 grams MTEOS, 20 grams 9-anthracene methanol, 60 grams 2-hydroxy-4-(3-triethoxysilypropoxy)-diphenylketone, 5 grams rosolic acid, 0.5599 grams 10 M acetic acid and 120 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing SOG Containing 9-anthracene Methanol, 2-hydroxy-4-(3-triethoxysilypropoxy)-diphenylketone, Rosolic Acid, and a pH Tuning Agent In a 1-liter flask 297 grams 2-propanol, 148 grams acetone, 93 grams TEOS, 77 grams MTEOS, 20 grams 9-anthracene methanol, 60 grams 2-hydroxy-4-(3-triethoxysilypropoxy)-diphenylketone, 5 grams rosolic acid, 0.5599 grams 10 M acetic acid and 71.90 grams deionized water were combined.

2.2 g of potassium hydroxide was added to the solution before refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing SOG Containing 9-anthracene Methanol, 2-hydroxy-4-(3-triethoxysilypropoxy)-diphenylketone, Rosolic Acid, and a pH Tuning Agent In a 1-liter flask 297 grams 2-propanol, 148 grams acetone, 93 grams TEOS, 77 grams MTEOS, 20 grams 9-anthracene methanol, 60 grams 2-hydroxy-4-(3-triethoxysilypropoxy)-diphenylketone, 5 grams rosolic acid, 0.5599 grams 10 M acetic acid and 71.90 grams deionized water were combined. 2.2 g of potassium hydroxide was added to the solution during refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing SOG Containing 9-anthracene Methanol, 2-hydroxy-4-(3-triethoxysilypropoxy)-diphenylketone, Rosolic Acid, and a pH Tuning Agent In a 1-liter flask 297 grams 2-propanol, 148 grams acetone, 93 grams TEOS, 77 grams MTEOS, 20 grams 9-anthracene methanol, 60 grams 2-hydroxy-4-(3-triethoxysilypropoxy)-diphenylketone, 5 grams rosolic acid, 0.5599 grams 1075M acetic acid and 71.90 grams deionized water were combined. The flask was refluxed and/or heated for 1 to 12 hours. 2.2 g of potassium hydroxide was added to the solution after refluxing. Also, after refluxing, to the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Example 9

Synthesis of Absorbing SOG Containing 9-anthracene Methanol, 2-hydroxy-4-(3-triethoxysilypropoxy)-diphenylketone, Rosolic Acid, and pH Tuning Agent In a 1-liter flask 297 grams 2-propanol, 148 grams acetone, 108 grams TEOS, 77 grams MTEOS, 10 grams 9-anthracene methanol, 60 grams 2-hydroxy-4-(3-triethoxysilypropoxy)-diphenylketone, 5 grams rosolic acid, 0.5599 grams 0.1 M nitric acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4275 Å, n=1.529, k=0.124.

Synthesis of Absorbing SOG Containing 9-anthracene Methanol, 2-hydroxy-4-(3-triethoxysilypropoxy)-diphenylketone, Rosolic Acid, and pH Tuning Agent In a 1-liter flask 297 grams 2-propanol, 148 grams acetone, 108 grams TEOS, 77 grams MTEOS, 10 grams 9-anthracene methanol, 60 grams 2-hydroxy-4-(3-triethoxysilypropoxy)-diphenylketone, 5 grams rosolic acid, 0.5599 grams 0.01 M nitric acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4275 Å, n=1.529, k=0.124.

Synthesis of Absorbing SOG Containing 9-anthracene Methanol, 2-hydroxy-4-(3-triethoxysilypropoxy)-diphenylketone, Rosolic Acid, and pH Tuning Agent In a 1-liter flask 297 grams 2-propanol, 148 grams acetone, 108 grams TEOS, 77 grams MTEOS, 10 grams 9-anthracene methanol, 60 grams 2-hydroxy-4-(3-triethoxysilypropoxy)-diphenylketone, 5 grams rosolic acid, 0.5599 grams 1.0 M nitric acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4275 Å, n=1.529, k=0.124.

Synthesis of Absorbing SOG Containing 9-anthracene Methanol, 2-hydroxy-4-(3-triethoxysilypropoxy)-diphenylketone, Rosolic Acid, and pH Tuning Agent In a 1-liter flask 297 grams 2-propanol, 148 grams acetone, 108 grams TEOS, 77 grams MTEOS, 10 grams 9-anthracene methanol, 60 grams 2-hydroxy-4-(3-triethoxysilypropoxy)-diphenylketone, 5 grams rosolic acid, 0.5599 grams 0.1 M nitric acid and 95 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4275 Å, n=1.529, k=0.124.

Synthesis of Absorbing SOG Containing 9-anthracene Methanol, 2-hydroxy-4-(3-triethoxysilypropoxy)-diphenylketone, Rosolic Acid, and pH Tuning Agent In a 1-liter flask 297 grams 2-propanol, 148 grams acetone, 108 grams TEOS, 77 grams MTEOS, 10 grams 9-anthracene methanol, 60 grams 2-hydroxy-4-(3-triethoxysilypropoxy)-diphenylketone, 5 grams rosolic acid, 0.5599 grams 0.1 M nitric acid and 125 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4275 Å, n=1.529, k=0.124.

Synthesis of Absorbing SOG Containing 9-anthracene Methanol, 2-hydroxy-4-(3-triethoxysilypropoxy)-diphenylketone, Rosolic Acid, and pH Tuning Agent In a 1-liter flask 297 grams 2-propanol, 148 grams acetone, 108 grams TEOS, 77 grams MTEOS, 10 grams 9-anthracene methanol, 60 grams 2-hydroxy-4-(3-triethoxysilypropoxy)-diphenylketone, 5 grams rosolic acid, 0.5599 grams 0.1 M nitric acid and 72 grams deionized water were combined. 3 g of APTEOS was added to the solution before refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4275 Å, n=1.529, k=0.124.

Synthesis of Absorbing SOG Containing 9-anthracene Methanol, 2-hydroxy-4-(3-triethoxysilypropoxy)-diphenylketone, Rosolic Acid, and pH Tuning Agent In a 1-liter flask 297 grams 2-propanol, 148 grams acetone, 108 grams TEOS, 77 grams MTEOS, 10 grams 9-anthracene methanol, 60 grams 2-hydroxy-4-(3-triethoxysilypropoxy)-diphenylketone, 5 grams rosolic acid, 0.5599 grams 0.1 M nitric acid and 72 grams deionized water were combined. 3 g of APTEOS was added to the solution during refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4275 Å, n=1.529, k=0.124.

Synthesis of Absorbing SOG Containing 9-anthracene Methanol, 2-hydroxy-4-(3-triethoxysilypropoxy)-diphenylketone, Rosolic Acid, and pH Tuning Agent In a 1-liter flask 297 grams 2-propanol, 148 grams acetone, 108 grams TEOS, 77 grams MTEOS, 10 grams 9-anthracene methanol, 60 grams 2-hydroxy-4-(3-triethoxysilypropoxy)-diphenylketone, 5 grams rosolic acid, 0.5599 grams 0.1 M nitric acid and 72 grams deionized water were combined. The flask was refluxed and/or heated for 1 to 12 hours. 3 g of APTEOS was added to the solution after refluxing. Also, after refluxing, to the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4275 Å, n=1.529, k=0.124.

Example 10

Synthesis of Absorbing Material Containing 2-hydroxy-4-(3-triethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-triethoxysilypropoxy)-diphenylketone, 0.6 grams 0.1 M nitric acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=3592 Å, n=1.563, k=0.067.

Synthesis of Absorbing Material Containing 2-hydroxy-4-(3-triethoxysilypropoxy)-diphenylketone and a pH Tuning Agent In a 1-liter flask 297 gams 2-propanol, 148 grams acetone, 123 grams TEOS, 51 grams MTEOS, 60 grams 2-hydroxy-4-(3-triethoxysilypropoxy)-diphenylketone, 0.6 grams 0.01 M nitric acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 2-hydroxy-4-(3-triethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-triethoxysilypropoxy)-diphenylketone, 0.6 grams 1.0 M nitric acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 2-hydroxy-4-(3-triethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-triethoxysilypropoxy)-diphenylketone, 0.6 grams 0.1 M nitric acid and 90 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 2-hydroxy-4-(3-triethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-triethoxysilypropoxy)-diphenylketone, 0.6 grams 0.1 M nitric acid and 125 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 2-hydroxy-4-(3-triethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-triethoxysilypropoxy)-diphenylketone, 0.6 grams 0.1 M nitric acid and 72 grams deionized water were combined. 0.26 g of APTEOS was added to the solution before refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 2-hydroxy-4-(3-triethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy- 4-(3-triethoxysilypropoxy)-diphenylketone, 0.6 grams 0.1 M nitric acid and 72 grams deionized water were combined. 0.26 g of APTEOS was added to the solution during the refluxing step. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 2-hydroxy-4-(3-triethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-triethoxysilypropoxy)-diphenylketone, 0.6 grams 0.1 M nitric acid and 72 grams deionized water were combined. The flask was refluxed and/or heated for 1 to 12 hours. 0.26 g of APTEOS was added to the solution after refluxing. Also, after refluxing, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added to the solution.

Synthesis of Absorbing Material Containing 2-hydroxy-4-(3-trimethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-trimethoxysilypropoxy)-diphenylketone, 0.6 grams 10 M lactic acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 2-hydroxy-4-(3-trimethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-trimethoxysilypropoxy)-diphenylketone, 0.6 grams 1.0 M lactic acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 gams deionized water and 3.75 grams of 10% FC 430 (3M, Minneapolis, Minn.) were added.

Synthesis of Absorbing Material Containing 2-hydroxy-4-(3-trimethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-trimethoxysilypropoxy)-diphenylketone, 0.6 grams 1.0 M lactic acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added:

Synthesis of Absorbing Material Containing 2-hydroxy-4-(3-trimethoxysilypropoxy)-diphenylketone and a pH Tuning Agent In a 1-liter flask 297 grams 2-propanol, 148 grams acetone, 123 grams TEOS, 51 grams MTEOS, 75 grams 2-hydroxy-4-(3-trimethoxysilypropoxy)-diphenylketone, 0.6 grams 10 M lactic acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 2-hydroxy-4-(3-trimethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-trimethoxysilypropoxy)-diphenylketone, 0.6 grams 10 M lactic acid and 115 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 2-hydroxy-4-(3-trimethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-trimethoxysilypropoxy)-diphenylketone, 0.6 grams 10 M lactic acid and 72 grams deionized water were combined. 0.06 g of APTEOS was added to the solution before refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 2-hydroxy-4-(3-trimethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-trimethoxysilypropoxy)-diphenylketone, 0.6 grams 10 M lactic acid and 72 grams deionized water were combined. 0.06 g of APTEOS was added to the solution during refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 2-hydroxy-4-(3-trimethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-trimethoxysilypropoxy)-diphenylketone, 0.6 grams 10 M lactic acid and 72 grams deionized water were combined.

The flask was refluxed and/or heated for 1 to 12 hours. 0.06 g of APTEOS was added to the solution after refluxing. After refluxing, 57 grams of butanol, 88 grams 2-propanol, 44 grams of acetone, 59 grams of ethanol, 9.5 grams deionized water and 3.75 grams of 10% FC 430 (3M, Minneapolis, Minn.) were also added to the solution.

Example 11

Synthesis of Absorbing Material Containing 9-anthracene Methanol and a pH Tuning Agent In a 1-liter flask 297 grams 2-propanol, 148 grams acetone, 123 grams TEOS, 77 grams MTEOS, 10 grams 9-anthracene methanol, 0.6 grams 0.1 M hydrochloric acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 9-anthracene Methanol and a pH Tuning Agent In a 1-liter flask 297 grams 2-propanol, 148 grams acetone, 123 grams TEOS, 77 grams MTEOS, 10 grams 9-anthracene methanol, 0.6 grams 0.01 M hydrochloric acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 9-anthracene Methanol and a pH Tuning Agent In a 1-liter flask 297 grams 2-propanol, 148 grams acetone, 123 grams TEOS, 77 grams MTEOS, 10 grams 9-anthracene methanol, 0.6 grams 1.0 M hydrochloric acid and 72 grams deionized water were combined. The flask was refluxed and/or heated for 1 to 12 hours. To the solution, 57 grams of butanol, 88 gams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 9-anthracene Methanol and a pH Tuning Agent In a 1-liter flask 297 grams 2-propanol, 148 grams acetone, 123 grams TEOS, 77 grams MTEOS, 10 grams 9-anthracene methanol, 0.6 grams 0.1 M hydrochloric acid and 100 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 9-anthracene Methanol and a pH Tuning Agent In a 1-liter flask 297 grams 2-propanol, 148 grams acetone, 123 grams TEOS, 77 grams MTEOS, 10 grams 9-anthracene methanol, 0.6 grams 0.1 M hydrochloric acid and 130 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 9-anthracene Methanol and a pH Tuning Agent In a 1-liter flask 297 grams 2-propanol, 148 grams acetone, 123 grams TEOS, 77 grams MTEOS, 10 grams 9-anthracene methanol, 0.6 grams 0.1 M hydrochloric acid and 72 grams deionized water were combined. 1.2 g of potassium hydroxide was added to the solution before refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 9-anthracene Methanol and a pH Tuning Agent In a 1-liter flask 297 grams 2-propanol, 148 grams acetone, 123 grams TEOS, 77 grams MTEOS, 10 grams 9-anthracene methanol, 0.6 grams 0.1 M hydrochloric acid and 72 grams deionized water were combined. 1.2 g of potassium hydroxide was added to the solution during refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 9-anthracene Methanol and a pH Tuning Agent In a 1-liter flask 297 grams 2-propanol, 148 grams acetone, 123 grams TEOS, 77 grams MTEOS, 10 grams 9-anthracene methanol, 0.6 grams 0.1 M hydrochloric acid and 72 grams deionized water were combined. The flask was refluxed and/or heated for 1 to 12 hours. 1.2 g of potassium hydroxide was added to the solution after refluxing. Also after refluxing, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added to the solution.

Example 12

Synthesis of Absorbing Material Containing 9-anthracene Methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 20 grams 2-hydroxy-4-(3-triethoxysilypropoxy)-diphenylketone, 25 grams of 9-anthracene methanol, and 5 grams of rosolic acid, 0.6 grams 1.0 M acetic acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=3503 Å, n=1.475, k=0.193.

Synthesis of Absorbing Material Containing 9-anthracene Methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 20 grams 2-hydroxy- 4-(3-triethoxysilypropoxy)-diphenylketone, 25 grams of 9-anthracene methanol, and 5 grams of rosolic acid, 0.6 grams 10 M acetic acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 9-anthracene Methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 gams TEOS, 77 grams MTEOS, 20 grams 2-hydroxy-4-(3-triethoxysilypropoxy)-diphenylketone, 25 grams of 9-anthracene methanol, and 5 grams of rosolic acid, 0.6 grams pure M acetic acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 9-anthracene Methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 20 grams 2-hydroxy-4-(3-triethoxysilypropoxy)-diphenylketone, 25 grams of 9-anthracene methanol, and 5 grams of rosolic acid, 0.6 grams 10 M acetic acid and 98 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 9-anthracene Methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 20 grams 2-hydroxy-4-(3-triethoxysilypropoxy)-diphenylketone, 25 grams of 9-anthracene methanol, and 5 grams of rosolic acid, 0.6 grams 10 M acetic acid and 120 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 9-anthracene Methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 20 grams 2-hydroxy-4-(3-triethoxysilypropoxy)-diphenylketone, 25 grams of 9-anthracene methanol, and 5 grams of rosolic acid, 0.6 grams 10 M acetic acid and 72 grams deionized water were combined. 1.5 g of TMAH was added to the solution before refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 9-anthracene Methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 20 grams 2-hydroxy-4-(3-triethoxysilypropoxy)-diphenylketone, 25 grams of 9-anthracene methanol, and 5 grams of rosolic acid, 0.6 grams 10 M acetic acid and 72 grams deionized water were combined. 1.5 g of TMAH was added to the solution during refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 9-anthracene Methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 20 grams 2-hydroxy-4-(3-triethoxysilypropoxy)-diphenylketone, 25 grams of 9-anthracene methanol, and 5 grams of rosolic acid, 0.6 grams 10 M acetic acid and 72 grams deionized water were combined. The flask was refluxed and/or heated for 1 to 12 hours. 1.5 g of TMAH was added to the solution after refluxing. Also after refluxing, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added to the solution.

Example 13

Synthesis of Absorbing Material Containing 9-anthracene Methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 5 grams 2-hydroxy-4-(3-triethoxysilypropoxy)-diphenylketone, 25 grams of 9-anthracene methanol, and 5 grams of rosolic acid, 0.6 grams 10 M lactic acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=3119 Å, n=1.454, k=0.175.

Synthesis of Absorbing Material Containing 9-anthracene Methanol, 2-hydroxy-4-(3-triethoxysilypropoxy)-diphenylketone, Rosolic Acid and a pH Tuning Agent In a 1-liter, flask 297 grams 2-propanol, 148 grams acetone, 123 grams TEOS, 77 grams MTEOS, 5 grams 2-hydroxy-4-(3-triethoxysilypropoxy)-diphenylketone, 25 grams of 9-anthracene methanol, and 5 grams of rosolic acid, 0.6 grams 1.0 M lactic acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 9-anthracene Methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 5 grams 2-hydroxy-4-(3-triethoxysilypropoxy)-diphenyllcetone, 25 grams of 9-anthracene methanol, and 5 grams of rosolic acid, 0.6 grams pure lactic acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 9-anthracene Methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 5 grams 2-hydroxy-4-(3-triethoxysilypropoxy)-diphenylketone, 25 grams of 9-anthracene methanol, and 5 grams of rosolic acid, 0.6 grams 10 M lactic acid and 100 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 9-anthracene Methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 5 grams 2-hydroxy-4-(3-triethoxysilypropoxy)-diphenylketone, 25 grams of 9-anthracene methanol, and 5 grams of rosolic acid, 0.6 grams 10 M lactic acid and 130 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 9-anthracene Methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 5 grams 2-hydroxy-4-(3-triethoxysilypropoxy)-diphenylketone, 25 grams of 9-anthracene methanol, and 5 grams of rosolic acid, 0.6 grams 10 M lactic acid and 72 grams deionized water were combined.0.1 g of APTEOS was added to the solution before refluxing.

The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 9-anthracene Methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 5 grams 2-hydroxy-4-(3-triethoxysilypropoxy)-diphenylketone, 25 grams of 9-anthracene methanol, and 5 grams of rosolic acid, 0.6 grams 10 M lactic acid and 72 grams deionized water were combined. 0.1 g of APTEOS was added to the solution during refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Material Containing 9-anthracene Methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 5 grams 2-hydroxy-4-(3-triethoxysilypropoxy)-diphenylketone, 25 grams of 9-anthracene methanol, and 5 grams of rosolic acid, 0.6 grams 10 M lactic acid and 72 grams deionized water were combined. The flask was refluxed and/or heated for 1 to 12 hours. 0.1 g of APTEOS was added to the solution after refluxing. Also after refluxing, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added to the solution.

Example 14

Synthesis of Absorbing Material Containing 9-anthracene Methanol, 2-hydroxy-4-(3-triethoxysilypropoxy)-diphenylketone, Rosolic Acid, Quinizarin, Alizarin and a pH Tuning Agent In a 1-liter flask 297 grams 2-propanol, 148 grams acetone, 123 grams TEOS, 77 grams MTEOS, 20 grams 2-hydroxy-4-(3-triethoxysilypropoxy)-diphenylketone, 25 grams of 9-anthracene methanol, and 5 grams of rosolic acid, 2 grams of quinizarin, 2 grams alizarin, 0.6 grams 0.1 M nitric acid, 1.0 M nitric acid and 0.01 M nitric acid (added to three separate mixtures) and 72 grams deionized water were combined. In two other solutions containing 0.1 M nitric acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% F C 430 (3M, Minneapolis, Minn.) were added. Thickness=3554 Å, n=1.489, k=0.193.

In three additional solutions, 1.1 g of potassium hydroxide was added. In each solution, the potassium hydroxide was added before, during and after the refluxing step, respectively.

Example 15

Synthesis of Absorbing Material Containing 9-anthracene Methanol, 2-hydroxy-4-(3-triethoxysilypropoxy)-diphenylketone, Rosolic Acid, Alizarin and a pH Tuning Agent In a 1-liter flask 297 grams 2-propanol, 148 grams acetone, 123 grams TEOS, 51.5 grams MTEOS, 5 grams 2-hydroxy-4-(3-triethoxysilypropoxy)-diphenylketone, 25 grams of 9-anthracene methanol, 5 grams of rosolic acid, and 2 grams alizarin, 0.5599 grams 1.0 M, 10 M and pure acetic acid (added to three separate mixtures, respectively) and 71.90 grams deionized water were combined. In two other solutions containing 10 M acetic acid, 90 g and 110 g of deionized water were added, respectively. The flask was refluxed and/or heated for 1 to 12 hours. To the solution, 56.68 grams of butanol, 87.99 grams 2-propanol, 44.10 grams of acetone, 59.31 grams of ethanol, 9.55 grams deionized water and 3.75 grams of 10% FC 430 (3M, Minneapolis, Minn.) were added.

In three additional solutions, 0.25 g of APTEOS was added. In each solution, the APTEOS was added before, during and after the refluxing step, respectively.

Example 16

Synthesis of Absorbing Material Containing 9-anthracene Carboxy-Methyl Triethoxysilane and a pH Tuning Agent In a 1-liter flask 297 grams 2-propanol, 148 grams acetone, 123 grams TEOS, 77 grams MTEOS, 30 grams 9-anthracene carboxy-methyl triethoxysilane, 0.6 grams 0.1 M, 0.01 M and 1.0 M nitric acid (added to three separate solutions, respectively) and 72 grams deionized water were combined. In two other solutions containing 0.1 M nitric acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added.

In three additional solutions, 0.25 g of HCl was added. In each solution, the HCl was added before, during and after the refluxing step, respectively.

Synthesis of Absorbing Material Containing 9-anthracene Carboxy-Ethyl Triethoxysilane and a pH Tuning Agent In a 1-liter flask 297 grams 2-propanol, 148 grams acetone, 123 grams TEOS, 77 grams MTEOS, 30 grams 9-anthracene carboxy-ethyl triethoxysilane, 0.6 grams 1.0 M, 10 M and pure lactic acid (added to three separate solutions, respectively) and 72 grams deionized water were combined. In two other solutions containing 10 M lactic acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added.

In three additional solutions, 1.2 g of APTEOS was added. In each solution, the APTEOS was added before, during and after the refluxing step, respectively.

Synthesis of Absorbing Material Containing 9-anthracene Carboxy-Propyl Triethoxysilane and a pH Tuning Agent In a 1-liter flask 297 grams 2-propanol, 148 grams acetone, 123 grams TEOS, 77 grams MTEOS, 30 grams 9-anthracene carboxy-propyl triethoxysilane, 0.6 grams 1.0 M, 10 M and pure lactic acid (added to three separate solutions, respectively) and 72 grams deionized water were combined. In two other solutions containing 10 M lactic acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added.

In three additional solutions, 0.2 g of APTEOS was added. In each solution, the APTEOS was added before, during and after the refluxing step, respectively.

Synthesis of Absorbing Material Containing 9-anthracene Carboxy-Pentyl Triethoxysilane and a pH Tuning Agent In a 1-liter flask 297 grams 2-propanol, 148 grams acetone, 123 grams TEOS, 77 grams MTEOS, 30 grams 9-anthracene carboxy-pentyl triethoxysilane, 0.6 grams 0.1 M, 0.01 M and 1.0 M nitric acid (added to three separate solutions, respectively) and 72 grams deionized water were combined. In two other solutions containing 0.1 M nitric acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added.

In three additional solutions, 1.0 g of potassium hydroxide was added. In each solution, the potassium hydroxide was added before, during and after the refluxing step, respectively.

Synthesis of Absorbing Material Containing 9-anthracene Carboxy-Methyl Trimethoxysilane and a pH Tuning Agent In a 1-liter flask 297 grams 2-propanol, 148 grams acetone, 123 grams TEOS, 77 grams MTEOS, 30 grams 9-anthracene carboxy-methyl trimethoxysilane, 0.6 grams 1.0 M, 10 M and pure acetic acid (added to three separate solutions, respectively) and 72 grams deionized water were combined. In two other solutions containing 10 M acetic acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added.

In three additional solutions, 2.4 g of TMAH was added. In each solution, the TMAH was added before, during and after the refluxing step, respectively.

Synthesis of Absorbing Material Containing 9-anthracene Carboxy-Ethyl Trimethoxysilane and a pH Tuning Agent In a 1-liter flask 297 grams 2-propanol, 148 grams acetone, 123 grams TEOS, 77 grams MTEOS, 30 grams 9-anthracene carboxy-ethyl trimethoxysilane, 0.6 grams 1.0 M, 10 M and pure lactic acid (added to three separate solutions, respectively) and 72 grams deionized water were combined. In two other solutions containing 10 M lactic acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added.

In three additional solutions, 1.2 g of APTEOS was added. In each solution, the APTEOS was added before, during and after the refluxing step, respectively.

Synthesis of Absorbing Material Containing 9-anthracene carboxy-propyl Trimethoxysilane and a pH Tuning Agent In a 1-liter flask 297 grams 2-propanol, 148 grams acetone, 123 grams TEOS, 77 grams MTEOS, 30 grams 9-anthracene carboxy-propyl trimethoxysilane, 0.6 grams 0.1 M, 0.01 M and 1.0 M hydrochloric acid (added to three separate solutions, respectively) and 72 grams deionized water were combined. In two other solutions containing 0.1 M hydrochloric acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added.

In three additional solutions, 1.4 g of APTEOS was added. In each solution, the APTEOS was added before, during and after the refluxing step, respectively.

Example 17

Synthesis of Absorbing Material Containing 9-anthracene Methanol and a pH Tuning Agent In a 1-liter flask 297 grams 2-propanol, 148 grams acetone, 123 grams TEOS, 77 grams MTEOS, and 10 grams 9-anthracene methanol are combined. The solution is refluxed for 6 hours. A mixture of 0.6 grams 0.1 M, 0.01 M and 1.0 M hydrochloric acid (added to three separate solutions, respectively) and 72 grams deionized water were combined. In two other solutions containing 0.1 M hydrochloric acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added.

In three additional solutions, 1.4 g of APTEOS was added. In each solution, the APTEOS was added before, during and after the refluxing step, respectively.

Synthesis of Absorbing Material Containing 9-anthracene Ethanol and a pH Tuning Agent In a 1-liter flask 297 grams 2-propanol, 148 grams acetone, 123 grams TEOS, 77 grams MTEOS, and 10 grams 9-anthracene ethanol are combined. The solution is refluxed for 6 hours. A mixture of 0.6 grams 0.1 M, 0.01 M and 1.0 M nitric acid (added to three separate solutions, respectively) and 72 grams deionized water were combined. In two other solutions containing 0.1 M nitric acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added.

In three additional solutions, 0.4 g of APTEOS was added. In each solution, the APTEOS was added before, during and after the refluxing step, respectively;

Synthesis of Absorbing Material Containing 9-anthracene Propanol and a pH Tuning Agent In a 1-liter flask 297 grams 2-propanol, 148 grams acetone, 123 grams TEOS, 77 grams MTEOS, and 10 grams 9-anthracene propanol are combined. The solution is refluxed for 6 hours. A mixture of 0.6 grams 1.0 M, 10 M and pure acetic acid (added to three separate solutions, respectively) and 72 grams deionized water were combined. In two other solutions containing 10 M acetic acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added.

In three additional solutions, 1.25 g of TMAH was added. In each solution, the TMAH was added before, during and after the refluxing step, respectively.

Example 18

Synthesis of Absorbing Material Containing 9-anthracene carboxy-methyl Triethoxysilane and a pH Tuning Agent In a 1-liter flask 297 grams 2-propanol, 148 grams acetone, 90 grams TMOS, 59 grams MTMOS, 60 grams 9-anthracene carboxy-methyl triethoxysilane, 0.6 grams 1.0 M, 10 M and pure acetic acid (added to three separate solutions, respectively) and 72 grams deionized water were combined. In two other solutions containing 10 M acetic acid, 90 g and 110 g of deionized water were added, respectively. The flask is refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) are added.

In three additional solutions, 1.25 g of TMAH was added. In each solution, the TMAH was added before, during and after the refluxing step, respectively.

Synthesis of Absorbing Material Containing 9-anthracene carboxy-ethyl Triethoxysilane and a pH Tuning Agent In a 1-liter flask 297 grams 2-propanol, 148 grams acetone, 90 grams TMOS, 59 grams MTMOS, 60 grams 9-anthracene carboxy-ethyl triethoxysilane, 0.6 grams 0.1 M, 0.01 M and 1.0 M nitric acid (added to three separate solutions, respectively) and 72 grams deionized water were combined. In two other solutions containing 0.1 M nitric acid, 90 g and 110 g of deionized water were added, respectively. The flask is refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) are added.

In three additional solutions, 0.25 g of TMAH was added. In each solution, the TMAH was added before, during and after the refluxing step, respectively.

Synthesis of Absorbing Material Containing 9-anthracene carboxy-methyl Trimethoxysilane and a pH Tuning Agent In a 1-liter flask 297 grams 2-propanol, 148 grams acetone, 90 grams TMOS, 59 grams MTMOS, 60 grams 9-anthracene carboxy-methyl trimethoxysilane, 0.6 grams 1.0 M, 10 M and pure lactic acid (added to three separate solutions, respectively) and 72 grams deionized water were combined. In two other solutions containing 10 M lactic acid, 90 g and 110 g of deionized water were added, respectively. The flask is refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) are added.

In three additional solutions, 1.5 g of potassium hydroxide was added. In each solution, the potassium hydroxide was added before, during and after the refluxing step, respectively.

Synthesis of Absorbing Material Containing 9-anthracene carboxy-propyl Triethoxysilane and a pH Tuning Agent In a 1-liter flask 297 grams 2-propanol, 148 grams acetone, 90 grams TMOS, 59 grams MTMOS, 60 grams 9-anthracene carboxy-propyl triethoxysilane, 0.6 grams 0.1 M, 0.01 M and 1.0 M nitric acid (added to three separate solutions, respectively) and 72 grams deionized water were combined. In two other solutions containing 0.1 M nitric acid, 90 g and 110 g of deionized water were added, respectively. The flask is refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) are added.

In three additional solutions, 0.5 g of TMAH was added. In each solution, the TMAH was added before, during and after the refluxing step, respectively.

Synthesis of Absorbing Material Containing 9-anthracene carboxy-methyl Tripropoxysilane and a pH Tuning Agent In a 1-liter flask 297 grams 2-propanol, 148 grams acetone, 90 grams TMOS, 59 grams MTMOS, 60 grams 9-anthracene carboxy-methyl tripropoxysilane, 0.6 grams 1.0 M, 10 M and pure acetic acid (added to three separate solutions, respectively) and 72 grams deionized water were combined. In two other solutions containing 10 M acetic acid, 90 g and 110 g of deionized water were added, respectively. The flask is refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) are added.

In three additional solutions, 0.75 g of TMAH was added. In each solution, the TMAH was added before, during and after the refluxing step, respectively.

Synthesis of Absorbing Material Containing 9-anthracene carboxy-ethyl Tributoxysilane and a pH Tuning Agent In a 1-liter flask 297 grams 2-propanol, 148 grams acetone, 90 grams TMOS, 59 grams MTMOS, 60 grams 9-anthracene carboxy-ethyl tributoxysilane, 0.6 grams 1.0 M, 10 M and pure acetic acid (added to three separate solutions, respectively) and 72 grams deionized water were combined. In two other solutions containing 10 M acetic acid, 90 g and 110 g of deionized water were added, respectively. The flask is refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) are added.

In three additional solutions, 1.00 g of TMAH was added. In each solution, the TMAH was added before, during and after the refluxing step, respectively.

Example 19

Synthesis of Absorbing Material Containing Phenyltriethoxysilane and a pH Tuning Agent In a 1-liter flask 297 grams (4.798 moles) 2-propanol, 148 grams (2.558 moles) acetone, 123 grams (0.593 moles) TEOS, 104 grams (0.432 moles) phenyltriethoxysilane, 0.6 grams 1.0 M, 10 M and pure acetic acid (added to three separate solutions, respectively) and 72 grams deionized water were combined. In two other solutions containing 10 M acetic acid, 90 g and 110 g of deionized water were added, respectively. The flask was refluxed and/or heated for 1 to 12 hours. To the solution, 57 grams (0.769 moles) of Butanol, 88 grams (1.422 moles) 2-propanol, 44 grams (0.758 moles) of acetone, 59 grams (1.227 moles) of ethanol, 9.5 grams (0.528 moles) deionized water were added. Thickness=1727 Å, n=1.957, k=0.384.

In three additional solutions, 1.00 g of TMAH was added. In each solution, the TMAH was added before, during and after the refluxing step, respectively.

Synthesis of Absorbing Material Containing Phenyltrimethoxysilane and a pH Tuning Agent In a 1-liter flask 297 grams (4.798 moles) 2-propanol, 148 grams (2.558 moles) acetone, 123 grams (0.593 moles) TEOS, 104 grams (0.432 moles) phenyltriethoxysilane, 0.6 grams 0.1 M, 0.01 M and 1.0 M nitric acid (added to three separate solutions, respectively) and 72 grams deionized water were combined. In two other solutions containing 0.1 M nitric acid, 90 g and 110 g of deionized water were added, respectively. The flask was refluxed and/or heated for 1 to 12 hours. To the solution, 57 grams (0.769 moles) of Butanol, 88 grams (1.422 moles) 2-propanol, 44 grams (0.758 moles) of acetone, 59 grams (1.227 moles) of ethanol, 9.5 grams (0.528 moles) deionized water were added.

In three additional solutions, 1.00 g of APTEOS was added. In each solution, the APTEOS was added before, during and after the refluxing step, respectively.

Synthesis of Absorbing Material Containing Phenyltripropoxysilane and a pH Tuning Agent In a 1-liter flask 297 grams (4.798 moles) 2-propanol, 148 grams (2.558 moles) acetone, 123 grams (0.593 moles) TEOS, 104 grams (0.432 moles) phenyltriethoxysilane, 0.6 grams 1.0 M, 10 M and pure lactic acid (added to three separate solutions, respectively) and 72 grams deionized water were combined. In two other solutions containing 10 M lactic acid, 90 g and 110 g of deionized water were added, respectively. The flask was refluxed and/or heated for 1 to 12 hours. To the solution, 57 grams (0.769 moles) of Butanol, 88 grams (1.422 moles) 2-propanol, 44 grams (0.758 moles) of acetone, 59 grams (1.227 moles) of ethanol, 9.5 grams (0.528 moles) deionized water were added.

In three additional solutions, 0.75 g of APTEOS was added. In each solution, the APTEOS was added before, during and after the refluxing step, respectively.

Synthesis of Absorbing Material Containing Phenyltributoxysilane and a pH Tuning Agent In a 1-liter flask 297 grams (4.798 moles) 2-propanol, 148 grams (2.558 moles) acetone, 123 grams (0.593 moles)

TEOS, 104 grams (0.432 moles) phenyltriethoxysilane, 0.6 grams 1.0 M, 10 M and pure acetic acid (added to three separate solutions, respectively) and 72 grams deionized water were combined. In two other solutions containing 10 M acetic acid, 90 g and 110 g of deionized water were added, respectively. The flask was refluxed and/or heated for 1 to 12 hours. To the solution, 57 grams (0.769 moles) of Butanol, 88 grams (1.422 moles) 2-propanol, 44 grams (0.758 moles) of acetone, 59 grams (1.227 moles) of ethanol, 9.5 grams (0.528 moles) deionized water were added.

In three additional solutions, 0.50 g of APTEOS was added. In each solution, the APTEOS was added before, during and after the refluxing step, respectively.

Example 20

Synthesis of Absorbing Material Containing 4-ethoxyphenylazobenzene-4-carboxy-methyl Triethoxysilane and a pH Tuning Agent In a 1-liter flask 297 grams (4.798 moles) 2-propanol, 148 grams (2.558 moles) acetone, 123 grams (0.593 moles) TEOS, 77 grams (0.432 moles) MTEOS, 44.5 grams (0.13 moles) 4-ethoxyphenylazobenzene-4-carboxy-methyl triethoxysilane, 0.6 grams 1.0 M, 10 M and pure acetic acid (added to three separate solutions, respectively) and 72 grams deionized water were combined. In two other solutions containing 10 M acetic acid, 90 g and 110 g of deionized water were added, respectively. The flask was refluxed and/or heated for 1 to 12 hours. To the solution, 57 grams (0.769 moles) of butanol, 88 grams (1.422 moles) 2-propanol, 44 grams (0.758 moles) of acetone, 59 grams (1.227 moles) of ethanol, 9.5 grams (0.528 moles) deionized water were added.

In three additional solutions, 0.50 g of APTEOS was added. In each solution, the APTEOS was added before, during and after the refluxing step, respectively.

Synthesis of Absorbing Material Containing 4-ethoxyphenylazobenzene-4-carboxy-ethyl Triethoxysilane In a 1-liter flask 297 grams (4.798 moles) 2-propanol, 148 grams (2.558 moles) acetone, 123 grams (0.593 moles) TEOS, 77 grams (0.432 moles) MTEOS, 44.5 grams (0.13 moles) 4-ethoxyphenylazobenzene-4-carboxy-methyl triethoxysilane, 0.6 grams 1.0 M, 10 M and pure lactic acid (added to three separate solutions, respectively) and 72 grams deionized water were combined. In two other solutions containing 10 M lactic acid, 90 g and 110 g of deionized water were added, respectively. The flask was refluxed and/or heated for 1 to 12 hours. To the solution, 57 grams (0.769 moles) of butanol, 88 grams. (1.422 moles) 2-propanol, 44 grams (0.758 moles) of acetone, 59 grams (1.227 moles) of ethanol, 9.5 grams (0.528 moles) deionized water were added.

In three additional solutions, 0.25 g of APTEOS was added. In each solution, the APTEOS was added before, during and after the refluxing step, respectively.

Synthesis of Absorbing Material Containing 4-methoxyphenylazobenzene-4-carboxy-propyl Triethoxysilane In a 1-liter flask 297 grams (4.798 moles) 2-propanol, 148 grams (2.558 moles) acetone, 123 grams (0.593 moles) TEOS, 77 grams (0.432 moles) MTEOS, 44.5 grams (0.13 moles) 4-ethoxyphenylazobenzene-4-carboxy-methyl triethoxysilane, 0.6 grams 0.1 M, 0.01 M and 1.0 M nitric acid (added to three separate solutions, respectively) and 72 grams deionized water were combined. In two other solutions containing 0.1 M nitric acid, 90 g and 110 g of deionized water were added, respectively. The flask was refluxed and/or heated for 1 to 12 hours. To the solution, 57 grams (0.769 moles) of butanol, 88 grams (1.422 moles) 2-propanol, 44 grams (0.758 moles) of acetone, 59 grams (1.227 moles) of ethanol, 9.5 grams (0.528 moles) deionized water were added.

In three additional solutions, 0.10 g of APTEOS was added. In each solution, the APTEOS was added before, during and after the refluxing step, respectively.

Synthesis of Absorbing Material Containing 4-methoxyphenylazobenzene-4-carboxy-propyl Trimethoxysilane In a 1-liter flask 297 grams (4.798 moles) 2-propanol, 148 grams (2.558 moles) acetone, 123 grams (0.593 moles) TEOS, 77 grams (0.432 moles) MTEOS, 44.5 grams (0.13 moles) 4-ethoxyphenylazobenzene-4-carboxy-methyl triethoxysilane, 0.6 grams 0.1 M, 0.01 M and 1.0 M hydrochloric acid (added to three separate solutions, respectively) and 72 grams deionized water were combined. In two other solutions containing 0.1 M hydrochloric acid, 90 g and 110 g of deionized water were added, respectively. The flask was refluxed and/or heated for 1 to 12 hours. To the solution, 57 grams (0.769 moles) of butanol, 88 grams (1.422 moles) 2-propanol, 44 grams (0.758 moles) of acetone, 59 grams (1.227 moles) of ethanol, 9.5 grams (0.528 moles) deionized water were added. n=1.499, k=0.162 at 365 mm.

In three additional solutions, 0.50 g of TMAH was added. In each solution, the TMAH was added before, during and after the refluxing step, respectively.

Example 21

Synthesis of an Absorbing Material Containing PGMEA and a pH Tuning Agent

In a 1-liter flask, 504.829 g of PGMEA, 123.6 grams TEOS, 76.9 grams MTEOS, 5.608 grams 0.1 M nitric acid and 66.869 grams deionized water were combined. The flask was refluxed and/or heated for 1 to 12 hours. To the solution, 43.777 grams of butanol was added. The solution was filtered to be used in the pH tuning experiments.

In another 1-liter flask, 297 grams 2-propanol, 148.560 grams acetone, 139.902 grams TEOS, 19.10 grams MTEOS, 51.7 g PTEOS, 5.624 grams 0.1 M nitric acid and 66.827 grams deionized water were combined. The flask was refluxed and/or heated for 1 to 12 hours. To the solution, 43.93 grams of butanol was added. The solution was filtered to be used in the pH tuning experiments.

The two solutions prepared were combined, and a pH tuning agent, APTEOS, was added to 6 separate solutions of 650 g of the combined material that has a starting pH of about 1.7. The APTEOS was added in the following amounts and gave the following pH: a) 1.49 g (pH=8.07); b) 0.26 g (pH=7.12); c) 0.1 g (pH=6.29); d) 0.06 (pH=5.50); e) 0.03 g (pH=2.49); 0 grams (pH=1.76). The solutions were then dispensed, followed by a 3000 rpm thickness spin for 20 seconds, and baked at 80° C. and at 180° C. for one minute each.

Optical properties were measured with an N & K Technology Model 1200 analyzer. Optical properties follow for each of the A-F solutions shown above:

a) Thickness=1686 Angstroms; k=0.297; n=1.802; etch ratio(er)=9.33 b) Thickness=1332 Angstroms; k=0.295; n=1.802; etch ratio(er)=8.5 c) Thickness=1298 Angstroms; k=0.294; n=1.802; etch ratio(er)=8.316 d) Thickness=1292 Angstroms; k=0.293; n=1.802; etch ratio(er)=8.17 e) Thickness=1304.9 Angstroms; k=0.292; n=1.802; etch ratio(er)=8.01 f) Thickness=1263.9 Angstroms; k=0.289; n=1.802; etch ratio(er)=7.83

Examples 22-45

The following runs were made according to the matrix:

| PtType | Blocks | PGMEA | EtOH | TEOS | MTEOS | PTEOS |
|---|---|---|---|---|---|---|
| 0 | 1 | 0.5 | 0.5 | 1 | 1 | 1 |
| 1 | 1 | 0.2 | 0.8 | 1 | 1 | 1 |
| 1 | 1 | 0.8 | 0.2 | 1 | 1 | 1 |
| 0 | 1 | 0.5 | 0.5 | −1 | 1 | 1 |
| 1 | 1 | 0.2 | 0.8 | −1 | 1 | 1 |
| 1 | 1 | 0.8 | 0.2 | −1 | 1 | 1 |
| 0 | 1 | 0.5 | 0.5 | 1 | −1 | 1 |
| 1 | 1 | 0.2 | 0.8 | 1 | −1 | 1 |
| 1 | 1 | 0.8 | 0.2 | 1 | −1 | 1 |
| 0 | 1 | 0.5 | 0.5 | −1 | −1 | 1 |
| 1 | 1 | 0.2 | 0.8 | −1 | −1 | 1 |
| 1 | 1 | 0.8 | 0.2 | −1 | −1 | 1 |
| 0 | 1 | 0.5 | 0.5 | 1 | 1 | −1 |
| 1 | 1 | 0.2 | 0.8 | 1 | 1 | −1 |
| 1 | 1 | 0.8 | 0.2 | 1 | 1 | −1 |
| 0 | 1 | 0.5 | 0.5 | −1 | 1 | −1 |
| 1 | 1 | 0.2 | 0.8 | −1 | 1 | −1 |
| 1 | 1 | 0.8 | 0.2 | −1 | 1 | −1 |
| 0 | 1 | 0.5 | 0.5 | 1 | −1 | −1 |
| 1 | 1 | 0.2 | 0.8 | 1 | −1 | −1 |
| 1 | 1 | 0.8 | 0.2 | 1 | −1 | −1 |
| 0 | 1 | 0.5 | 0.5 | −1 | −1 | −1 |
| 1 | 1 | 0.2 | 0.8 | −1 | −1 | −1 |
| 1 | 1 | 0.8 | 0.2 | −1 | −1 | −1 |

In a 1-liter flask, [356 to 89] grams of PGMEA, [356 to 89] grams of EtOH, 5.608 grams 0.1 M nitric acid and 66.869 grams deionized water were combined. [140 to 0] grams TEOS, [19 to 0] grams MTEOS and [52 to 0] grams PTEOS were then added. The flask was refluxed and/or heated for 1 to 12 hours. To the solution, [140 to 0] grams TEOS, [52 to 0] grams MTEOS and [52 to 0] grams PTEOS were added. The flask was refluxed and/or heated for 1 to 12 hours. The solutions were diluted to a desired thickness then analyzed.

| Run # | Mn | Mw | Mp | Mz | Mz + 1 | Poly-dispersity | T avg | Film Quality | Mass Lost | 10% delta th | 5% Delta Th | 2.3% Delta Th | No 89 lost |
|---|---|---|---|---|---|---|---|---|---|---|---|---|---|
| 1 | 711 | 997 | 754 | 1336 | 1674 | 1.40286 | 3855 | 2 | 9.65 | −34 | −50 | −53 | 307 |
| 2 | 649 | 887 | 734 | 1177 | 1482 | 1.36626 | 4121 | 3 | 9.47 | −39 | −65 | −59 | 360 |
| 3 | 770 | 1204 | 401 | 1738 | 2259 | 1.5631 | 3544 | 1 | 8.12 | −48 | −47 | −43 | 191 |
| 4 | 651 | 1134 | 407 | 1818 | 2434 | 1.74309 | 3592 | 2 | 9.24 | −6 | −26 | −24 | 379 |
| 5 | 635 | 1011 | 404 | 1513 | 1990 | 1.59247 | 3688 | 3 | 7.23 | −22 | −50 | −51 | 462 |
| 6 | 804 | 1144 | 768 | 1553 | 1955 | 1.42382 | 3752 | 2 | 9.41 | 1 | −1 | −1 | 277 |
| 7 | 760 | 1062 | 772 | 1428 | 1801 | 1.39791 | 3781 | 1 | NA | −48 | −53 | −52 | 349 |
| 8 | 686 | 923 | 755 | 1206 | 1497 | 1.34554 | 3971 | 3 | 9.86 | −55 | −52 | −54 | 465 |
| 9 | 788 | 1242 | 408 | 1797 | 2326 | 1.57505 | 3406 | 1 | 9.67 | −20 | −35 | −34 | 226 |
| 10 | 655 | 1038 | 409 | 1525 | 1979 | 1.58485 | 3656 | 2 | 8.15 | −31 | −46 | −41 | 358 |
| 11 | 621 | 961 | 410 | 1394 | 1813 | 1.54735 | 3813 | 3 | 10.40 | −45 | −59 | −61 | 432 |
| 12 | 680 | 916 | 568 | 1231 | 1573 | 1.34787 | 3743 | 3 | 7.96 | −13 | −20 | −15 | 252 |
| 13 | 688 | 954 | 408 | 1307 | 1681 | 1.386 | 3834 | 2 | 10.04 | −23 | −50 | −40 | 352 |
| 14 | 666 | 1427 | 413 | 2731 | 3949 | 2.14366 | 3115 | 2 | 8.07 | −29 | −57 | −36 | 467 |
| 15 | 741 | 1141 | 414 | 1715 | 2294 | 1.5397 | 3365 | 1 | 8.03 | −10 | −24 | −24 | 262 |
| 16 | 668 | 1358 | 414 | 2448 | 3492 | 2.03209 | 3204 | 1 | 6.84 | −42 | −50 | −51 | 345 |
| 17 | 750 | 1036 | 764 | 1379 | 1727 | 1.38086 | 4060 | 3 | 10.55 | −41 | −39 | −70 | 456 |
| 18 | 869 | 1420 | 413 | 2125 | 2817 | 1.63471 | 3370 | 1 | 8.93 | −33 | −36 | −33 | 225 |
| 19 | 719 | 1016 | 565 | 1427 | 1868 | 1.41367 | 3642 | 2 | 10.73 | −16 | −38 | −30 | 441 |
| 20 | 672 | 908 | 410 | 1224 | 1568 | 1.35097 | 3829 | 3 | 6.79 | −30 | −57 | −50 | 504 |
| 21 | 772 | 1172 | 413 | 1732 | 2281 | 1.51832 | 3246 | 1 | 8.93 | −4 | −14 | −9 | 310 |
| 22 | 779 | 1099 | 766 | 1482 | 1871 | 1.41068 | 3864 | 2 | 9.89 | −32 | −56 | −59 | 348 |
| 23 | 711 | 966 | 743 | 1278 | 1605 | 1.35985 | 4152 | 3 | 13.32 | −44 | −67 | −53 | 493 |
| 24 | 795 | 1263 | 749 | 1845 | 2427 | 1.58804 | 3479 | 1 | 9.35 | −39 | −50 | −38 | 194 |

Example 46

Via first copper dual damascene patterning through ultra low k dielectrics (dielectric constant less than about 3) is very difficult. The main problem is the selective removal of the sacrificial fill material from these ultra-low k dielectric materials. Previous work has shown that Si—O fill material (either UV, absorbing or transparent fill material) is the optimum material platform if the dielectric layer is Si—O based. To improve the removal selectivity, the fill material is made chemically weaker through the addition of a material modification agent, such as those described herein. However, the Si—O fill material needs to be balanced so that both resistance to 2.5% TMAH based photoresist developer, resistance to the solvents comprising the photoresist or if the Si—O fill material is transparent, the absorbing composition, and at the same time showing a highly selective strip to the ultra-low k dielectric materials, coatings and/or films.

To solve this problem the photoresist can be patterned directly on the Si—O material. In order to be patternable, the fill material should be resistant to 2.5% photoresist developer and to the solvents that comprise ArF, KrF and other type of photoresists. An absorbing composition layer must then be applied on top of the chemically weak Si—O based fill material. Surprisingly, resistance can be maintained to non-aqueous solvents (in this case PGMEA) while at the same time allowing for complete removal by a standard photoresist developer (2.5% TMAH in water) system. Such a contrast in chemical resistance means that an organic absorbing composition layer should be coated onto an extremely weak Si—O film. Photoresist patterning would then occur on the organic absorbing composition layer and not on the Si—O layer. Since the Si—O can be rapidly removed in mild 2.5% TMAH solutions, it can also be rapidly removed in other fluoride and more aggressive alkaline chemistries. Such an increase in strip rate provides the selectivity to ultra low k films that is needed.

To a Si—O based organo-siloxane solution (in this case we used a 248 nm absorbing composition), we add polyethylene oxide porogen (in the study conducted 2.2% of polyethylene oxide was used). The films are cast onto wafers containing vias (via first copper dual damascene pattern), and then baked to a temperature between about 250 and 275° C. Our data shows that the "porous" 248 nm absorbing composition film is resistant to PGMEA at this bake temperature. It is also 75° C. above the bake temperature required by the absorbing composition/anti-reflective process (anywhere between 170 and 220° C.). Next an organic absorbing composition/anti-reflective film is coated and baked on top of the Si—O layer. A thinner organic absorbing composition/anti-reflective layer can be used as the via fill is handled by the weak Si—O based layer. A thinner organic absorbing composition/anti-reflective layer facilitates the pattern transfer of photoresist through and into the Si—O and ultra-low k layer. Also, since the Si—O layer is now so weak it can be coated to sufficient thickness to improve planarization. Also the Si—O layer can be made absorbing at the patterning wavelength thus no longer placing a thickness constraint on the organic absorbing composition/anti-reflective. The organic absorbing composition/anti-reflective layer can be made sufficiently thin to act simply as a cap to the weak Si—O film. Making the organic absorbing composition/anti-reflective so thin further improves the ability to accurately transfer through the use of plasma etch the imaged pattern in the resist into the dielectric below.

Photoresist is then deposited and then trench patterned onto the organic absorbing composition/anti-reflective layer. The trench pattern is then etched through the organic absorbing composition/anti-reflective layer, the Si—O layer and into the ultra-low k layer. Once the etch is complete the remaining photoresist is removed and organic absorbing composition/anti-reflective is removed, followed by the removal of the remaining Si—O layer. Now the trench-via pattern is defined and ready for metalization.

In summary, the porous film is baked to a temperature too low to drive out the porogen. The porogen conduits are left behind within the Si—O anti-reflective coating film that when exposed to 2.3% TMAH is completely removed. However when exposed to PGMEA nothing occurs.

Thus, specific embodiments and applications of compositions and methods to produce inorganic-based materials, spin-on materials, spin-on inorganic materials and spin-on glass materials comprising absorbing compounds and that comprise at least one material modification agent, such as at least one porogen, at least one high-boiling solvent, at least one catalyst, at least one replacement solvent, at least one capping agent, at least one leveling agent, at least one adhesion promoter, at least one pH tuning agent, and/or a combination thereof have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

TABLE 1

| Description | Condition | Days @ 40 C. Days | GPC | | | | | | Thickness (Å) at 2000 RPMz | | | | | pH |
| | | | Mn | Mw | Mp | Mz | Mz + 1 | Poly-dispersity | T avg | T stdev | T min | T max | % Fit | pH |
| --- | --- | --- | --- | --- | --- | --- | --- | --- | --- | --- | --- | --- | --- | --- |
| POR pH = 5 | Initial | 0 | 1324 | 2389 | 2511 | 3774 | 5234 | 1.804218 | 1936 | 12 | 1922 | 1958 | 99.3 | 5.39 |
| | Sample #1 | 4 | 1652 | 3647 | 2930 | 6651 | 9946 | 2.207179 | 1945 | 10 | 1933 | 1962 | 99.4 | 4.60 |
| | Sample #2 | 7 | 1757 | 4571 | 3055 | 9652 | 16567 | 2.601320 | 1974 | 15 | 1944 | 1997 | 99.5 | 4.41 |
| POR pH = 3 | Initial | 0 | 1041 | 1505 | 771 | 2086 | 2700 | 1.445452 | 1954 | 7 | 1945 | 1965 | 99.4 | 4.42 |
| | Sample #1 | 4 | 1233 | 2074 | 1780 | 3360 | 4883 | 1.682888 | 1950 | 13 | 1935 | 1971 | 99.4 | 3.43 |
| | Sample #2 | 7 | 1294 | 2589 | 2373 | 4776 | 7576 | 2.001626 | 1964 | 13 | 1947 | 1988 | 99.5 | 3.29 |
| POR pH = 1.5 | Initial | 0 | 985 | 1358 | 770 | 1802 | 2247 | 1.377910 | 1895 | 10 | 1874 | 1910 | 99.3 | 1.93 |
| | Sample #1 | 4 | 1033 | 1403 | 1187 | 1827 | 2229 | 1.358056 | 1911.91 | 16 | 1885 | 1926 | 99.3 | 1.94 |
| | Sample #2 | 7 | 1078 | 1547 | 1338 | 2090 | 2639 | 1.434647 | 1885.55 | 8 | 1874 | 1899 | 99.3 | 2.03 |

TABLE 1-continued

| Description | Condition | Days @ 40 C. Days | GPC | | | | | Poly-dispersity | Thickness (Å) at 2000 RPMz | | | | % Fit | pH |
|---|---|---|---|---|---|---|---|---|---|---|---|---|---|---|
| Description | Condition | Days | Mn | Mw | Mp | Mz | Mz + 1 | dispersity | T avg | T stdev | T min | T max | Fit | pH |
| 2:1 PGMEA/EtOH pH = 5 | Initial | 0 | 1264 | 2559 | 2704 | 4288 | 6286 | 2.024211 | 1899 | 9 | 1889 | 1914 | 99.3 | 5.25 |
| | Sample #1 | 4 | 1637 | 3682 | 2949 | 6595 | 9741 | 2.248779 | 1901 | 12 | 1886 | 1918 | 99.3 | 4.37 |
| | Sample #2 | 7 | 1720 | 4897 | 3043 | 11500 | 25069 | 2.847876 | 1920 | 12 | 1905 | 1940 | 99.4 | 4.12 |
| 2:1 PGMEA/EtOH pH = 3 | Initial | 0 | 918 | 1288 | 744 | 1759 | 2253 | 1.402608 | 1909 | 9 | 1900 | 1930 | 99.3 | 3.92 |
| | Sample #1 | 4 | 1103 | 2014 | 1786 | 3444 | 5135 | 1.825808 | 1911 | 16 | 1887 | 1936 | 99.3 | 3.19 |
| | Sample #2 | 7 | 1298 | 2931 | 2583 | 5936 | 10091 | 2.258633 | 1908 | 12 | 1896 | 1932 | 99.4 | 3.05 |
| 2:1 PGMEA/EtOH pH = 1.5 | Initial | 0 | 854 | 1189 | 746 | 1591 | 1992 | 1.392050 | 1852 | 9 | 1833 | 1866 | 99.3 | 1.89 |
| | Sample #1 | 4 | 1046 | 1450 | 1204 | 1915 | 2360 | 1.385914 | 1865 | 8 | 1851 | 1876 | 99.3 | 1.96 |
| | Sample #2 | 7 | 1159 | 1744 | 1502 | 2441 | 3191 | 1.505260 | 1888 | 75 | 1858 | 2087 | 99.1 | 1.91 |
| 2:1 IPA/PGMEA pH = 5 | Initial | 0 | 1189 | 2410 | 2579 | 3919 | 5539 | 2.027078 | 1960 | 11 | 1949 | 1979 | 99.4 | 5.31 |
| | Sample #1 | 4 | 1475 | 3798 | 2980 | 7128 | 10726 | 2.575447 | 1974 | 10 | 1962 | 1992 | 99.5 | 4.09 |
| | Sample #2 | 7 | 1599 | 4397 | 2997 | 9195 | 16139 | 2.749307 | 1972 | 13 | 1957 | 1998 | 99.5 | 4.02 |
| 2:1 IPA/PGMEA pH = 3 | Initial | 0 | 858 | 1289 | 749 | 1805 | 2314 | 1.502677 | 1983 | 16 | 1967 | 2016 | 99.4 | 3.91 |
| | Sample #1 | 4 | 1166 | 2402 | 2252 | 4330 | 6551 | 2.059391 | 1960 | 13 | 1935 | 1982 | 99.4 | 3.18 |
| | Sample #2 | 7 | 1203 | 2694 | 2491 | 5199 | 8364 | 2.239049 | 1967 | 10 | 1956 | 1986 | 99.5 | 3.15 |
| 2:1 IPA/PGMEA pH = 1.5 | Initial | 0 | 838 | 1220 | 752 | 1668 | 2099 | 1.456108 | 1895 | 8 | 1885 | 1909 | 99.3 | 2.03 |
| | Sample #1 | 4 | 1065 | 1517 | 1439 | 2024 | 2493 | 1.425050 | 1914 | 19 | 1882 | 1937 | 99.3 | 2.12 |
| | Sample #2 | 7 | 1101 | 1637 | 1507 | 2263 | 2912 | 1.486570 | 1855 | 16 | 1833 | 1873 | 99.3 | 2.12 |
| 2:1 EtOH/PGMEA pH = 5 | Initial | 0 | 1101 | 2488 | 2700 | 4182 | 5873 | 2.258769 | 2046 | 9 | 2036 | 2063 | 99.5 | 5.55 |
| | Sample #1 | 4 | 1340 | 3517 | 2930 | 6569 | 9938 | 2.625218 | 2025 | 16 | 2003 | 2058 | 99.5 | 4.50 |
| | Sample #2 | 7 | 1441 | 4167 | 3030 | 8511 | 14250 | 2.892158 | 2053 | 15 | 2032 | 2079 | 99.5 | 4.36 |
| 2:1 EtOH/PGMEA pH = 3 | Initial | 0 | 698 | 1007 | 722 | 1407 | 1835 | 1.443613 | 2076 | 15 | 2060 | 2110 | 99.5 | 3.76 |
| | Sample #1 | 4 | 937 | 1799 | 382 | 3263 | 5097 | 1.919020 | 2048 | 16 | 2022 | 2075 | 99.5 | 3.17 |
| | Sample #2 | 7 | 1035 | 2219 | 383 | 4307 | 7001 | 2.143891 | 2052 | 14 | 2034 | 2081 | 99.5 | 3.19 |
| 2:1 EtOH/PGMEA pH = 1.5 | Initial | 0 | 694 | 940 | 727 | 1238 | 1548 | 1.353852 | 1914 | 7 | 1905 | 1926 | 99.2 | 2.10 |
| | Sample #1 | 4 | 986 | 1322 | 762 | 1717 | 2108 | 1.340978 | 1971 | 19 | 1935 | 2000 | 99.3 | 2.13 |
| | Sample #2 | 7 | 1068 | 1490 | 1200 | 1989 | 2509 | 1.395892 | 2039 | 21 | 2007 | 2066 | 99.5 | 2.10 |

TABLE 2

| Reflex Time (hrs) | Temp (C.) | GPC | | | | | Poly-dispersity | Low MW Species % Area | % Height | Thickness (Å) | | | |
|---|---|---|---|---|---|---|---|---|---|---|---|---|---|
| Time | Temp | Mn | Mw | Mp | Mz | Mz + 1 | dispersity | % Area | Height | T avg | T stdev | T min | T max |
| 4 | 50 | 682 | 924 | 731 | 1213 | 1512 | 1.354 | 3.62 | 18.58 | 3091 | 27 | 3056 | 3144 |
| 6 | 60 | 775 | 1057 | 744 | 1395 | 1741 | 1.364 | 2.06 | 11.69 | 3079 | 18 | 3052 | 3103 |
| 8 | 70 | 879 | 1225 | 757 | 1634 | 2047 | 1.393 | 1.05 | 7.20 | 3075 | 30 | 3033 | 3128 |
| 4 | 60 | 783 | 1076 | 749 | 1428 | 1791 | 1.373 | 1.71 | 10.96 | 3063 | 22 | 3040 | 3106 |
| 6 | 50 | 727 | 1001 | 743 | 1332 | 1678 | 1.376 | 2.53 | 14.02 | 3083 | 20 | 3054 | 3115 |
| 8 | 70 | 792 | 1099 | 750 | 1472 | 1859 | 1.388 | 2.12 | 12.32 | 3076 | 20 | 3044 | 3106 |

| Reflex Time (hrs) | Optical Properties | | | | Normalized GC | | | | Density | pH | Solids Total |
|---|---|---|---|---|---|---|---|---|---|---|---|
| Time | % Fit | n | k | Tmeas | Rcalc | Water | Ethanol | Butanol | PGMEA | Density | pH | % Solids |
| 4 | 99.3 | 1.829 | 0.276 | 0.0971 | 0.0959 | 5.00 | 58.2 | 5.73 | 20.0 | 0.8900 | 2.33 | 11.04 |
| 6 | 99.3 | 1.827 | 0.287 | 0.0974 | 0.0960 | 4.98 | 57.9 | 5.85 | 20.3 | 0.8897 | 2.34 | 10.99 |
| 8 | 99.33 | 1.831 | 0.277 | 0.0972 | 0.0961 | 4.90 | 57.5 | 6.04 | 20.5 | 0.8894 | 2.37 | 11.01 |
| 4 | 99.32 | 1.827 | 0.281 | 0.0964 | 0.0957 | 4.91 | 57.9 | 5.91 | 20.5 | 0.8896 | 2.35 | 10.79 |
| 6 | 99.33 | 1.825 | 0.284 | 0.0968 | 0.0955 | 4.90 | 57.7 | 6.88 | 20.6 | 0.8998 | 2.41 | 10.91 |
| 8 | 99.33 | 1.825 | 0.284 | 0.0967 | 0.0956 | 5.85 | 57.6 | 5.93 | 20.7 | 0.8997 | 2.37 | 10.91 |

TABLE 3

| | Heat Ramp (1 L Flask Temperature, ° C.) | | | | | |
|---|---|---|---|---|---|---|
| Run # | 1 | 2 | 3 | 4 | 5 | 6 |
| Run ID | 4 hr/50 C. | 6 hr/60 C. | 8 hr/70 C. | 6 hr/60 C. | 8 hr/50 C. | 4 hr/70C. |
| Mantle ID | 6 | 7 | 5 | 6 | 7 | 5 |
| Target (° C.) | 50 | 60 | 70 | 60 | 50 | 70 |
| Pre-water temperature | 16.2 | 16.5 | 14.6 | 16.2 | 16.8 | 14.4 |
| Time (min) | | | | | | |
| 0 | 18.6 | 19.0 | 17.0 | 19.6 | 20.0 | 17.9 |
| 5 | 22 | 22.8 | 20 | 23.2 | 24 | 21 |
| 10 | 29 | 29.8 | 24.9 | 30 | 31 | 25.9 |
| 15 | 38 | 38.8 | 31.5 | 39.1 | 40 | 32.8 |
| 20 | 46.5 | 47.4 | 38 | 48.2 | 48.1 | 39.7 |
| 25 | 52.9 | 55.7 | 44.6 | 56.3 | 53.8 | 46 |
| 30 | 55.6 | 60.5 | 49.8 | 61.4 | 56.4 | 51.8 |
| 35 | 55.7 | 62.3 | 53.9 | 63.5 | 56.2 | 56.5 |
| 40 | 54.1 | 62.6 | 56.9 | 63.9 | 55 | 60.1 |
| 45 | 52 | 62 | 59 | 62.7 | 53.4 | 63 |
| 50 | 49.6 | 60.7 | 61 | 61.4 | 51.7 | 65.3 |
| 55 | 48 | 59.9 | 62.5 | 59.9 | 49.6 | 67 |
| 60 | 46.6 | 58.8 | 63.6 | 58.8 | 48 | 68.1 |
| Butanol Temp (° C.) | | | | | | |
| 240 | 50 | | | | | 68 |
| 360 | | 60 | | 59.9 | | |
| 480 | | | 67.2 | | 49.4 | |

TABLE 4

| Sample | | MATERIAL INFORMATION | | | | VIA FILL (est. error: ±10%) | | VOIDING | | VIA TEST STRUCTURE INFORMATION | | | | | | | |
|---|---|---|---|---|---|---|---|---|---|---|---|---|---|---|---|---|---|
| | | Target Thickness | Thickness (Å) | Spin (rpm) | Mw on Spin date | Days Aged | via fill (μm) | % Via fill | Yes | No | Target Thickness | Sem Location | Via Diameter (μm) | Pitch (μm) | Via Depth (μm) | Pitch: Diameter | Aspect Ratio Depth: Diameter |
| Description | | | | | | | | | | | | | | | | | |
| Uncoated Wafer | | | | | | | | | | | | isolated | 0.14 | 0.90 | 0.86 | 6.3 | 6.0 |
| | | | | | | | | | | | | 1-1 | 0.23 | 0.39 | 1.14 | 1.7 | 5.0 |
| | | | | | | | | | | | | 1-3 | 0.23 | 0.46 | 1.19 | 2.0 | 5.2 |
| | | | | | | | | | | | | 1-5 | 0.24 | 0.54 | 1.17 | 2.2 | 4.8 |
| | | | | | | | | | | | | 3-1 | 0.19 | 0.30 | 1.11 | 1.6 | 6.0 |
| | | | | | | | | | | | | 3-3 | 0.19 | 0.34 | 1.04 | 1.8 | 5.6 |
| | | | | | | | | | | | | 3-5 | 0.19 | 0.37 | 1.03 | 2.0 | 5.5 |
| | | | | | | | | | | | | 6-1 | 0.14 | 0.27 | 0.91 | 1.9 | 6.4 |
| POR pH = 1.5 | | 2000 Å | 1945 | 1500 | 1286 | 4 days @ −20C. | 0.91 | 114% | | X | 2000 Å | isolated | 0.14 | 0.90 | 0.80 | 6.3 | 5.6 |
| | | | | | | | 0.53 | 46% | | X | | 1-1 | 0.23 | 0.39 | 1.14 | 1.7 | 5.0 |
| | | | | | | | 0.83 | 70% | | X | | 1-3 | 0.23 | 0.46 | 1.19 | 2.0 | 5.2 |
| | | | | | | | 0.89 | 76% | | X | | 1-5 | 0.24 | 0.54 | 1.17 | 2.2 | 4.8 |
| | | | | | | | 0.60 | 54% | | X | | 3-1 | 0.19 | 0.30 | 1.11 | 1.6 | 6.0 |
| | | | | | | | 0.69 | 66% | | X | | 3-3 | 0.19 | 0.34 | 1.04 | 1.8 | 5.6 |
| | | | | | | | 0.80 | 78% | | X | | 3-5 | 0.19 | 0.37 | 1.03 | 2.0 | 5.5 |
| | | | | | | | 0.61 | 67% | | X | | 6-1 | 0.14 | 0.27 | 0.91 | 1.9 | 6.4 |
| | | 2500 Å | 2562 | 1580 | 1303 | 0 | 1.14 | 108% | | X | 2500 Å | isolated | 0.14 | 0.90 | 1.06 | 6.3 | 7.4 |
| | | | | | | | 0.43 | 38% | | X | | 1-1 | 0.23 | 0.39 | 1.14 | 1.7 | 5.0 |
| | | | | | | | 0.77 | 65% | | X | | 1-3 | 0.23 | 0.46 | 1.19 | 2.0 | 5.2 |
| | | | | | | | 0.79 | 67% | | X | | 1-5 | 0.24 | 0.54 | 1.17 | 2.2 | 4.8 |
| | | | | | | | 0.80 | 72% | | X | | 3-1 | 0.19 | 0.30 | 1.11 | 1.6 | 6.0 |
| | | | | | | | 1.01 | 97% | | X | | 3-3 | 0.19 | 0.34 | 1.04 | 1.8 | 5.6 |
| | | | | | | | 1.10 | 107% | | X | | 3-5 | 0.19 | 0.37 | 1.03 | 2.0 | 5.5 |
| | | | | | | | 0.97 | 106% | | X | | 6-1 | 0.14 | 0.27 | 0.91 | 1.9 | 6.4 |
| | | 3500 Å | 3499 | 1500 | 1305 | 0 | 0.90 | 105% | | X | 3500 Å | isolated | 0.14 | 0.90 | 0.86 | 6.3 | 6.0 |
| | | | | | | | 1.13 | 99% | | X | | 1-1 | 0.23 | 0.39 | 1.14 | 1.7 | 5.0 |
| | | | | | | | 1.20 | 101% | | X | | 1-3 | 0.23 | 0.46 | 1.19 | 2.0 | 5.2 |
| | | | | | | | 1.24 | 106% | | X | | 1-5 | 0.24 | 0.54 | 1.17 | 2.2 | 4.8 |
| | | | | | | | 1.00 | 99% | | X | | 3-1 | 0.19 | 0.30 | 1.11 | 1.6 | 6.0 |
| | | | | | | | 1.14 | 110% | | X | | 3-3 | 0.19 | 0.34 | 1.04 | 1.8 | 5.6 |
| | | | | | | | 1.17 | 114% | | X | | 3-5 | 0.19 | 0.37 | 1.03 | 2.0 | 5.5 |
| | | | | | | | 1.06 | 116% | | X | | 6-1 | 0.14 | 0.27 | 0.91 | 1.9 | 6.4 |
| POR pH = 1.5 + high by solvent | | 2000 Å | 2061 | 1580 | 1295 | 0 | 1.03 | 116% | | X | 2000 Å | isolated | 0.14 | 0.90 | 0.89 | 6.3 | 6.2 |
| | | | | | | | 0.44 | 39% | | X | | 1-1 | 0.23 | 0.39 | 1.14 | 1.7 | 5.0 |
| | | | | | | | 0.69 | 63% | | X | | 1-3 | 0.23 | 0.46 | 1.09 | 2.0 | 4.8 |
| | | | | | | | 1.04 | 89% | | X | | 1-5 | 0.24 | 0.54 | 1.17 | 2.2 | 4.8 |
| | | | | | | | 0.74 | 67% | | X | | 3-1 | 0.19 | 0.30 | 1.11 | 1.6 | 6.0 |
| | | | | | | | 0.83 | 79% | | X | | 3-3 | 0.19 | 0.34 | 1.04 | 1.8 | 5.6 |
| | | | | | | | 1.03 | 100% | | X | | 3-5 | 0.19 | 0.37 | 1.03 | 2.0 | 5.5 |
| | | | | | | | 0.80 | 81% | | X | | 6-1 | 0.14 | 0.27 | 0.99 | 1.9 | 6.9 |
| | | 2500 Å | 2447 | 1760 | 1304 | 0 | 0.97 | 113% | | X | 2500 Å | isolated | 0.14 | 0.90 | 0.86 | 6.3 | 6.0 |
| | | | | | | | 0.83 | 73% | | X | | 1-1 | 0.23 | 0.39 | 1.14 | 1.7 | 5.0 |
| | | | | | | | 0.97 | 82% | | X | | 1-3 | 0.23 | 0.46 | 1.19 | 2.0 | 5.2 |

TABLE 4-continued

| Sample Description | MATERIAL INFORMATION ||||| VIA FILL (est. error: ±10%) ||| VOIDING || VIA TEST STRUCTURE INFORMATION |||||||
|---|---|---|---|---|---|---|---|---|---|---|---|---|---|---|---|---|
| | Target Thickness | Thickness (Å) | Spin (rpm) | Mw on Spin date | Days Aged | via fill (µm) | % Via fill | Yes | No | Target Thickness | Sem Location | Via Diameter (µm) | Pitch (µm) | Via Depth (µm) | Pitch: Diameter | Aspect Ratio Depth: Diameter |
| | | | | | | 1.17 | 100% | | X | | 1-5 | 0.24 | 0.54 | 1.17 | 2.2 | 4.8 |
| | | | | | | 0.81 | 73% | | X | | 3-1 | 0.19 | 0.30 | 1.11 | 1.6 | 6.0 |
| | | | | | | 0.93 | 89% | | X | | 3-3 | 0.19 | 0.34 | 1.04 | 1.8 | 5.6 |
| | | | | | | 1.04 | 101% | | X | | 3-5 | 0.19 | 0.37 | 1.03 | 2.0 | 5.5 |
| | | | | | | 0.83 | 85% | | X | | 6-1 | 0.14 | 0.27 | 0.97 | 1.9 | 6.8 |
| | 3500 Å | 3480 | 1660 | 1304 | 0 | 1.17 | 137% | | X | 3500 Å | isolated | 0.14 | 0.90 | 0.86 | 6.3 | 6.0 |
| | | | | | | 1.17 | 103% | | X | | 1-1 | 0.23 | 0.39 | 1.14 | 1.7 | 5.0 |
| | | | | | | 1.21 | 102% | | X | | 1-3 | 0.23 | 0.46 | 1.19 | 2.0 | 5.2 |
| | | | | | | 1.31 | 112% | | X | | 1-5 | 0.24 | 0.54 | 1.17 | 2.2 | 4.8 |
| | | | | | | 1.11 | 100% | | X | | 3-1 | 0.19 | 0.30 | 1.11 | 1.6 | 6.0 |
| | | | | | | 1.14 | 110% | | X | | 3-3 | 0.19 | 0.34 | 1.04 | 1.8 | 5.6 |
| | | | | | | 1.23 | 119% | | X | | 3-5 | 0.19 | 0.37 | 1.03 | 2.0 | 5.5 |
| | | | | | | 1.03 | 106% | | X | | 6-1 | 0.14 | 0.27 | 0.97 | 1.9 | 6.8 |
| POR (pH = 5.6) | 2000 Å | 2001 | 1670 | 3418 | 4 days @ −20 C. | 0.99 | 115% | X | | 2000 Å | isolated | 0.14 | 0.90 | 0.86 | 6.3 | 6.0 |
| | | | | | | 0.21 | 19% | | X | | 1-1 | 0.23 | 0.39 | 1.14 | 1.7 | 5.0 |
| | | | | | | 0.26 | 22% | X | | | 1-3 | 0.23 | 0.46 | 1.19 | 2.0 | 5.2 |
| | | | | | | 0.29 | 24% | X | | | 1-5 | 0.24 | 0.54 | 1.17 | 2.2 | 4.8 |
| | | | | | | 0.29 | 26% | X | | | 3-1 | 0.19 | 0.30 | 1.11 | 1.6 | 6.0 |
| | | | | | | 0.29 | 27% | X | | | 3-3 | 0.19 | 0.34 | 1.04 | 1.8 | 5.6 |
| | | | | | | 0.29 | 28% | X | | | 3-5 | 0.19 | 0.37 | 1.03 | 2.0 | 5.5 |
| | | | | | | 0.30 | 33% | X | | | 6-1 | 0.14 | 0.27 | 0.91 | 1.9 | 6.4 |
| | 2500 Å | 2537 | 1790 | 3007 | 0 | 1.09 | 107% | X | | 2500 Å | isolated | 0.14 | 0.90 | 1.01 | 6.3 | 7.1 |
| | | | | | | 0.29 | 25% | X | | | 1-1 | 0.23 | 0.39 | 1.14 | 1.7 | 5.0 |
| | | | | | | 0.30 | 25% | X | | | 1-3 | 0.23 | 0.46 | 1.19 | 2.0 | 5.2 |
| | | | | | | 0.30 | 26% | X | | | 1-5 | 0.24 | 0.54 | 1.17 | 2.2 | 4.8 |
| | | | | | | 0.29 | 26% | X | | | 3-1 | 0.19 | 0.30 | 1.11 | 1.6 | 6.0 |
| | | | | | | 0.31 | 30% | X | | | 3-3 | 0.19 | 0.34 | 1.04 | 1.8 | 5.6 |
| | | | | | | 0.37 | 36% | X | | | 3-5 | 0.19 | 0.37 | 1.03 | 2.0 | 5.5 |
| | | | | | | 0.33 | 36% | X | | | 6-1 | 0.14 | 0.27 | 0.91 | 1.9 | 6.4 |
| | 3500 Å | 3506 | 1500 | 3334 | 0 | 1.14 | 133% | X | | 3500 Å | isolated | 0.14 | 0.90 | 0.86 | 6.3 | 6.0 |
| | | | | | | 0.70 | 61% | X | | | 1-1 | 0.23 | 0.39 | 1.14 | 1.7 | 5.0 |
| | | | | | | 0.99 | 83% | X | | | 1-3 | 0.23 | 0.46 | 1.19 | 2.0 | 5.2 |
| | | | | | | 1.27 | 109% | X | | | 1-5 | 0.24 | 0.54 | 1.17 | 2.2 | 4.8 |
| | | | | | | 0.59 | 53% | X | | | 3-1 | 0.19 | 0.30 | 1.11 | 1.6 | 6.0 |
| | | | | | | 0.80 | 77% | X | | | 3-3 | 0.19 | 0.34 | 1.04 | 1.8 | 5.6 |
| | | | | | | 0.91 | 89% | X | | | 3-5 | 0.19 | 0.37 | 1.03 | 2.0 | 5.5 |
| | | | | | | 0.91 | 100% | X | | | 6-1 | 0.14 | 0.27 | 0.91 | 1.9 | 6.4 |
| POR + high by solvent | 2000 Å | 2042 | 1700 | 3399 | 0 | 0.94 | 103% | | X | 2000 Å | isolated | 0.14 | 0.90 | 0.91 | 6.3 | 6.4 |
| | | | | | | 0.23 | 20% | | X | | 1-1 | 0.23 | 0.39 | 1.14 | 1.7 | 5.0 |
| | | | | | | 0.37 | 31% | | X | | 1-3 | 0.23 | 0.46 | 1.19 | 2.0 | 5.2 |

TABLE 4-continued

| Sample Description | MATERIAL INFORMATION | | | | | VIA FILL (est. error: ±10%) | | VOIDING | | VIA TEST STRUCTURE INFORMATION | | | | | Aspect Ratio |
|---|---|---|---|---|---|---|---|---|---|---|---|---|---|---|---|
| | Target Thickness | Thickness (Å) | Spin (rpm) | Mw on Spin date | Days Aged | via fill (µm) | % Via fill | Yes | No | Target Thickness | Sem Location | Via Diameter (µm) | Pitch (µm) | Via Depth (µm) | Pitch: Diameter | Depth: Diameter |
| | 2500 Å | 2509 | 1940 | 3101 | 0 | 0.43 | 37% | | X | | 1-5 | 0.24 | 0.54 | 1.17 | 2.2 | 4.8 |
| | | | | | | 0.26 | 23% | | X | | 3-1 | 0.19 | 0.30 | 1.11 | 1.6 | 6.0 |
| | | | | | | 0.36 | 34% | | X | | 3-3 | 0.19 | 0.34 | 1.04 | 1.8 | 5.6 |
| | | | | | | 0.43 | 42% | | X | | 3-5 | 0.19 | 0.37 | 1.03 | 2.0 | 5.5 |
| | | | | | | 0.37 | 41% | | X | | 6-1 | 0.14 | 0.27 | 0.91 | 1.9 | 6.4 |
| | | | | | | 1.10 | 128% | | X | 2500 Å | isolated | 0.14 | 0.90 | 0.86 | 6.3 | 6.0 |
| | | | | | | 0.40 | 35% | | X | | 1-1 | 0.23 | 0.39 | 1.14 | 1.7 | 5.0 |
| | | | | | | 0.50 | 42% | | X | | 1-3 | 0.23 | 0.46 | 1.19 | 2.0 | 5.2 |
| | | | | | | 0.57 | 49% | | X | | 1-5 | 0.24 | 0.54 | 1.17 | 2.2 | 4.8 |
| | | | | | | 0.40 | 36% | | X | | 3-1 | 0.19 | 0.30 | 1.11 | 1.6 | 6.0 |
| | | | | | | 0.43 | 41% | | X | | 3-3 | 0.19 | 0.34 | 1.04 | 1.8 | 5.6 |
| | | | | | | 0.57 | 56% | | X | | 3-5 | 0.19 | 0.37 | 1.03 | 2.0 | 5.5 |
| | | | | | | 0.46 | 50% | | X | | 6-1 | 0.14 | 0.27 | 0.91 | 1.9 | 6.4 |
| | 3500 Å | 3511 | 1590 | 3414 | 0 | 1.19 | 138% | | X | 3500 Å | isolated | 0.14 | 0.90 | 0.86 | 6.3 | 6.0 |
| | | | | | | 0.79 | 69% | | X | | 1-1 | 0.23 | 0.39 | 1.14 | 1.7 | 5.0 |
| | | | | | | 1.09 | 92% | X | | | 1-3 | 0.23 | 0.46 | 1.19 | 2.0 | 5.2 |
| | | | | | | 1.24 | 106% | X | | | 1-5 | 0.24 | 0.54 | 1.17 | 2.2 | 4.8 |
| | | | | | | 0.71 | 64% | | X | | 3-1 | 0.19 | 0.30 | 1.11 | 1.6 | 6.0 |
| | | | | | | 0.86 | 82% | | X | | 3-3 | 0.19 | 0.34 | 1.04 | 1.8 | 5.6 |
| | | | | | | 1.00 | 97% | X | | | 3-5 | 0.19 | 0.37 | 1.03 | 2.0 | 5.5 |
| | | | | | | 0.99 | 108% | X | | | 6-1 | 0.14 | 0.27 | 0.91 | 1.9 | 6.4 |

TABLE 5

PARENT QC RESULTS
Spin Conditions: 1500 rpm (20 s)
Bake Conditions: 150/250 C. N2 (50 s)

| Water Content | GPC | | | | | Poly-dispersity | Thickness (Å) on 4" Wafers | | | |
|---|---|---|---|---|---|---|---|---|---|---|
| | Mn | Mw | Mp | Mz | Mz + 1 | | T avg | T stdev | T min | T max |
| 1.0x | 762 | 1131 | 725 | 1576 | 2011 | 1.483823 | 3725.78* | 21.324 | 3694.2 | 3758.9 |
| 0.9x | 696 | 1017 | 739 | 1409 | 1795 | 1.461169 | 5511.55 | 57.127 | 5438 | 5607.1 |
| 0.8x | 644 | 925 | 399 | 1276 | 1637 | 1.435518 | 5397.48 | 46.694 | 5308.4 | 5458.2 |

| Water Content | % Fit | pH | Density | GC (Normalized) | | | | | Total Area | Solids Total % Solids |
|---|---|---|---|---|---|---|---|---|---|---|
| | | | | Water (N) | Ethanol (N) | Propanol (N) | Acetone (N) | Butanol (N) | | |
| 1.0x | 99.33 | 2.276 | 0.8542 | 5.5746 | 24.6763 | 41.3693 | 22.0987 | 6.2811 | 100 | 11.01 |
| 0.9x | 98.54 | 1.998 | 0.8625 | 4.6764 | 25.2899 | 41.8127 | 22.0606 | 6.1604 | 100 | 11.47 |
| 0.8x | 99.09 | 1.836 | 0.8504 | 3.8861 | 23.6460 | 43.4587 | 22.8314 | 6.1779 | 100 | 11.72 | x = 66.86 g

TABLE 6

CHILD QC RESULTS
Spin Conditions: 1500 rpm (20 s)
Bake Conditions: 150/250 C. N2 (50 s)

| Sample | Parent Water Content | Base | Dilution Factor | Time of Dilution | GPC Prep and Spin Time | Time Lag Hours | GPC | | |
|---|---|---|---|---|---|---|---|---|---|
| | | | | | | | Mn | Mw | Mp |
| 1 | 1.0x | APTEOS | 0.75 | 12:00 PM | 1:00 PM | 1 | 1254 | 2126 | 2333 |
| 2 | | | | | 4:00 PM | 4 | 1436 | 2771 | 2813 |
| 3 | | | | | 7:30 PM | 7.5 | 1467 | 2988 | 2923 |
| 4 | | | | | 1:30 PM | 25.5 | 1758 | 3672 | 2970 |
| 1 | 0.9x | APTEOS | 0.86 | 12:00 PM | 1:00 PM | 1 | 930 | 1805 | 396 |
| 2 | | | | | 4:00 PM | 4 | 1095 | 2421 | 2717 |
| 3 | | | | | 7:30 PM | 7.5 | 1162 | 2670 | 2817 |
| 4 | | | | | 1:30 PM | 25.5 | 1218 | 3079 | 2903 |
| 1 | 0.8x | APTEOS | 0.86 | 12:00 PM | 1:00 PM | 1 | 857 | 1610 | 397 |
| 2 | | | | | 4:00 PM | 4 | 1009 | 2172 | 2555 |
| 3 | | | | | 7:30 PM | 7.5 | 1336 | 2529 | 2682 |
| 4 | | | | | 1:30 PM | 25.5 | 1193 | 2829 | 2810 |

| Sample | GPC | | Poly-dispersity | Thickness (Å) on 4" Wafers | | | | % Fit |
|---|---|---|---|---|---|---|---|---|
| | Mz | Mz + 1 | | T avg | T stdev | T min | T max | |
| 1 | 3150 | 4155 | 1.695459 | 2109.22 | 25.539 | 2086.7 | 2164.4 | 99.52 |
| 2 | 4398 | 6002 | 1.930054 | 2095.32 | 19.181 | 2072.8 | 2133.4 | 99.55 |
| 3 | 4834 | 6621 | 2.037003 | 2094.67 | 30.493 | 2050.8 | 2144.8 | 99.44 |
| 4 | 6178 | 8876 | 2.088918 | 2098.45 | 18.325 | 2075.1 | 2128.7 | 99.51 |
| 1 | 2749 | 3536 | 1.940289 | 2011.78 | 22.797 | 1987.1 | 2050.4 | 99.45 |
| 2 | 2847 | 5088 | 2.211078 | 1977.24 | 17.486 | 1959.8 | 2014.8 | 99.40 |
| 3 | 4320 | 5797 | 2.298419 | 1976.41 | 17.612 | 1953.2 | 2009.7 | 99.41 |
| 4 | 5260 | 7345 | 2.528587 | 1964.98 | 20.458 | 1936.8 | 2006.5 | 99.34 |
| 1 | 2441 | 3122 | 1.880068 | 2046.81 | 25.542 | 2020.8 | 2106.4 | 99.42 |
| 2 | 3429 | 4502 | 2.153646 | 2038.46 | 13.784 | 2022.9 | 2067 | 99.47 |
| 3 | 3813 | 4965 | 1.892464 | 2013.19 | 29.402 | 1971.9 | 2071 | 99.32 |
| 4 | 4628 | 6264 | 2.37155 | 2014.58 | 26.576 | 1958.8 | 2058.5 | 99.36 |

TABLE 7

| | material | film thickness (SEM-no via) (Å) | |
|---|---|---|---|
| A. | no acutone 248 nm | | 3100 |
| | via spacing (nm) | film thickness between vias (Å) | thickness difference (isolated − dense) (Å) |
| | 120 | 1815 | 1285 |
| | 180 | 2000 | 1100 |
| | 300 | 2550 | 550 |
| B. | material | film thickness (SEM-no via) (Å) | 3050 |
| | 1:1 High/Low MW | | |
| | via spacing (nm) | film thickness between vias (Å) | thickness difference (isolated − dense) (Å) |
| | 120 | 1500 | 1550 |
| | 160 | 1800 | 1250 |
| | 300 | 2350 | 700 |
| C. | material | film thickness (SEM-no via) (Å) | 3200 |
| | no acetone 248 nm w/ 0.05% BYK381 | | |
| | via spacing (nm) | film thickness between vias (Å) | thickness difference (isolated − dense) (Å) |
| | 120 | 1950 | 1250 |
| | 160 | | |
| | 300 | 2550 | 650 |
| D. | material | film thickness (SEM-no via) (Å) | 3100 |
| | no acetone 248 nm w/ 0.4% BYK381 | | |
| | via spacing (nm) | film thickness between vias (Å) | thickness difference (isolated − dense) (Å) |
| | 120 | 2200 | 900 |
| | 160 | 2400 | 700 |
| | 300 | 2800 | 300 |
| E. | material | film thickness (SEM-no via) (Å) | 3200 |
| | no acetone 248 nm w/ 0.4% BYK380 | | |
| | via spacing (nm) | film thickness between vias (Å) | thickness difference (isolated − dense) (Å) |
| | 120 | 1800 | 1400 |
| | 160 | 2000 | 1200 |
| | 300 | 2600 | 600 |
| F. | material | film thickness (SEM-no via) (Å) | 3850 |
| | 193 nm made with DMTEOS | | |
| | via spacing (nm) | film thickness between vias (Å) | thickness difference (isolated − dense) (Å) |
| | 120 | 2120 | 1730 |
| | 160 | 2600 | 1250 |
| | 300 | 3000 | 850 |
| G. | material | film thickness (SEM-no via) (Å) | 3150 |
| | 248 nm w/ 2% CRJ-406 | | |
| | via spacing (nm) | film thickness between vias (Å) | thickness difference (isolated − dense) (Å) |
| | 120 | 1700 | 1450 |
| | 160 | 1600 | 1550 |
| | 300 | 2560 | 590 |
| H. | material | film thickness (SEM-no via) (Å) | 3200 |
| | no acetone 248 nm w/ 0.2% BYK381 | | |
| | via spacing (nm) | film thickness between vias (Å) | thickness difference (isolated − dense) (Å) |
| | 120 | 1900 | 1300 |
| | 160 | 1900 | 1300 |
| | 300 | 2650 | 550 |
| I. | material | film thickness (SEM-no via) (Å) | 3300 |
| | no acetone 248 nm w/ 0.6% BYK381 | | |
| | via spacing (nm) | film thickness between vias (Å) | thickness difference (isolated − dense) (Å) |
| | 120 | 1900 | 1400 |
| | 160 | 1900 | 1400 |
| | 300 | 3000 | 300 |
| J. | material | film thickness (SEM-no via) (Å) | 3100 |
| | no acetone 248 nm w/ 0.8% BYK380 | | |
| | via spacing (nm) | film thickness between vias (Å) | thickness difference (isolated − dense) (Å) |
| | 120 | 1800 | 1300 |
| | 160 | | |
| | 300 | 2400 | 700 |
| K. | material | film thickness (SEM-no via) (Å) | 3600 |
| | 193 nm made with DMTEOS | | |
| | via spacing (nm) | film thickness between vias (Å) | thickness difference (isolated − dense) (Å) |
| | 120 | 2000 | 1600 |
| | 160 | | |
| | 300 | 2850 | 750 |
| L. | material | film thickness (SEM-no via) (Å) | 3000 |
| | no acetone 248 nm w/ 1.5% BYK380 | | |
| | via spacing (nm) | film thickness between vias (Å) | thickness difference (isolated − dense) (Å) |
| | 120 | 1400 | 1600 |
| | 160 | 1600 | 1400 |
| | 300 | 2200 | 800 |
| M. | material | film thickness (SEM-no via) (Å) | 3200 |
| | no acet. 248 nm (1:1 Hi/Low MW) w/ 0.3% BYK381 | | |
| | via spacing (nm) | film thickness between vias (Å) | thickness difference (isolated − dense) (Å) |
| | 120 | 1970 | 1230 |
| | 160 | 2000 | 1200 |
| | 300 | 2400 | 800 |

We claim:

1. An absorbing composition formed from the constituents consisting of:
   tetraethoxysilane (TEOS);
   methyltriethoxysilane (MTEOS);
   at least one incorporatable absorbing compound, wherein the incorporatable absorbing compound comprises two or more benzene rings;
   at least one material modification agent comprising γ-aminopropyltriethoxysilane (APTEOS);
   at least one catalyst comprising an acid; and
   at least one solvent.

2. An absorbing composition formed from the constituents consisting of:
   tetraethoxysilane (TEOS);
   methyltriethoxysilane (MTEOS);
   at least one incorporatable absorbing compound;
   γ-aminopropyltriethoxysilane (APTEOS);
   at least one catalyst comprising nitric acid, hydrochloric acid, lactic acid, acetic acid, oxalic acid, succinic acid or maleic acid; and
   at least one solvent.

3. The composition of claim 2, wherein the incorporatable absorbing compound strongly absorbs light over at least an approximately 0.5 nm wide wavelength range at wavelengths less than 375 nm.

4. The composition of claim 2, wherein the incorporatable absorbing compound strongly absorbs light over at least an approximately 10 nm wide wavelength range at wavelengths less than 375 nm.

5. The composition of claim 3, wherein the range comprises wavelengths less than about 260 nm.

6. The composition of claim 1, wherein the two or more benzene rings are fused.

7. The composition of claim 2, wherein the incorporatable absorbing compound comprises anthraflavic acid, 9-anthracene carboxylic acid, 9-anthracene methanol, alizarin, quinizarin, primuline, 2-hydroxy-4(3-triethoxysilylpropoxy)-diphenylketone, rosolic acid, triethoxysilylpropyl-1,8-naphthalimide, 9-anthracene carboxy-alkyl triethoxysilane, phenyltriethoxysilane, 10-phenanthrene carboxy-methyl triethoxysilane, 4-phenylazophenol, 4-ethoxyphenylazobenzene-4-carboxy-methyl triethoxysilane, 4-methoxyphenylazobenzene-4-carboxy-methyl triethoxysilane or mixtures thereof.

8. A coating solution comprising the composition of claim 2 and an additional solvent or a solvent mixture.

9. The coating solution of claim 8, wherein the solution is between about 0.5% and about 20% by weight incorporatable absorbing compound.

10. The composition of claim 2, wherein the incorporatable absorbing compound is an organic-based compound.

11. An absorbing composition formed from the constituents consisting of:
    tetraethoxysilane (TEOS);
    methyltriethoxysilane (MTEOS);
    at least one incorporatable absorbing compound;
    at least one material modification agent comprising γ-aminopropyltriethoxysilane (APTEOS);
    at least one catalyst comprising an acid, wherein the catalyst comprises nitric acid; and
    at least one solvent.

12. The absorbing composition of claim 2, wherein the at least one absorbing compound is a silicon-based compound.

13. The absorbing composition of claim 2, wherein the at least one absorbing compound is a naphthalene-based, phenanthrene-based, anthracene-based, or phenyl-based compound.

14. The absorbing composition of claim 2, wherein the solvent comprises isopropylalcohol, propanol, butanol, ethanol, acetone, toluene, cyclohexanone, butyrolactone, methylethylketone, methylisobutylketone, N-methylpyrrolidone, polyethyleneglycolmethylether, mesitylene, anisole, 2-heptanone, propylene glycol methyl ether acetate, at least one ether, ethyl lactate, water or a combination thereof.

15. The absorbing composition of claim 2, wherein the solvent comprises propylene glycol methyl ether acetate (PGMEA).

16. The composition of claim 11, wherein the incorporatable absorbing compound strongly absorbs light over at least an approximately 0.5 nm wide wavelength range at wavelengths less than 375 nm.

17. The composition of claim 11, wherein the incorporatable absorbing compound strongly absorbs light over at least an approximately 10 nm wide wavelength range at wavelengths less than 375 nm.

18. The composition of claim 11, wherein the incorporatable absorbing compound comprises anthraflavic acid, 9-anthracene carboxylic acid, 9-anthracene methanol, alizarin, quinizarin, primuline, 2-hydroxy-4(3-triethoxysilylpropoxy)-diphenylketone, rosolic acid, triethoxysilylpropyl-1,8-naphthalimide, 9-anthracene carboxy-alkyl triethoxysilane, phenyltriethoxysilane, 10-phenanthrene carboxy-methyl triethoxysilane, 4-phenylazophenol, 4-ethoxyphenylazobenzene-4-carboxy-methyl triethoxysilane, 4-methoxyphenylazobenzene-4-carboxy-methyl triethoxysilane or mixtures thereof.

19. The composition of claim 11, wherein the at least one absorbing compound is a silicon-based compound.

20. The composition of claim 11, wherein the at least one absorbing compound is a naphthalene-based, phenanthrene-based, anthracene-based, or phenyl based compound.

* * * * *